(12) United States Patent
Zhang et al.

(10) Patent No.: US 12,167,662 B2
(45) Date of Patent: Dec. 10, 2024

(54) DISPLAY SUBSTRATE, MASK, AND DISPLAY DEVICE

(71) Applicants: Chengdu BOE Optoelectronics Technology Co., Ltd., Chengdu (CN); BOE Technology Group Co., Ltd., Beijing (CN)

(72) Inventors: Wei Zhang, Beijing (CN); Weiyun Huang, Beijing (CN); Bo Shi, Beijing (CN)

(73) Assignees: Beijing BOE Technology Development Co., Ltd., Beijing (CN); Chengdu BOE Optoelectronics Technology Co., Ltd., Chengdu (CN)

( * ) Notice: Subject to any disclaimer, the term of this patent is extended or adjusted under 35 U.S.C. 154(b) by 566 days.

(21) Appl. No.: 17/427,261

(22) PCT Filed: Nov. 27, 2020

(86) PCT No.: PCT/CN2020/132335
§ 371 (c)(1),
(2) Date: Jul. 30, 2021

(87) PCT Pub. No.: WO2022/110040
PCT Pub. Date: Jun. 2, 2022

(65) Prior Publication Data
US 2022/0310709 A1    Sep. 29, 2022

(51) Int. Cl.
*H01L 23/522* (2006.01)
*H01L 23/532* (2006.01)
(Continued)

(52) U.S. Cl.
CPC ......... *H10K 59/353* (2023.02); *H10K 59/122* (2023.02); *H10K 59/352* (2023.02); *H10K 59/88* (2023.02)

(58) Field of Classification Search
CPC ............... H10K 59/121; H10K 59/353; H10K 59/352
See application file for complete search history.

(56) References Cited

U.S. PATENT DOCUMENTS 10,648,070 B2    5/2020  Li et al.
2016/0358985 A1*  12/2016  Bai ..................... H10K 59/353
(Continued)

FOREIGN PATENT DOCUMENTS

CN    101609227 A    12/2009
CN    109023235 A    12/2018
(Continued)

*Primary Examiner* — John A Bodnar
(74) *Attorney, Agent, or Firm* — Westman, Champlin & Koehler, P.A.

(57) ABSTRACT

A display substrate, a mask, and a display device are provided. The display substrate includes: a plurality of first repeating units including a first sub-pixel and a second sub-pixel; a plurality of second repeating units including a fourth sub-pixel and a fifth sub-pixel; and a pixel defining layer arranged on the base substrate, wherein the pixel defining layer includes a plurality of first openings and a plurality of second openings. Each of the first sub-pixel and the second sub-pixel includes a first opening; each of the fourth sub-pixel and the fifth sub-pixel includes a second opening; and an orthographic projection of the first opening on the base substrate has an area greater than that of an orthographic projection of the second opening on the base substrate.

18 Claims, 27 Drawing Sheets

(51) Int. Cl.
   *H10K 59/122*  (2023.01)
   *H10K 59/35*   (2023.01)
   *H10K 59/88*   (2023.01)

(56) References Cited

U.S. PATENT DOCUMENTS

| | | | | |
|---|---|---|---|---|
| 2021/0210561 | A1* | 7/2021 | Wang | H10K 59/123 |
| 2021/0335913 | A1* | 10/2021 | Zhang | H10K 59/353 |
| 2021/0376011 | A1 | 12/2021 | Liu et al. | |
| 2022/0037423 | A1* | 2/2022 | Zhang | H10K 59/122 |

FOREIGN PATENT DOCUMENTS

| | | |
|---|---|---|
| CN | 109285868 A | 1/2019 |
| CN | 110189627 A | 8/2019 |
| CN | 110379836 A | 10/2019 |
| CN | 110767708 A | 2/2020 |
| CN | 110890412 A | 3/2020 |
| CN | 111161643 A | 5/2020 |
| CN | 111584595 A | 8/2020 |
| KR | 20060110141 A | 10/2006 |

\* cited by examiner

DISPLAY SUBSTRATE, MASK, AND DISPLAY DEVICE

CROSS-REFERENCE TO RELATED APPLICATION

This application is a Section 371 National Stage Application of International Application No. PCT/CN2020/132335, filed on Nov. 27, 2020, entitled "DISPLAY SUBSTRATE, MASK AND DISPLAY DEVICE", the contents of which are incorporated herein by reference in their entireties.

TECHNICAL FIELD

The present disclosure relates to a field of display technology, and in particular to a display substrate, a mask, and a display device.

BACKGROUND

With an increasing demand for diversified use of display device and an emergence of design requirements for a high screen-to-body ratio of display device, a scheme of "under-screen camera" has emerged. In the scheme of "under-screen camera", imaging modules such as cameras are embedded in a display area to reduce a size of a frame area of the display device, so as to increase the screen-to-body ratio. At present, in the scheme of "under-screen camera", how to ensure a light transmittance and a display effect of a portion of a display substrate corresponding to a position where the imaging modules are provided on the basis of increasing the screen-to-body ratio of the display device has become an important subject of concern to R&D personnel.

The above information disclosed in this section is only for the understanding of the background of a technical concept of the present disclosure. Therefore, the above information may contain information that does not constitute a related art.

SUMMARY

In one aspect, there is provided a display substrate including a first display region and a second display region, wherein the display substrate includes:
  a base substrate;
  a plurality of first repeating units that are arranged on the base substrate in an array in a first direction and a second direction and that are located in the first display area, wherein each of the first repeating units includes at least one first pixel unit, and each first pixel unit includes at least a first sub-pixel and a second sub-pixel;
  a plurality of second repeating units that are arranged on the base substrate in an array in the first direction and the second direction and that are located in the second display area, wherein each of the second repeating units includes at least one second pixel unit, and each second pixel unit includes at least a fourth sub-pixel and a fifth sub-pixel; and
  a pixel defining layer arranged on the base substrate, the pixel defining layer including a plurality of first openings and a plurality of second openings,
  wherein the first sub-pixel and the fourth sub-pixel emit light of the same color, and the second sub-pixel and the fifth sub-pixel emit light of the same color;
  wherein each of the first sub-pixel and the second sub-pixel includes a first opening;
  wherein each of the fourth sub-pixel and the fifth sub-pixel includes a second opening;
  wherein an orthographic projection of the first opening of the first sub-pixel on the base substrate has an area greater than that of an orthographic projection of the second opening of the fourth sub-pixel on the base substrate, and an orthographic projection of the first opening of the second sub-pixel on the base substrate has an area greater than that of an orthographic projection of the second opening of the fifth sub-pixel on the base substrate; and
  wherein a ratio of the area of the orthographic projection of the first opening of the first sub-pixel on the base substrate to the area of the orthographic projection of the second opening of the fourth sub-pixel on the base substrate is a first ratio, a ratio of the area of the orthographic projection of the first opening of the second sub-pixel on the base substrate to the area of the orthographic projection of the second opening of the fifth sub-pixel on the base substrate is a second ratio, and a ratio of the first ratio to the second ratio is between 0.8 and 1.2.

According to some exemplary embodiments, a distance between a center of the first opening of at least one of the first sub-pixels and a first straight line extending parallel to the first direction in the second direction is not greater than 5 microns, and a distance between a center of the second opening of at least one of the fourth sub-pixels and the first straight line in the second direction is not greater than 5 microns.

According to some exemplary embodiments, a distance between a center of the first opening of at least one of the second sub-pixels and a second straight line extending parallel to the first direction in the second direction is not greater than 5 microns, and a distance between a center of the second opening of at least one of the fifth sub-pixels and the second straight line in the second direction is not greater than 5 microns.

According to some exemplary embodiments, each first pixel unit further includes a plurality of third sub-pixels, each second pixel unit further includes a plurality of sixth sub-pixels, and the third sub-pixel and the sixth sub-pixel emit light of the same color; the third sub-pixel includes a first opening, and the sixth sub-pixel includes a second opening; an orthographic projection of the first opening of the third sub-pixel on the base substrate has an area greater than that of an orthographic projection of the second opening of the sixth sub-pixel on the base substrate.

According to some exemplary embodiments, a distance between a center of the first opening of at least one of the third sub-pixels and a third straight line extending parallel to the first direction in the second direction is not greater than 5 microns, and a distance between a center of the second opening of at least one of the sixth sub-pixels and the third straight line in the second direction is not greater than 5 microns.

According to some exemplary embodiments, a proportion of an area of the first opening in a first unit area including at least one of the first repeating units is not greater than that of an area of the second opening in a second unit area including at least one of the second repeating units, the first unit area is equal to the second unit area, each of the first unit area and the second unit area is greater than an area of the first repeating unit, and each of the first unit area and the second unit area is greater than an area of the second repeating unit.

According to some exemplary embodiments, the second display area includes a first display sub-area and a second display sub-area, the first display sub-area is located on both sides of the first display area in the first direction, the second display sub-area is located on at least one side of the first display area and the first display sub-area in the second direction, and the first display area and the first display sub-area are connected to the second display sub-area; and the second display sub-area includes at least a row of edge sub-pixels directly adjacent to a row of edge sub-pixels in the first display area and to a row of edge sub-pixels in the first display sub-area, a shortest separation distance between the second opening in the row of edge sub-pixels in the second display sub-area and the adjacent first aperture in the first display area in the second direction is greater than that between the second opening of the row of edge sub-pixels in the second display sub-area and the adjacent second opening in the first display sub-area in the second direction.

According to some exemplary embodiments, an orthographic projection of the first opening of the third sub-pixel on the base substrate is a pentagon, and the pentagon of the first opening of the third sub-pixel has a first side extending in the first direction; an orthographic projection of the second opening of the sixth sub-pixel on the base substrate is a pentagon, and the pentagon of the second opening of the sixth sub-pixel has a second side extending in the first direction; a distance between the first side of the first opening of at least one of the third sub-pixels and a fourth straight line extending parallel to the first direction in the second direction is not greater than 5 microns, and a distance between the second side of the second opening of at least one of the sixth sub-pixels and the fourth straight line in the second direction is not greater than 5 microns.

According to some exemplary embodiments, the first sub-pixels and the second sub-pixels of the plurality of first pixel units are alternately distributed in the first direction and the second direction; and a distance between the center of the first opening of at least one of the first sub-pixels and a fifth straight line extending parallel to the first direction in the second direction is not greater than 5 microns, a distance between the center of the first opening of at least one of the second sub-pixels and the fifth straight line in the second direction is not greater than 5 microns, a distance between the center of the second opening of at least one of the fourth sub-pixels and the fifth straight line in the second direction is not greater than 5 microns, and a distance between the center of the second opening of at least one of the fifth sub-pixels and the fifth straight line in the second direction is not greater than 5 microns.

According to some exemplary embodiments, the first pixel unit further includes a plurality of third sub-pixels, the second pixel unit further includes a plurality of sixth sub-pixels, and the third sub-pixel and the sixth sub-pixel emit light of the same color; the third sub-pixel includes a first opening, and the sixth sub-pixel includes a second opening; and a distance between the center of the first opening of at least one of the third sub-pixels and a sixth straight line extending parallel to the second direction in the first direction is not greater than 5 microns, and a distance between the center of the second opening of at least one of the sixth sub-pixels and the sixth straight line in the first direction is not greater than 5 microns.

According to some exemplary embodiments, an orthographic projection of the first opening of the first sub-pixel on the base substrate has an area 1.2 to 5 times that of an orthographic projection of the second opening of the fourth sub-pixel on the base substrate; and/or an orthographic projection of the first opening of the second sub-pixel on the base substrate has an area 1.2 to 5 times that of an orthographic projection of the second opening of the fifth sub-pixel on the base substrate; and/or an orthographic projection of the first opening of the third sub-pixel on the base substrate has an area 1.2 to 5 times that of an orthographic projection of the second opening of the sixth sub-pixel on the base substrate.

According to some exemplary embodiments, the second repeating unit has a first pixel pitch equal to a distance between the centers of the second openings of two fourth sub-pixels respectively located in two adjacent second pixel units in the first direction; and in two adjacent first pixel units, a distance between the centers of the first openings of two first sub-pixels in the first direction is 0.3 to 4 times the first pixel pitch; and/or in two adjacent first pixel units, a distance between the centers of the first openings of two second sub-pixels in the first direction is 0.3 to 4 times the first pixel pitch; and/or in two adjacent first pixel units, a distance between the center of the first openings of the third sub-pixel in one of the first pixel units and the center of the first opening of the third sub-pixel in the other of the first pixel units in the first direction is 0.3 to 4 times the first pixel pitch.

According to some exemplary embodiments, the second repeating unit has a second pixel pitch equal to a distance between the centers of the second openings of two fourth sub-pixels respectively located in two adjacent second pixel units in the second direction; and in two adjacent first pixel units, a distance between the centers of the first openings of two first sub-pixels in the second direction is 1 to 4 times the second pixel pitch; and/or in two adjacent first pixel units, a distance between the centers of the first openings of two second sub-pixels in the second direction is 1 to 4 times the second pixel pitch.

According to some exemplary embodiments, each of an orthographic projection of the first opening of the first sub-pixel on the base substrate, an orthographic projection of the first opening of the second sub-pixel on the base substrate and an orthographic projection of the first opening of the third sub-pixel on the base substrate is a circle or an ellipse.

According to some exemplary embodiments, an orthographic projection of the first opening of one of the first sub-pixels on the base substrate has an area 1.5 to 2.5 times that of an orthographic projection of the second opening of one of the fourth sub-pixels on the base substrate; and/or an orthographic projection of the first opening of one of the second sub-pixels on the base substrate has an area 1.5 to 2.5 times that of an orthographic projection of the second opening of one of the fifth sub-pixels on the base substrate; and/or an orthographic projection of the first opening of one of the third sub-pixels on the base substrate has an area 1.5 to 2.5 times that of an orthographic projection of the second opening of one of the sixth sub-pixels on the base substrate.

According to some exemplary embodiments, a minimum gap between two adjacent first repeating units in the first direction is greater than or equal to a first gap threshold, the minimum gap is a shortest distance between the first opening of the third sub-pixel of one of the two adjacent first repeating units and the first opening of the first sub-pixel or the second sub-pixel of the other of the two adjacent first repeating units; and the first gap threshold is a minimum size of a portion of the pixel defining layer located between the first opening of a first sub-pixel and the first opening of a second sub-pixel adjacent to the first sub-pixel, and the first gap threshold is not less than 10 microns.

According to some exemplary embodiments, at a junction of the first display area and the second display area located on both sides of the first display area in the first direction X, a shortest distance between the first opening of a first sub-pixel and the second opening of a fifth sub-pixel adjacent to the first sub-pixel is greater than or equal to half of a sum of the first gap threshold and the second gap threshold, the second gap threshold is a minimum size of a portion of the pixel defining layer located between the second opening of a fourth sub-pixel and the second opening of a fifth sub-pixel adjacent to the fourth sub-pixel, and the second gap threshold is not less than 10 microns.

According to some exemplary embodiments, the first repeating unit includes at least two first sub-pixels and at least two second sub-pixels; and in one of the first repeating units, a distance between the centers of the first openings of two adjacent first sub-pixels in the first direction is substantially equal to that between the centers of the first openings of two adjacent second sub-pixels in the first direction; and/or in one of the first repeating units, a distance between the centers of the first openings of two adjacent first sub-pixels in the second direction is substantially equal to that between the centers of the first openings of two adjacent second sub-pixels in the second direction.

According to some exemplary embodiments, the first repeating unit includes at least four third sub-pixels; and in one of the first repeating units, a distance between the centers of the first openings of two adjacent third sub-pixels in the first direction is substantially equal to that between the centers of the first openings of two adjacent first sub-pixels in the first direction; and/or in one of the first repeating units, a distance between the centers of the first openings of two adjacent third sub-pixels in the second direction is substantially equal to that between the centers of the first openings of two adjacent first sub-pixels in the second direction.

According to some exemplary embodiments, the second repeating unit has a first pixel pitch equal to a distance between the centers of the second openings of two fourth sub-pixels respectively located in two adjacent second pixel units in the first direction; and in one of the first repeating units, a distance between the centers of the first openings of two adjacent first sub-pixels in the first direction is 0.3 to 4 times the first pixel pitch; and/or in one of the first repeating units, a distance between the centers of the first openings of two adjacent second sub-pixels in the first direction is 0.3 to 4 times the first pixel pitch; and/or in one of the first repeating units, a distance between the centers of the first openings of two adjacent third sub-pixels in the first direction is 0.3 to 4 times the first pixel pitch.

According to some exemplary embodiments, the second repeating unit has a second pixel pitch equal to a distance between the centers of the second openings of two fourth sub-pixels respectively located in two adjacent second pixel units in the second direction; and in one of the first repeating units, a distance between the centers of the first openings of two adjacent first sub-pixels in the second direction is 1 to 4 times the second pixel pitch; and/or in one of the first repeating units, a distance between the centers of the first openings of two adjacent second sub-pixels in the second direction is 1 to 4 times the second pixel pitch; and/or in one of the first repeating units, a distance between the centers of the first openings of two adjacent third sub-pixels in the second direction is 1 to 4 times the second pixel pitch.

According to some exemplary embodiments, each of an orthographic projection of the second opening of the fourth sub-pixel on the base substrate, an orthographic projection of the second opening of the fifth sub-pixel on the base substrate and an orthographic projection of the second opening of the sixth sub-pixel on the base substrate is selected from any one of a rectangle, a circle, an ellipse, a hexagon and an octagon.

According to some exemplary embodiments, at a junction of the first display area and the second display area located on both sides of the first display area in the first direction, a shortest distance between the second opening of a fourth sub-pixel and the first opening of a third sub-pixel adjacent to the fourth sub-pixel is greater than or equal to half of the sum of the first gap threshold and the second gap threshold, the first gap threshold is a minimum size of a portion of the pixel defining layer located between the first opening of a first sub-pixel and the first opening of a second sub-pixel adjacent to the first sub-pixel, the second gap threshold is a minimum size of a portion of the pixel defining layer located between the second opening of a fourth sub-pixel and the second opening of a fifth sub-pixel adjacent to the fourth sub-pixel, and each of the first gap threshold and the second gap threshold is not less than 10 microns.

According to some exemplary embodiments, at the junction of the first display area and the second display area located on both sides of the first display area in the first direction, a shortest distance between the second opening of a fifth sub-pixel and the first opening of a third sub-pixel adjacent to the fifth sub-pixel is greater than or equal to half of the sum of the first gap threshold and the second gap threshold.

According to some exemplary embodiments, the display substrate further includes a plurality of first dummy sub-pixels located in the first display area, wherein the plurality of first sub-pixels and the plurality of first dummy sub-pixels are alternately distributed in the first direction and the second direction; the first sub-pixel includes a first light emitting functional layer, the first dummy sub-pixel includes a first dummy light emitting functional layer, and the first light emitting functional layer and the first dummy light emitting functional layer contain the same material; and/or the display substrate further includes a plurality of second dummy sub-pixels located in the first display area, wherein the plurality of second sub-pixels and the plurality of second dummy sub-pixels are alternately distributed in the first direction and the second direction; the second sub-pixel includes a second light emitting functional layer, the second dummy sub-pixel includes a second dummy light emitting functional layer, and the second light emitting functional layer and the second dummy light emitting functional layer contain the same material.

According to some exemplary embodiments, the first sub-pixel includes an anode structure arranged on a side of the pixel defining layer close to the base substrate, the first opening of the first sub-pixel exposes at least a part of the anode structure of the first sub-pixel, and at least a part of the first light emitting functional layer is located in the first opening of the first sub-pixel so as to be in contact with the anode structure of the first sub-pixel; and an orthographic projection of the first dummy light emitting functional layer on the base substrate falls within the orthographic projection of the pixel defining layer on the base substrate, and the pixel defining layer is configured to separate the first dummy light emitting functional layer from a film layer located on the side of the pixel defining layer close to the base substrate; and/or the second sub-pixel includes an anode structure arranged on the side of the pixel defining layer close to the base substrate, the first opening of the second sub-pixel exposes at least a part of the anode structure of the second sub-pixel, and at least a part of the second light emitting functional layer is located in the first opening of the second sub-pixel so as to be in contact with the anode structure of the second sub-pixel; and an orthographic projection of the second dummy light emitting functional layer on the base substrate falls within the orthographic projection of the pixel defining layer on the base substrate, and the pixel defining layer is configured to separate the second dummy light emitting functional layer from the film layer located on the side of the pixel defining layer close to the base substrate.

According to some exemplary embodiments, a distance between a center of the first light emitting functional layer of one of the first sub-pixels and a center of a first dummy light emitting functional layer of the first dummy sub-pixel adjacent to the first sub-pixel in the first direction is 0.3 to 4 times the first pixel pitch; and/or a distance between a center of the second light emitting functional layer of one of the second sub-pixels and a center of the second dummy light emitting functional layer of the second dummy sub-pixel adjacent to the second sub-pixel in the first direction is 0.3 to 4 times the first pixel pitch.

In another aspect, there is provided a mask including a first mask area and a second mask area, wherein the mask includes:
 a mask body;
 a plurality of first apertures that are arranged in the mask body in an array in the first direction and the second direction and that are located in the first mask area;
 a plurality of second apertures that are arranged in the mask body in an array in the first direction and the second direction and that are located in the second mask area; and
 a plurality of through holes or half-tone regions that are arranged in the mask body in an array in the first direction and the second direction and that are located in the first mask area,
 wherein an orthographic projection of the first aperture on the base substrate has an area greater than that of an orthographic projection of the second aperture on the base substrate;
 wherein the plurality of first apertures and the plurality of through holes or half-tone regions are alternately distributed in the first direction and the second direction; and
 wherein a distance between a center of at least one of the first apertures and a first straight line extending parallel to the first direction in the second direction is not greater than 5 microns, and a distance between a center of at least one of the second apertures and the first straight line in the second direction is not greater than 5 microns.

According to some exemplary embodiments, an orthographic projection of the first aperture on the base substrate has an area 1.2 to 5 times that of an orthographic projection of the second aperture on the base substrate;

According to some exemplary embodiments, the second aperture has a first aperture pitch and a second aperture pitch, the first aperture pitch is equal to a distance between centers of two adjacent second apertures in the first direction, and the second aperture pitch is equal to a distance between centers of two adjacent second apertures in the second direction; and a distance between a center of the first aperture and a center of the through hole or half-tone region adjacent to the first aperture in the first direction is 0.3 to 4 times the first aperture pitch; and/or a distance between the center of the first aperture and the center of the through hole or half-tone region adjacent to the first aperture in the second direction is 0.3 to 4 times the second aperture pitch.

According to some exemplary embodiments, a distance between the centers of two adjacent first apertures in the first direction is 0.6 to 8 times the first aperture pitch; and/or a distance between the centers of two adjacent first apertures in the second direction is 0.6 to 8 times the second aperture pitch.

In another aspect, there is provided a display device including the display substrate described above.

BRIEF DESCRIPTION OF THE DRAWINGS

By describing in detail exemplary embodiments of the present disclosure with reference to the drawings, the features and advantages of the present disclosure will become more apparent.

DETAILED DESCRIPTION OF EMBODIMENTS

Figure 1:
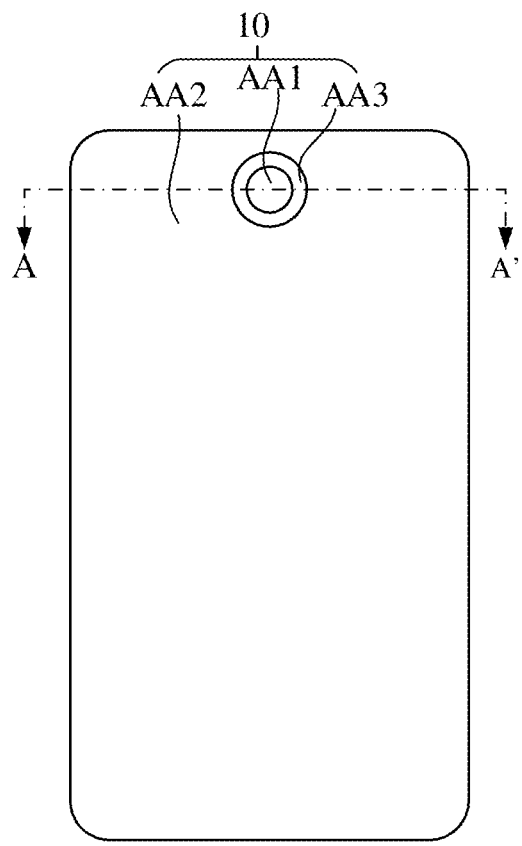
FIG. 1 shows a schematic plan view of a display device according to some exemplary embodiments of the present disclosure, in which a plan structure of a display substrate included in the display device is schematically shown.

In order to make the objectives, technical solutions and advantages of the present disclosure more clear, the technical solutions of the embodiments of the present disclosure are clearly and completely described below with reference to the drawings. Obviously, the described embodiments are only a part but not all of the embodiments of the present disclosure. Based on the embodiments of the present disclosure, all other embodiments obtained by those ordinary skilled in the art without carrying out inventive effort fall within the protection scope of the present disclosure.

It should be noted that, in the drawings, for clarity and/or description purposes, size and relative size of elements may be enlarged. Accordingly, the size and relative size of each element need not to be limited to those shown in the drawings. In the specification and drawings, the same or similar reference numerals indicate the same or similar components.

When an element is described as being "on", "connected to" or "coupled to" another element, the element may be directly on the other element, directly connected to the other element, or directly coupled to the other element, or an intermediate element may be present. However, when an element is described as being "directly on", "directly connected to" or "directly coupled to" another element, no intermediate element is present. Other terms and/or expressions used to describe the relationship between elements, for example, "between" and "directly between", "adjacent" and "directly adjacent", "on" and "directly on", and so on, should be interpreted in a similar manner. In addition, the term "connected" may refer to a physical connection, an electrical connection, a communication connection, and/or a fluid connection. In addition, X axis, Y axis and Z axis are not limited to three axes of a rectangular coordinate system, and may be interpreted in a broader meaning. For example, the X axis, the Y axis and the Z axis may be perpendicular to each other, or may represent different directions that are not perpendicular to each other. For the objective of the present disclosure, "at least one of X, Y and Z" and "at least one selected from a group consisting of X, Y and Z" may be interpreted as only X, only Y, only Z, or any combination of two or more of X, Y and Z, such as XYZ, XYY, YZ and ZZ. As used herein, the term "and/or" includes any and all combinations of one or more of the listed related items.

It should be noted that although the terms "first", "second", and so on may be used herein to describe various components, members, elements, regions, layers and/or parts, these components, members, elements, regions, layers and/or parts should not be limited by these terms. Rather, these terms are used to distinguish one component, member, element, region, layer and/or part from another. Thus, for example, a first component, a first member, a first element, a first region, a first layer and/or a first part discussed below may be referred to as a second component, a second member, a second element, a second region, a second layer and/or a second part without departing from the teachings of the present disclosure.

For ease of description, spatial relationship terms, such as "upper", "lower", "left", "right", may be used herein to describe the relationship between one element or feature and another element or feature as shown in the figure. It should be understood that the spatial relationship terms are intended to cover other different orientations of the device in use or operation in addition to the orientation described in the figure. For example, if the device in the figure is turned upside down, an element or feature described as "below" or "under" another element or feature will be oriented "above" or "on" the other element or feature.

Here, the expression "repeating unit" may mean that at least two or more units are provided in the display substrate and these units are repeated immediately. The repeating unit may refer to a combination of a plurality of sub-pixels, for example, a combination of a plurality of sub-pixels used to display a pixel point, and a plurality of "repeating units" are repeatedly arranged in an array on a base substrate. For example, a repeating unit may include at least one pixel, for example, two, three, four or more sub-pixels. In addition, here, for the convenience of description, a repeating unit located in a first display area is referred to as a first repeating unit, and a repeating unit located in a second display area is referred to as a second repeating unit.

Here, the expression "pixel density" refers to the number of repeating units or sub-pixels per unit area. Similarly, the expression "distribution density" refers to the number of components (such as repeating units, sub-pixels, spacers, etc.) per unit area.

Herein, unless otherwise specified, the expression "opening" refers to an opening of a pixel defining layer in each sub-pixel. The opening exposes at least a part of an anode structure of a light emitting device of the sub-pixel, and at least a part of a light emitting layer of the light emitting device is also located in the opening, that is, the opening corresponds to a light emitting area of the sub-pixel.

Herein, unless otherwise specified, the expression "center of the opening" means a geometric center or a centroid of an orthographic projection of the opening on the base substrate. For example, in a case that the opening is a circle, the center of the opening is a center of the circle, and in a case that the opening is an ellipse, the center of the opening is a center of the ellipse, that is, an intersection of a major axis and a minor axis of the ellipse.

Herein, unless otherwise specified, the expression "A and B are substantially located on the same straight line extending parallel to a first direction" includes following cases: A and B are located on the same straight line extending parallel to the first direction; positions of A and B have a certain error in a direction perpendicular to the first direction, and the error is less than or equal to ±5 microns.

Herein, unless otherwise specified, "a distance between a first opening and a second opening" and similar expressions mean a distance between a center of the first opening and a center of the second opening, and "a separation distance between the first opening and the second openings" and similar expressions mean a distance between an edge of the first opening closest to the second opening and an edge of the second opening closest to the first opening.

Some embodiments of the present disclosure provide a display substrate including a first display area and a second display area. The display substrate includes: a base substrate; a plurality of first repeating units that are arranged on the base substrate in an array in a first direction and a second direction and that are located in the first display area, wherein each of the first repeating units includes at least one first pixel unit, and each first pixel unit includes at least a first sub-pixel and a second sub-pixel; a plurality of second repeating units that are arranged on the base substrate in an array in the first direction and the second direction and that are located in the second display area, wherein each of the second repeating units includes at least one second pixel unit, and each second pixel unit includes at least a fourth sub-pixel and a fifth sub-pixel; and a pixel defining layer arranged on the base substrate, the pixel defining layer including a plurality of first openings and a plurality of second openings, wherein the first sub-pixel and the fourth sub-pixel emit light of the same color, and the second sub-pixel and the fifth sub-pixel emit light of the same color. Each of the first sub-pixel and the second sub-pixel includes a first opening, and each of the fourth sub-pixel and the fifth sub-pixel includes a second opening; An orthographic projection of the first opening of the first sub-pixel on the base substrate has an area greater than that of an orthographic projection of the second opening of the fourth sub-pixel on the base substrate, and an orthographic projection of the first opening of the second sub-pixel on the base substrate has an area greater than that of an orthographic projection of the second opening of the fifth sub-pixel on the base substrate. A ratio of the area of the orthographic projection of the first opening of the first sub-pixel on the base substrate to the area of the orthographic projection of the second opening of the fourth sub-pixel on the base substrate is a first ratio, and a ratio of the area of the orthographic projection of the first opening of the second sub-pixel on the base substrate to the area of the orthographic projection of the second opening of the fifth sub-pixel on the base substrate is a second ratio. A ratio of the first ratio to the second ratio is between 0.8 and 1.2. In this way, the display substrate may have a good display effect in the first display area and the second display area, and have a good display consistency in the first display area and the second display area.

Figure 2:
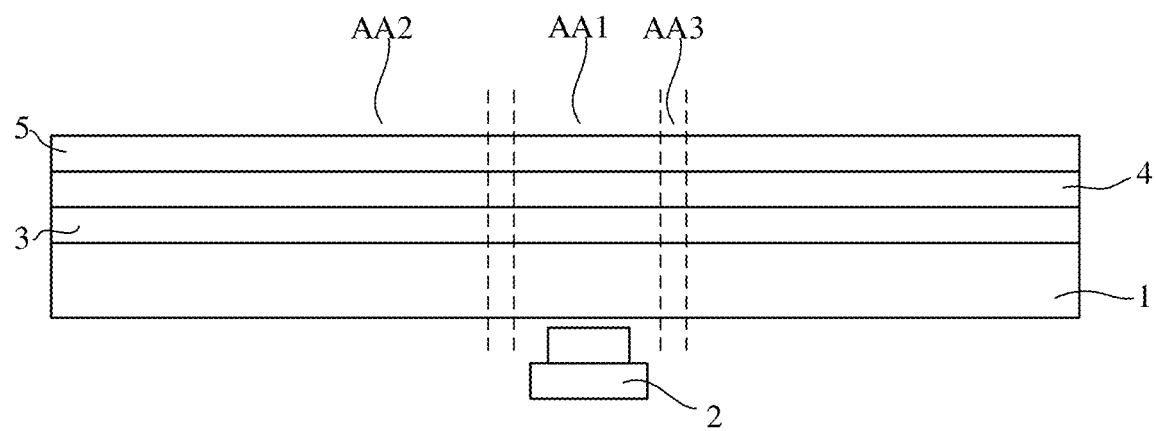
FIG. 2 shows a schematic cross-sectional view of the display device according to some exemplary embodiments of the present disclosure taken along line AA' in FIG. 1.

FIG. 1 shows a schematic plan view of a display device according to some exemplary embodiments of the present disclosure, in which a planar structure of a display substrate included in the display device is schematically shown. FIG. 2 shows a schematic cross-sectional view of the display device according to some exemplary embodiments of the present disclosure taken along line AA' in FIG. 1.

As shown in FIG. 1, the display substrate according to the embodiments of the present disclosure includes a display substrate 10. The display substrate 10 includes a display area that may include a first display area AA1, a second display area AA2 and a third display area AA3. For example, the first display area AA1, the second display area AA2 and the third display area AA3 do not overlap one another. For example, the second display area AA2 at least partially surrounds (for example, completely surrounds) the third display area AA3, and the third display area AA3 at least partially surrounds (for example, completely surrounds) the first display area AA1.

For a display substrate with an under-screen sensor (for example, an image sensor), in order to increase a light transmittance of the display area of the display substrate corresponding to the under-screen sensor, a distribution density per unit area of the light emitting devices in the display area corresponding to the under-screen sensor (e.g., PPI) may be smaller than that of the light emitting devices in other display areas of the display substrate.

As shown in FIG. 2, the display substrate 10 may include a base substrate 1. A sensor 2 may be provided on a rear surface of the base substrate 1 in the first display area AA1 (shown as a lower side in FIG. 2, which may be, for example, a side opposite to a light exit direction during display), and the first display area AA1 may meet imaging requirements of the sensor 2 for the light transmittance.

For example, the light transmittance of the first display area AA1 is greater than that of the second display area AA2. The sensor 2 may be, for example, an image sensor or an infrared sensor. The sensor 2 is configured to receive light rays from a display side of the display substrate 10 (an upper side in FIG. 2, which may be, for example, the light exit direction during display, or a direction of human eyes during display), so that operations such as image capturing, distance sensing and light intensity sensing may be performed. These light rays may, for example, pass through the first display area AA1 and then irradiate on the sensor to be sensed by the sensor.

It should be noted that in the exemplary embodiment shown, the second display area AA2 completely surrounds the third display area AA3, and the third display area AA3 completely surrounds the first display area AA1, but the embodiments of the present disclosure are not limited thereto. For example, in other embodiments, the third display area AA3 may be located at an upper edge of the display substrate. For example, three sides of the third display area AA3 are surrounded by the second display area AA2, and an upper side of the third display area AA3 is flush with the upper edge of the display substrate. For another example, the third display area AA3 may be located at the upper edge of the display substrate and arranged along an entire width of the display substrate.

For example, the first display area AA1 may have a shape of a circle, an ellipse, a water drop or a rectangle, and the second display area AA2 may have a shape of a circle, an ellipse or a rectangle, but the embodiments of the present disclosure are not limited thereto. For another example, the first display area AA1 and the second display area AA2 may both be rectangles, rounded rectangles or have other suitable shapes.

In the display substrates shown in FIG. 1 to FIG. 2, an OLED display technology may be used. Because OLED display substrates have advantages of wide viewing angle, high contrast, fast response, low power consumption, foldability, flexibility, etc., they are more and more widely used in display products. With development and in-depth application of the OLED display technology, the demand for displays with high screen-to-body ratio becomes stronger and stronger. In the display substrate shown in FIG. 1 to FIG. 2, a scheme of under-screen camera is adopted. In this way, a notch area may be eliminated, openings in the display screen may be avoided, and the screen-to-body ratio may be increased, so that a good visual experience may be achieved.

In addition, the display substrate may further include a driving circuit layer, a light emitting device layer and an encapsulation layer that are arranged on the base substrate 1. For example, a driving circuit layer 3, a light emitting device layer 4 and an encapsulation layer 5 are schematically shown in FIG. 2. The driving circuit layer 3 includes a driving circuit structure, and the light emitting device layer 4 includes a light emitting device such as an OLED. The driving circuit structure may control the light emitting devices of each sub-pixel to emit light, so as to achieve a display function. The driving circuit structure may include a thin film transistor, a storage capacitor, and various signal lines. The various signal lines may include gate lines, data lines, ELVDD power lines, ELVSS power lines and so on, so as to provide various signals such as control signals, data signals and power supply voltages to the pixel driving circuit in each sub-pixel.

Figure 3:
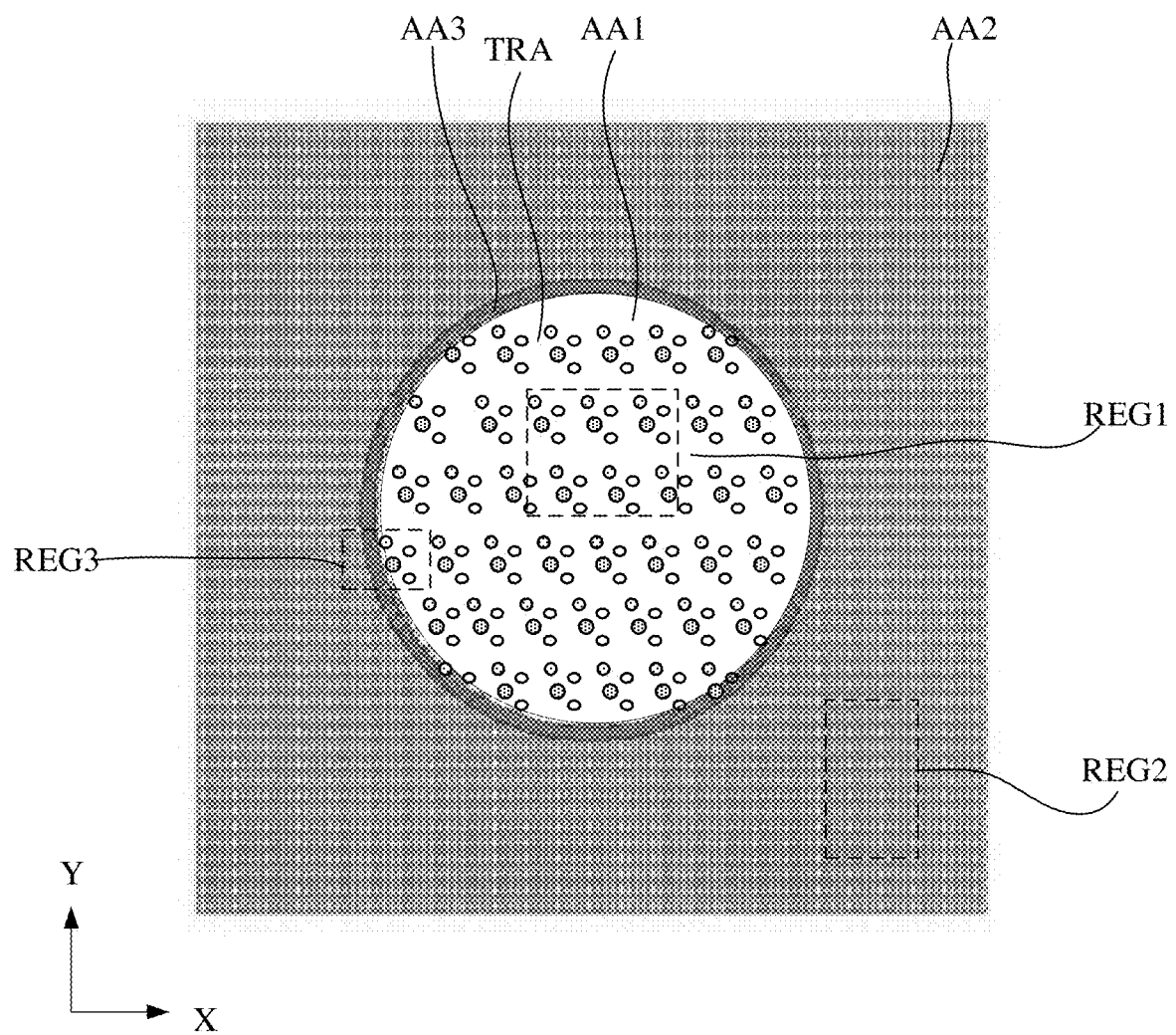
FIG. 3 shows a partial diagram of a first display area, a second display area and a third display area of the display substrate shown in FIG. 1.
Figure 4:
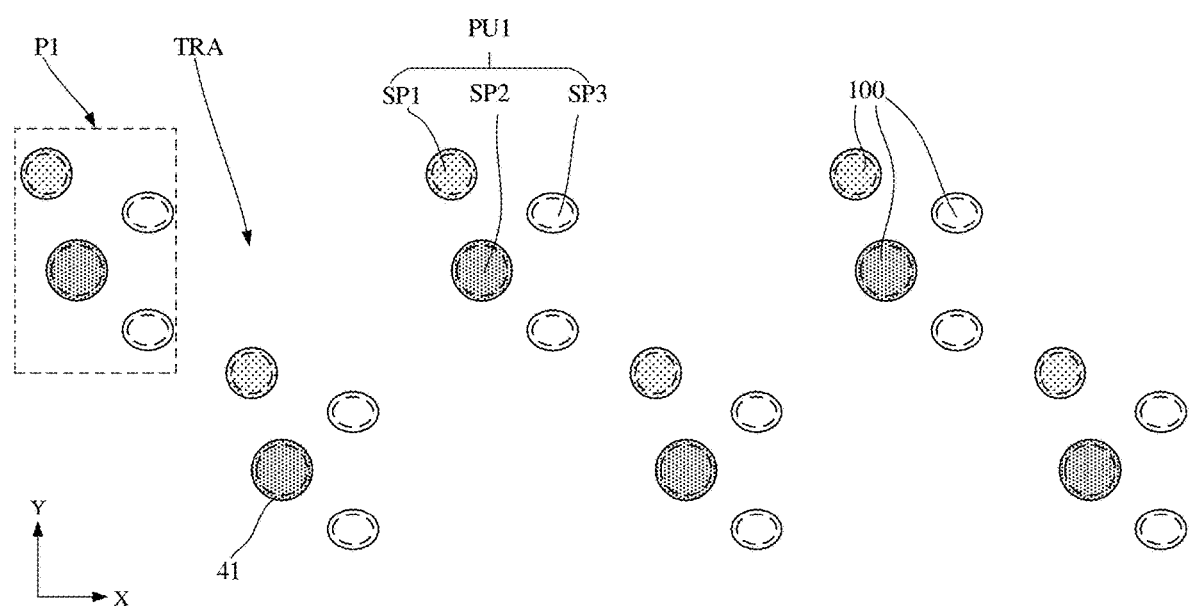
FIG. 4 shows an enlarged view of a partial region REG1 in FIG. 3.
Figure 5:
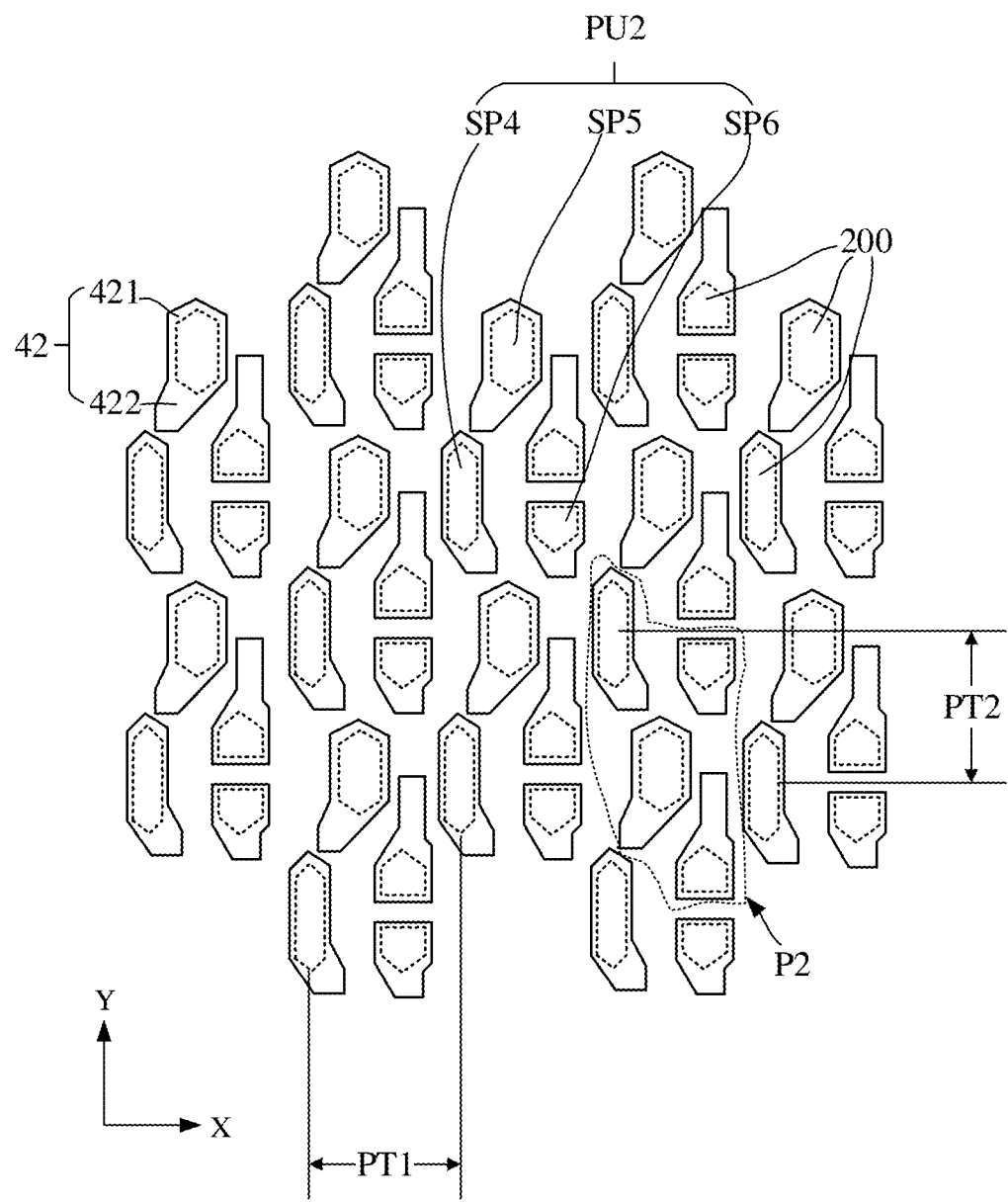
FIG. 5 shows an enlarged view of a partial region REG2 in FIG. 3.
Figure 6:
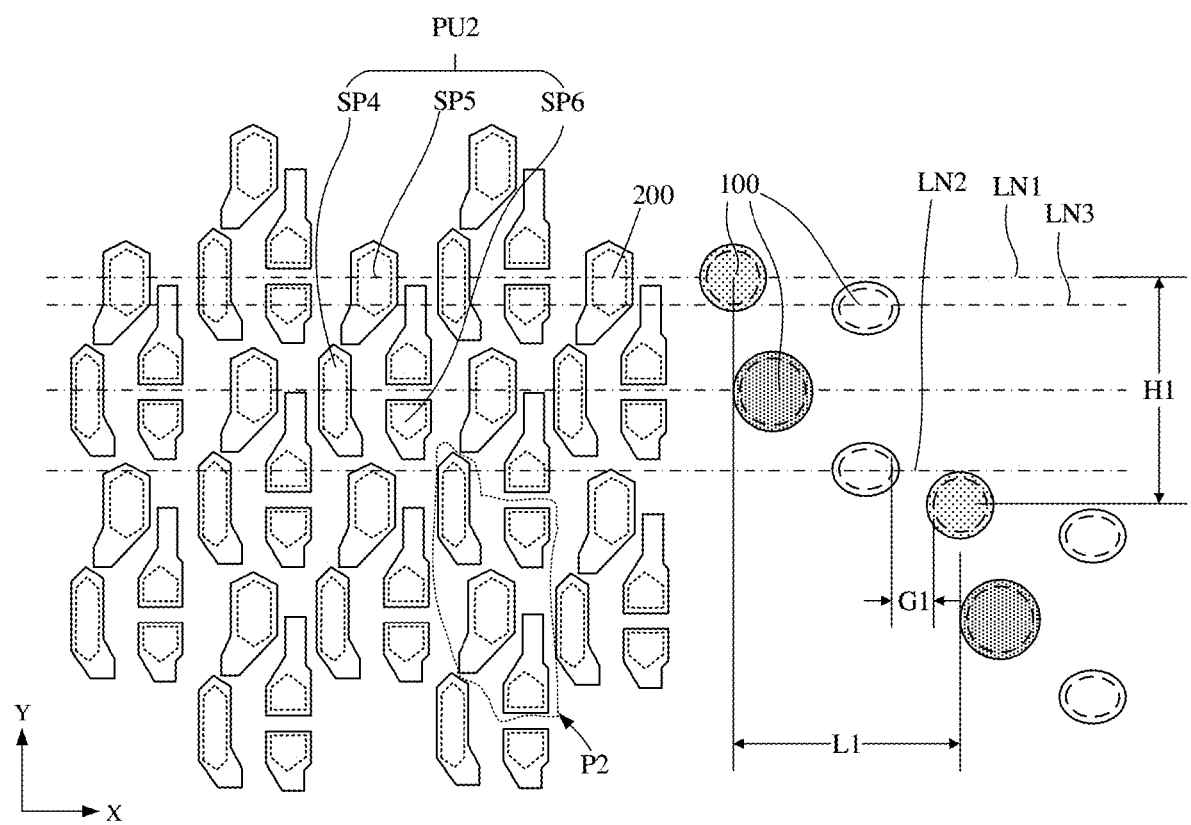
FIG. 6 shows an enlarged view of a partial region REG3 in FIG. 3.

FIG. 3 shows a partial diagram of the first display area, the second display area and the third display area of the display substrate shown in FIG. 1. FIG. 4 shows an enlarged view of a partial region REG2 in FIG. 3. FIG. 5 shows an enlarged view of a partial region REG2 in FIG. 3. FIG. 6 shows an enlarged view of a partial region REG3 in FIG. 3.

Referring to FIG. 3 to FIG. 5, the first display area AA1 includes a plurality of first repeating units P1 arranged in an array, and the second display area AA2 includes a plurality of second repeating units P2 arranged in an array. Each repeating unit P1, P2 may include a plurality of sub-pixels. In some embodiments, each first repeating unit P1 may include at least one first pixel unit PU1, and each first pixel unit PU1 may further include a plurality of sub-pixels, such as red sub-pixels, green sub-pixels and blue sub-pixels. Similarly, the second repeating unit P2 may include at least one second pixel unit PU2, and each second pixel unit PU2 may further include a plurality of sub-pixels, such as red sub-pixels, green sub-pixels and blue sub-pixels.

It should be noted that red sub-pixels, green sub-pixels and blue sub-pixels are illustrated by way of example in describing the embodiments of the present disclosure, but the embodiments of the present disclosure are not limited thereto. That is, each repeating unit may include sub-pixels of at least two different colors, such as a fourth sub-pixel, a fifth sub-pixel and a sixth sub-pixel. A first color, a second color and a third color are different colors. Herein, for the convenience of description, the plurality of sub-pixels included in the first pixel unit PU1 are respectively referred to as a first sub-pixel, a second sub-pixel and a third sub-pixel, and the plurality of sub-pixels included in the second pixel unit PU2 are respectively referred to as a fourth sub-pixel, a fifth sub-pixel and a sixth sub-pixel. For example, the first sub-pixel and the fourth sub-pixel may emit light of the same color, for example, red; the second sub-pixel and the fifth sub-pixel may emit light of the same color, for example, blue; the third sub-pixel and the sixth sub-pixel may emit light of the same color, for example, green.

For example, in some exemplary embodiments of the present disclosure, one first pixel unit PU1 includes at least one first sub-pixel (for example, one first sub-pixel is shown in FIG. 4), at least one second sub-pixel (for example, one second sub-pixel is shown in FIG. 4), and at least one third sub-pixel (for example, two third sub-pixels are shown in FIG. 4). For the convenience of description, the first sub-pixel, the second sub-pixel and the third sub-pixel included in the first pixel unit PU1 are denoted by reference numerals SP1, SP2 and SP3, respectively. One second pixel unit PU2 includes at least one fourth sub-pixel (for example, one fourth sub-pixel is shown in FIG. 5), at least one fifth sub-pixel (for example, one fifth sub-pixel is shown in FIG. 5), and at least one sixth sub-pixel (for example, two sixth sub-pixels are shown in FIG. 5). For the convenience of description, the fourth sub-pixel, the fifth sub-pixel and the sixth sub-pixel included in the second pixel unit PU2 are denoted by reference numerals SP4, SP5 and SP6, respectively. For example, the first color may be red, the second color may be blue, and the third color may be green.

A sub-pixel may include a light emitting device and a pixel driving circuit for driving the light emitting device to emit light. The light emitting device may include a first electrode, a second electrode and a luminescent material layer located therein. The pixel driving circuit may include elements such as transistors and capacitors. The pixel driving circuit may receive a signal transmitted by the signal line provided on the display substrate and generate a current for driving the light emitting device, and realize the purpose of driving the light emitting device to emit light through a connection with the first electrode or the second electrode. For example, the pixel driving circuit is arranged on the base substrate, and the light emitting device is located on a side of the pixel driving circuit away from the base substrate. In some embodiments, the display substrate further includes a pixel defining layer located on a side of the first electrode away from the pixel driving circuit. The pixel defining layer includes a plurality of openings, and each sub-pixel corresponds to at least one opening (for example, one opening) of the pixel defining layer. An actual light emitting area or display area of the sub-pixel is substantially equivalent to the opening of the pixel defining layer corresponding to the sub-pixel. In some embodiments, the opening of the pixel defining layer corresponding to each sub-pixel or the actual light emitting area of each sub-pixel has an area smaller than that of the first electrode, and a projection of the opening of the pixel defining layer corresponding to each sub-pixel or the actual light emitting area of each sub-pixel on the base substrate completely falls within a projection of the first electrode on the base substrate. For ease of illustration, FIG. 4 to FIG. 6 only show approximate positions and shapes of the opening of the pixel defining layer corresponding to the sub-pixel and the anode structure of the light emitting device to represent a distribution of the sub-pixels. Exemplarily, in FIG. 4 to FIG. 6, a dashed frame indicates the shape and position of the opening, and a solid frame indicates the shape and position of the anode structure.

For example, in some embodiments of the present disclosure, an arrangement of sub-pixels in each repeating unit may refer to conventional pixel arrangement, such as GGRB, RGBG, RGB, etc., which is not limited in the embodiments of the present disclosure.

As shown in FIG. 3, the first display area AA1 has a first pixel density, and the second display area AA2 has a second pixel density not less than the first pixel density, for example, a second pixel density greater than the first pixel density. For example, a pixel density is an average number of sub-pixels per unit area. Alternatively, for example, the pixel density is a ratio of the actual light emitting area of the sub-pixels in the unit area to the unit area. Alternatively, for example, the pixel density is a ratio of the area of the anode electrodes of the sub-pixels in the unit area to the unit area. Alternatively, for example, the pixel density reflects a ratio of a region in the unit area that is opaque or has a low transmittance to the unit area. This is not limited in the embodiments of the present disclosure. In the first display area AA1, a blank area between the plurality of first repeating units P1 may allow more light to pass through, so as to increase the light transmittance of the area. Therefore, the first display area AA1 has a greater light transmittance than the second display area AA2.

It should be noted that herein, the blank area between the plurality of first repeating units P1 may be referred to as a light transmitting area TRA.

Referring to FIG. 3 to FIG. 5, the display substrate may include a plurality of openings respectively located in a plurality of sub-pixels in the first display area AA1 and the second display area AA2 so as to expose at least part of the anode structures of the corresponding sub-pixels. For the convenience of description, the opening in the first display area AA1 (that is, the opening of the sub-pixel of the first pixel unit PU1) is referred to as a first opening, which is denoted by reference numeral 100; the opening in the second display area AA2 (that is, the opening of the sub-pixel of the second pixel unit PU2) is referred to as a second opening, which is denoted by reference numeral 200.

As shown in FIG. 5, each sub-pixel in the second display area AA2 may include a second opening 200. For example, in the second display area AA2, each of an orthographic projection of the second opening 200 of the fourth sub-pixel on the base substrate 1 and an orthographic projection of the second opening 200 of the fifth sub-pixel on the base substrate 1 may have a regular shape of a hexagon (for example, a rounded hexagon), and an orthographic projection of the second opening 200 of the sixth sub-pixel on the base substrate 1 may have a regular shape of a pentagon (for example, a rounded pentagon). It should be noted that the shape of the orthographic projection of the second opening 200 on the base substrate 1 is not limited to the above-mentioned shape. Any suitable shape, such as a circle, an ellipse, an octagon, a rectangle, a rounded rectangle, and so on, may be selected. It may be a shape with a convex part or a shape with a concave part.

Each sub-pixel in the second display area AA2 may include a second light emitting device 42. For example, the second light emitting device 42 may include an anode structure, a luminescent material layer and a cathode structure that are stacked. It should be noted that, for the sake of clarity, the anode structure of the second light emitting device 42 is shown to schematically show the second light emitting device 42. For example, in the second display area AA2, the anode structure of the second light emitting device 42 includes an anode body 421 and an anode connection part 422. An orthographic projection of the anode body 421 on the base substrate 1 may have a regular shape, such as a hexagon. The second display area AA2 is further provided with a pixel driving circuit (to be described below) for driving the second light emitting device 42, and the anode connection part 422 is electrically connected to the pixel driving circuit of the second light emitting device 42.

For example, in the embodiment of FIG. 5, in the second display area AA2, each of an orthographic projection of the anode body 421 of the fourth sub-pixel on the base substrate 1 and an orthographic projection of the anode body 421 of the fifth sub-pixel on the base substrate 1 may have a regular shape of a hexagon (for example, a rounded hexagon), and an orthographic projection of the anode body 421 of the sixth sub-pixel on the base substrate 1 may have a regular shape of a pentagon (for example, a rounded pentagon). It should be noted that the shape of the orthographic projection of the anode body 421 on the base substrate 1 is not limited to the above-mentioned shape. Any suitable shape, such as a circle, an ellipse, an octagon, a rectangle, a rounded rectangle, and so on, may be selected. It may be a shape with a convex part or a shape with a concave part.

As shown in FIG. 4, each sub-pixel in the first display area AA1 may include a first opening 100. For example, in the first display area AA1, each of an orthographic projection of the first opening 100 of the first sub-pixel on the base substrate 1, an orthographic projection of the first opening 100 of the second sub-pixel on the base substrate 1 and an orthographic projection of the first opening 100 of the third sub-pixel on the base substrate 1 may be substantially circular or elliptical, or closer to a circle or an ellipse compared to the shape of the sub-pixel of the same color in the second display area AA2. For example, the shape of the sub-pixel of the same color in the second display area AA2 is a polygon, and the shape of the sub-pixel of the same color in the first display area AA1 is a rounded polygon with a larger radius of curvature at a top corner.

Each sub-pixel in the first display area AA1 may include a first light emitting device 41. For example, the first light emitting device 41 may include an anode structure, a luminescent material layer and a cathode structure that are stacked. It should be noted that, for the sake of clarity, the anode structure of the first light emitting device 41 is shown to schematically show the first light emitting device 41. For example, the first display area AA1 includes a plurality of first light emitting devices 41 arranged in an array, and the first light emitting devices 41 are configured to emit light. For example, there is no pixel driving circuit in the first display area AA1. The pixel driving circuit for driving the first light emitting device 41 is arranged in the third display area AA3, so as to reduce a coverage area of a light shielding layer (for example, metal) of the first display area AA1 and increase the light transmittance of the first display area AA1, so that the light transmittance of the first display area AA1 is greater than that of the second display area AA2.

For example, in the embodiment of FIG. 4, in the first display area AA1, each of an orthographic projection of the first opening or the anode structure of the first sub-pixel on the base substrate 1, an orthographic projection of the first opening or the anode structure of the second sub-pixel on the base substrate 1 and an orthographic projection of the first opening or the anode structure of the third sub-pixel on the base substrate 1 may be substantially circular or elliptical. In this way, the light emitting area of the light emitting device of each sub-pixel in the first display area AA1 may be increased, so as to increase a service life of the light emitting device of each sub-pixel in the first display area AA1.

It should be understood that, similar to the second light emitting device 42, the anode structure of the first light emitting device 41 may include an anode body and an anode connection part. An orthographic projection of the anode body on the base substrate 1 may be substantially circular or elliptical. The anode connection part of the first light emitting device 41 may be electrically connected to a first end (to be described below) of a first connection line 110, so that the first light emitting device 41 may be electrically connected to its pixel driving circuit.

As shown in FIG. 3 to FIG. 5, a plurality of first repeating units P1 and a plurality of second repeating units P2 are respectively arranged in an array on the base substrate 1 of the display substrate 10. For example, the plurality of first repeating units P1 are arranged in an array in the first display area AA1 in a first direction (X direction shown) and a second direction (Y direction shown). The plurality of second repeating units P2 are arranged in an array in the second display area AA2 in the first direction (X direction shown) and the second direction (Y direction shown).

Referring to FIG. 6, a plan view of a junction of the first display area AA1 and the second display area AA2 is schematically shown. Referring to FIG. 3 to FIG. 6 in combination, the first opening 100 of each sub-pixel in the first repeating unit P1 has an area greater than that of the second opening 200 of the sub-pixel of the same color in the second repeating unit P2. Specifically, an orthographic projection of the first opening 100 of the first sub-pixel SP1 on the base substrate 1 has an area greater than that of an orthographic projection of the second opening 200 of the fourth sub-pixel SP4 on the base substrate 1. An orthographic projection of the first opening 100 of the second sub-pixel SP2 on the base substrate 1 has an area greater than that of an orthographic projection of the second opening 200 of the fifth sub-pixel SP5 on the base substrate 1. An orthographic projection of the first opening 100 of the third sub-pixel SP3 on the base substrate 1 has an area greater than that of an orthographic projection of the second opening 200 of the sixth sub-pixel SP6 on the base substrate 1.

In the embodiments of the present disclosure, a ratio of the area of the orthographic projection of the first opening 100 of the first sub-pixel SP1 on the base substrate 1 to the area of the orthographic projection of the second opening 200 of the fourth sub-pixel SP4 on the base substrate 1 is a first ratio, a ratio of the area of the orthographic projection of the first opening 100 of the second sub-pixel SP2 on the base substrate 1 to the area of the orthographic projection of the second opening 200 of the fifth sub-pixel SP5 on the base substrate is a second ratio, and a ratio of the area of the orthographic projection of the first opening 100 of the third sub-pixel SP3 on the base substrate 1 to the area of the orthographic projection of the second opening 200 of the sixth sub-pixel SP6 on the base substrate is a third ratio. For example, a ratio of the first ratio to the second ratio is between 0.8 and 1.2, and a ratio of the second ratio to the third ratio is between 0.8 and 1.2. That is, any two of the first ratio, the second ratio and the third ratio are substantially equal to each other.

In the display substrate provided by the embodiments of the present disclosure, the area of the opening of each sub-pixel in the first display area is greater than the area of the opening of the sub-pixel of the same color in the second display area, and the area of the opening of each sub-pixel is enlarged substantially in equal proportion. In this way, the display substrate may achieve a better display effect and a longer service life of the light emitting device.

In the embodiments of the present disclosure, the area of the orthographic projection of the first opening 100 of the first sub-pixel SP1 on the base substrate 1 is 1.2-5 times the area of the orthographic projection of the second opening 200 of the fourth sub-pixel SP4 on the base substrate 1. The area of the orthographic projection of the first opening 100 of the second sub-pixel SP2 on the base substrate 1 is 1.2-5 times the area of the orthographic projection of the second opening 200 of the fifth sub-pixel SP5 on the base substrate 1. The area of the orthographic projection of the first opening 100 of the third sub-pixel SP3 on the base substrate 1 is 1.2-5 times the area of the orthographic projection of the second opening 200 of the sixth sub-pixel SP6 on the base substrate 1.

For example, the area of the orthographic projection of the first opening 100 of the first sub-pixel SP1 on the base substrate 1 is 1.5-2 times, for example, about 2 times the area of the orthographic projection of the second opening 200 of the fourth sub-pixel SP4 on the base substrate 1. The area of the orthographic projection of the first opening 100 of the second sub-pixel SP2 on the base substrate 1 is 1.5-2.5 times, for example, about 2 times the area of the orthographic projection of the second opening 200 of the fifth sub-pixel SP5 on the base substrate 1. The area of the orthographic projection of the first opening 100 of the third sub-pixel SP3 on the base substrate 1 is 1.5-2.5 times, for example, about 2 times the area of the orthographic projection of the second opening 200 of the sixth sub-pixel SP6 on the base substrate 1.

For example, a proportion of an area of the first opening 100 in a first unit area including at least one of the plurality of first repeating units P1 is not greater than that of an area of the second opening 200 in a second unit area including at least one of the plurality of second repeating units P2. The first unit area is equal to the second unit area. Each of the first unit area and the second unit area is greater than the area of a first repeating unit, and greater than the area of a second repeating unit. That is, an opening ratio in the first display area AA1 is not greater than that in the second display area AA2.

Figure 22A:
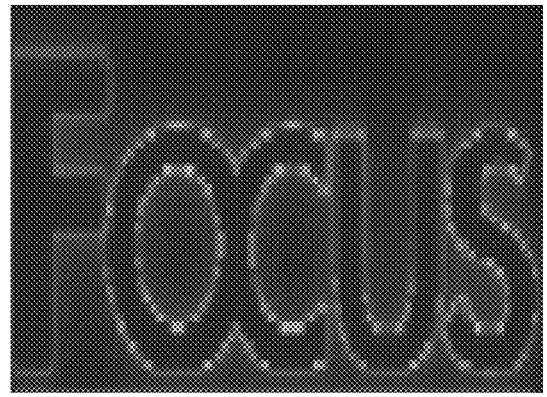
FIG. 22A and FIG. 22B respectively show an extended diffraction simulation diagram and a PSF (point spread function) simulation diagram in a case that an orthographic projection of a first opening of a first sub-pixel on a base substrate has an area about 1 time an area of an orthographic projection of a second opening of a fourth sub-pixel on the base substrate.
Figure 22B:
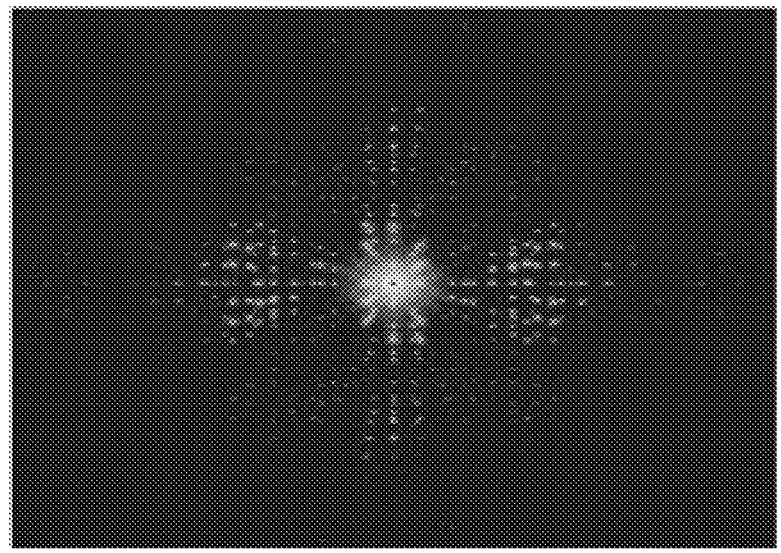
Figure 23A:
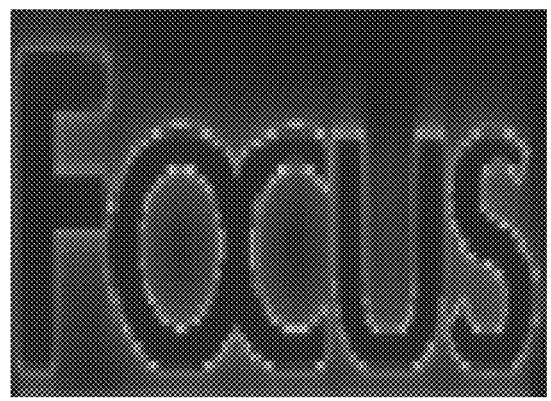
FIG. 23A and FIG. 23B respectively show an extended diffraction simulation diagram and a PSF (point spread function) simulation diagram in a case that the orthographic projection of the first opening of the first sub-pixel on the base substrate has an area about 1.5 to 2.5 times (for example, about 2 times) an area of the orthographic projection of the second opening of the fourth sub-pixel on the base substrate.
Figure 23B:
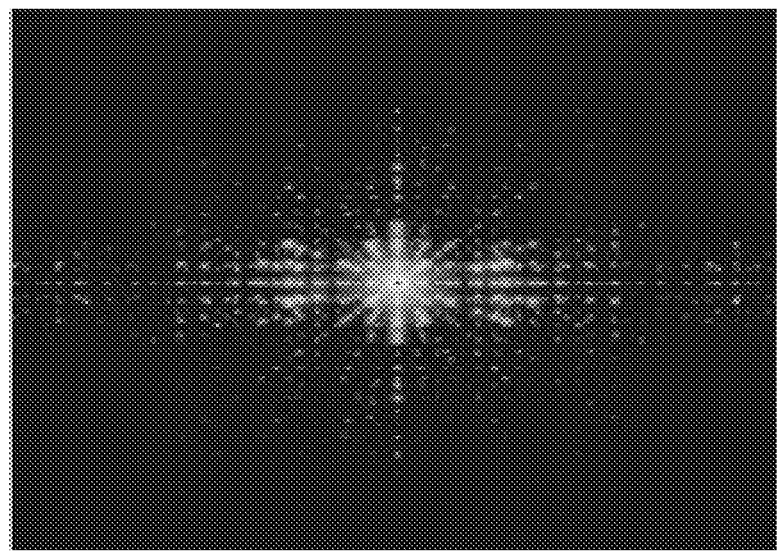
Figure 24A:
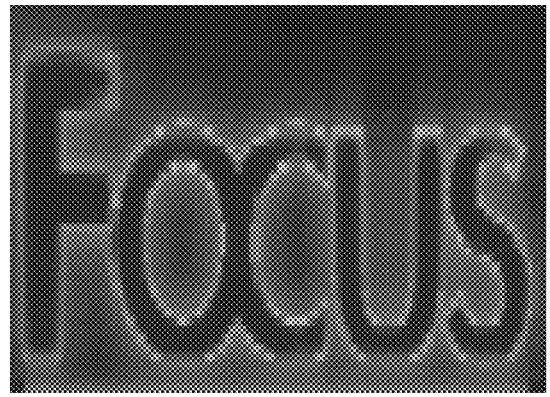
FIG. 24A and FIG. 24B respectively show an extended diffraction simulation diagram and a PSF (point spread function) simulation diagram in a case that an orthographic projection of a first opening of a first sub-pixel on a base substrate has an area about 3 times an area of an orthographic projection of a second opening of a fourth sub-pixel on the base substrate.
Figure 24B:
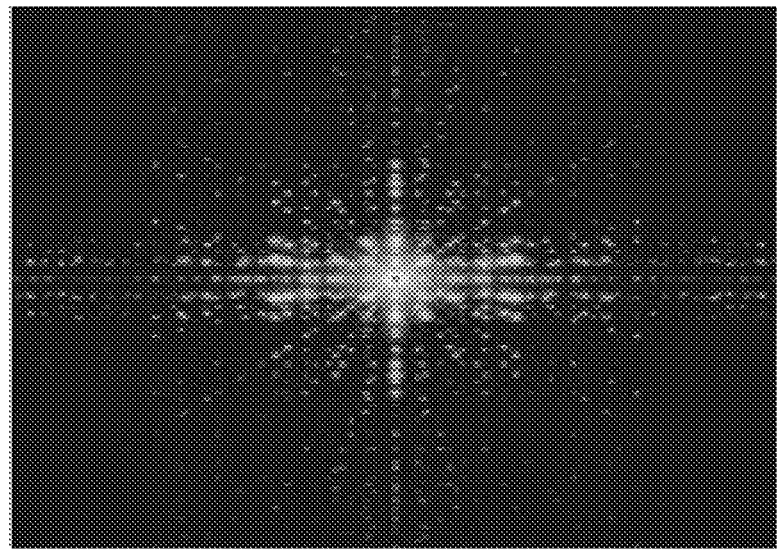
Figure 25A:
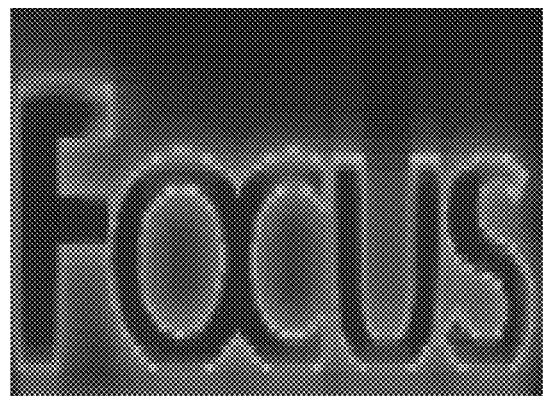
FIG. 25A and FIG. 25B respectively show an extended diffraction simulation diagram and a PSF (point spread function) simulation diagram in a case that an orthographic projection of a first opening of a first sub-pixel on a base substrate has an area about 4 times an area of an orthographic projection of a second opening of a fourth sub-pixel on the base substrate.
Figure 25B:
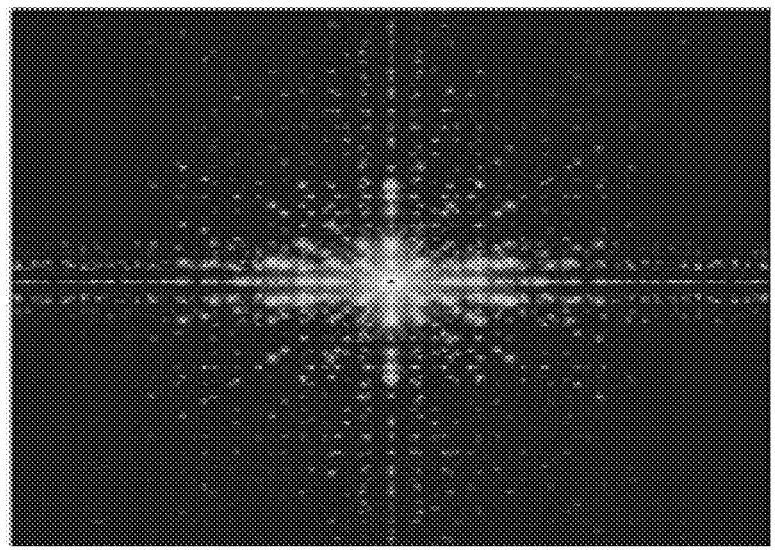

FIG. 22A and FIG. 22B respectively show an extended diffraction simulation diagram and a PSF (point spread function) simulation diagram in a case that the area of the orthographic projection of the first opening 100 of the first sub-pixel SP1 on the base substrate 1 is about 1 time the area of the orthographic projection of the second opening 200 of the fourth sub-pixel SP4 on the base substrate 1. FIG. 23A and FIG. 23B respectively show an extended diffraction simulation diagram and a PSF (point spread function) simulation diagram in a case that the area of the orthographic projection of the first opening 100 of the first sub-pixel SP1 on the base substrate 1 is about 2 times the area of the orthographic projection of the second opening 200 of the fourth sub-pixel SP4 on the base substrate 1. FIG. 24A and FIG. 24B respectively show an extended diffraction simulation diagram and a PSF (point spread function) simulation diagram in a case that the area of the orthographic projection of the first opening 100 of the first sub-pixel SP1 on the base substrate 1 is about 3 times the area of the orthographic projection of the second opening 200 of the fourth sub-pixel SP4 on the base substrate 1. FIG. 25A and FIG. 25B respectively show an extended diffraction simulation diagram and a PSF (point spread function) simulation diagram in a case that the area of the orthographic projection of the first opening 100 of the first sub-pixel SP1 on the base substrate 1 is about 4 times the area of the orthographic projection of the second opening 200 of the fourth sub-pixel SP4 on the base substrate 1.

Referring to FIG. 22A and FIG. 22B, in the case that the area of the orthographic projection of the first opening 100 of the first sub-pixel SP1 on the base substrate 1 is about 1 time the area of the orthographic projection of the second opening 200 of the fourth sub-pixel SP4 on the base substrate 1, a displayed font has little ghost, and a displayed image has a small diffraction peak. Referring to FIG. 25A and FIG. 25B, in the case that the area of the orthographic projection of the first opening 100 of the first sub-pixel SP1 on the base substrate 1 is about 4 times the area of the orthographic projection of the second opening 200 of the fourth sub-pixel SP4 on the base substrate 1, the displayed font has many ghosts, and the displayed image has obvious starburst, that is, the diffraction is obvious. Referring to FIG. 24A and FIG. 24B, in the case that the area of the orthographic projection of the first opening 100 of the first sub-pixel SP1 on the base substrate 1 is about 3 times the area of the orthographic projection of the second opening 200 of the fourth sub-pixel SP4 on the base substrate 1, the displayed font still has many ghosts, the starburst diffraction is slightly better than that in the case of 4 times, but the displayed image still shows obvious diffraction. Referring to FIG. 23A and FIG. 23B, in the case that the area of the orthographic projection of the first opening 100 of the first sub-pixel SP1 on the base substrate 1 is about 2 times the area of the orthographic projection of the second opening 200 of the fourth sub-pixel SP4 on the base substrate 1, the displayed font has little ghosts, the starburst diffraction is better than that in the case of 4 times and 3 times, and the diffraction of the displayed image is not obvious.

On the other hand, the area of the first opening of each sub-pixel in the first display area AA1 is related to the service life of the light emitting device of the sub-pixel. In the case that the area of the orthographic projection of the first opening 100 of the first sub-pixel SP1 on the base substrate 1 is about 1 time the area of the orthographic projection of the second opening 200 of the fourth sub-pixel SP4 on the base substrate 1, the service life of the light emitting device of each sub-pixel in the first display area AA1 is 10%-20% of that of the light emitting device of the sub-pixel of the same color in the second display area AA2. In the case that the area of the orthographic projection of the first opening 100 of the first sub-pixel SP1 on the base substrate 1 is 1.5-2.5 times, for example, about 2 times the area of the orthographic projection of the second opening 200 of the fourth sub-pixel SP4 on the base substrate 1, the service life of the light emitting device of each sub-pixel in the first display area AA1 is 30%-50% of that of the light emitting device of the sub-pixel of the same color in the second display area AA2. In the case that the area of the orthographic projection of the first opening 100 of the first sub-pixel SP1 on the base substrate 1 is about 3 times the area of the orthographic projection of the second opening 200 of the fourth sub-pixel SP4 on the base substrate 1, the service life of the light emitting device of each sub-pixel in the first display area AA1 is 50%-80% of that of the light emitting device of the sub-pixel of the same color in the second display area AA2. In the case that the area of the orthographic projection of the first opening 100 of the first sub-pixel SP1 on the base substrate 1 is about 4 times the area of the orthographic projection of the second opening 200 of the fourth sub-pixel SP4 on the base substrate 1, the service life of the light emitting device of each sub-pixel in the first display area AA1 is 80%-100% of that of the light emitting device of the sub-pixel of the same color in the second display area AA2.

In the embodiments of the present disclosure, considering the display effect in the first display area AA1 and the service life of the light emitting device therein, the area of the first opening 100 of each sub-pixel in the first repeating unit P1 may be set to be about 1.2 to 5 times the area of the second opening 200 of the sub-pixel of the same color in the second repeating unit P2. In particular, when the area of the first opening 100 of each sub-pixel in the first repeating unit P1 is set to be 1.5 to 2.5 times, for example, about 2 times the area of the second opening 200 of the sub-pixel of the same color in the second repeating unit P2, the display effect and the service life of the light emitting device may be both taken into account, that is, a good display effect may be achieved and the service life of the light emitting device may be improved.

In a case that a perimeter of a geometric figure is fixed, a circle or an ellipse has a greater area. In the embodiments of the present disclosure, the first opening 100 of each sub-pixel in the first display area AA1 preferably has a shape of a circle or an ellipse. It should be noted that the embodiments of the present disclosure are not limited to this, and the first opening 100 may be a polygon, such as a dodecagon, an enneagon, an octagon, a hexagon, etc., that makes the edge of the opening smooth or curved, or may be a combination of a circle, an ellipse and a polygon.

In the embodiments of the present disclosure, a distribution density of the repeating units in the first display area AA1 is less than that of the repeating units in the second display area AA2. For example, in FIG. 6, two rows of first repeating units P1 and five rows of second repeating units P2 are schematically shown. In this way, a part of the second repeating units P2 may be located in the same row with the first repeating units P1, and the other part of the second repeating units P2 are located in a row alone, that is, not located in the same row with any first repeating unit P1.

As shown in FIG. 6, in the first repeating units P1 and the second repeating units P2 located in the same row, a center of the first opening 100 of the first sub-pixel SP1 and a center of the second opening 200 of the fourth sub-pixel SP4 are substantially located on the same straight line extending parallel to the first direction X. That is, the center of the first opening 100 of the first sub-pixel SP1 and the center of the second opening 200 of the fourth sub-pixel SP4 are substantially located on the same horizontal line. In other words, a distance between the center of the first opening 100 of at least one of the first sub-pixels SP1 and a first straight line LN1 extending parallel to the first direction X in the second direction Y is not greater than 5 microns, and a distance between the center of the second opening 200 of at least one of the fourth sub-pixels SP4 and the first straight line LN1 in the second direction Y is not greater than 5 microns.

In the first repeating units P1 and the second repeating units P2 located in the same row, a center of the first opening 100 of the second sub-pixel SP2 and a center of the second opening 200 of the fifth sub-pixel SP5 are substantially located on the same straight line extending parallel to the first direction X. In other words, a distance between the center of the first opening 100 of at least one of the second sub-pixels SP2 and a second straight line LN2 extending parallel to the first direction X in the second direction Y is not greater than 5 microns, and a distance between the center of the second opening 200 of at least one of the fifth sub-pixels SP5 and the second straight line LN2 in the second direction Y is not greater than 5 microns.

In the first repeating units P1 and the second repeating units P2 located in the same row, a center of the first opening 100 of the third sub-pixel SP3 and a center of the second opening 200 of the sixth sub-pixel SP6 are substantially located on the same straight line extending parallel to the first direction X. In other words, a distance between the center of the first opening 100 of at least one of the third sub-pixels SP3 and a third straight line LN3 extending parallel to the first direction X in the second direction Y is not greater than 5 microns, and a distance between the center of the second opening 200 of at least one of the sixth sub-pixels SP6 and the third straight line LN3 in the second direction Y is not greater than 5 microns.

In the embodiments of the present disclosure, the center of the opening of the sub-pixel in the first display area AA1 and that of the sub-pixel of the same color in the second display area AA2 are arranged on the same horizontal line, which is beneficial to consistent display effects of the first display area AA1 and the second display area AA2, so that an overall display effect of the display substrate may be improved.

In the embodiments of the present disclosure, the second repeating unit P2 has a first pixel pitch PT1 and a second pixel pitch PT2. Referring to FIG. 5, the first pixel pitch PT1 is equal to a distance in the first direction X between the centers of the second openings 200 of two fourth sub-pixels SP4 respectively located in two adjacent second pixel units PU2, and the second pixel pitch PT2 is equal to a distance in the second direction Y between the centers of the second openings 200 of two fourth sub-pixels SP4 respectively located in two adjacent second pixel units PU2.

In the embodiment shown in FIG. 5, a distance between the centers of the second openings 200 of two adjacent fourth sub-pixels SP4 in the same row in the first direction X is 2 times the first pixel pitch PT1, and a distance between the centers of the second openings 200 of two adjacent fourth sub-pixels SP4 in the same column in the second direction Y is 2 times the second pixel pitch PT2. Similarly, a distance between the centers of the second openings 200 of two adjacent fifth sub-pixels SP5 in the same row in the first direction X is 2 times the first pixel pitch PT1, and a distance between the centers of the second openings 200 of two adjacent fifth sub-pixels SP5 in the same column in the second direction Y is 2 times the second pixel pitch PT2. A distance between the centers of the second openings 200 of two adjacent sixth sub-pixels SP6 in the same row in the first direction X is 2 times the first pixel pitch PT1.

It should be noted that herein, the expressions "two adjacent pixel units", "two adjacent repeating units" and similar expressions do not particularly limit the direction in which the two pixel units or the two repeating units are adjacent. It means two closest pixel units or repeating units in the 180° direction in the XY plane, including but not limited to, two pixel units or repeating units adjacent in the first direction X, or adjacent in the second direction Y, or adjacent in a direction at an angle of 45° with respect to the first direction X and the second direction Y.

Referring to FIG. 4 to FIG. 6 and FIG. 11B, in two adjacent first pixel units PU1, a distance L1 between the centers of the first openings 100 of two adjacent first sub-pixels SP1 in the first direction X is greater than the first pixel pitch PT1, for example, 0.3 to 4 times the first pixel pitch PT1, such as 0.5 to 2 times, 1 to 4 times, 1.5 to 3 times, 1.5 to 2 times, or about 2 times the first pixel pitch PT1. Accordingly, a distance between the centers of the first openings 100 of two adjacent first sub-pixels SP1 in the same row in the first direction X is 3 to 8 times, for example, 3 to 6 times, 3 to 4 times, or about 4 times the first pixel pitch PT1.

In two adjacent first pixel units PU1, a distance between the centers of the first openings 100 of two adjacent second sub-pixels SP2 in the first direction X is greater than the first pixel pitch PT1, for example, 0.3 to 4 times the first pixel pitch PT1, such as 0.5 to 2 times, 1 to 4 times, 1.5 to 3 times, 1.5 to 2 times, or about 2 times the first pixel pitch PT1. Accordingly, a distance between the centers of the first openings 100 of two adjacent second sub-pixels SP2 in the same row in the first direction X is 3 to 8 times, for example, 3 to 6 times, 3 to 4 times, or about 4 times the first pixel pitch PT1.

In two adjacent first pixel units PU1, a distance between the centers of the first openings 100 of two adjacent third sub-pixels SP3 in the first direction X is greater than the first pixel pitch PT1, for example, 0.3 to 4 times the first pixel pitch PT1, such as 0.5 to 2 times, 1 to 4 times, 1.5 to 3 times, 1.5 to 2 times, or about 2 times the first pixel pitch PT1. Accordingly, a distance between the centers of the first openings 100 of two adjacent third sub-pixels SP3 in the same row in the first direction X is 3 to 8 times, for example, 3 to 6 times, 3 to 4 times, or about 4 times the first pixel pitch PT1.

In two adjacent first pixel units PU1, a distance H1 between the centers of the first openings 100 of two adjacent first sub-pixels SP1 in the second direction Y is greater than the second pixel pitch PT2, for example, 1 to 4 times the second pixel pitch PT2, such as 1.5 to 3 times, 1.5 to 2 times, or about 2 times the second pixel pitch PT2. Accordingly, a distance between the centers of the first openings 100 of two adjacent first sub-pixels SP1 in the same column in the second direction Y is 3 to 8 times, for example, 3 to 6 times, 3 to 4 times, or about 4 times the second pixel pitch PT2.

In two adjacent first pixel units PU1, a distance between the centers of the first openings 100 of two adjacent second sub-pixels SP2 in the second direction Y is greater than the second pixel pitch PT2, for example, 1 to 4 times the second pixel pitch PT2, such as 1.5 to 3 times, 1.5 to 2 times, or about 2 times the second pixel pitch PT2. Accordingly, a distance between the centers of the first openings 100 of two adjacent second sub-pixels SP2 in the same column in the second direction Y is 3 to 8 times, for example, 3 to 6 times, 3 to 4 times, or about 4 times the second pixel pitch PT2.

For example, in two adjacent first pixel units PU1, a distance between the center of the first opening of one sub-pixel and the center of the first opening of another sub-pixel of the same color in the first direction X is 1.5 to 2.5 times, for example, 2 times the first pixel pitch PT1, and a distance between the center of the first opening of one sub-pixel and the center of the first opening of another sub-pixel of the same color in the second direction Y is 1.5 to 2.5 times, for example, about 2 times the second pixel pitch PT2. Accordingly, in the first display area AA1, a distance between the centers of the second openings 100 of two adjacent sub-pixels of the same color in the same row in the first direction X is about 4 times the first pixel pitch PT1, and a distance between the centers of the second openings 100 of two adjacent sub-pixels of the same color in the same column in the second direction Y is about 4 times the second pixel pitch PT2. In this case, the pixel distribution density in the first display area AA1 is about one-fourth of that in the second display area AA2.

Through the above arrangement, in a case of increasing the light emitting area of the sub-pixels in the first display area AA1, a low-density distribution of the sub-pixels in the first display area AA1 may still be achieved, which is beneficial to improve the light transmittance in the first display area AA1.

Figure 7:
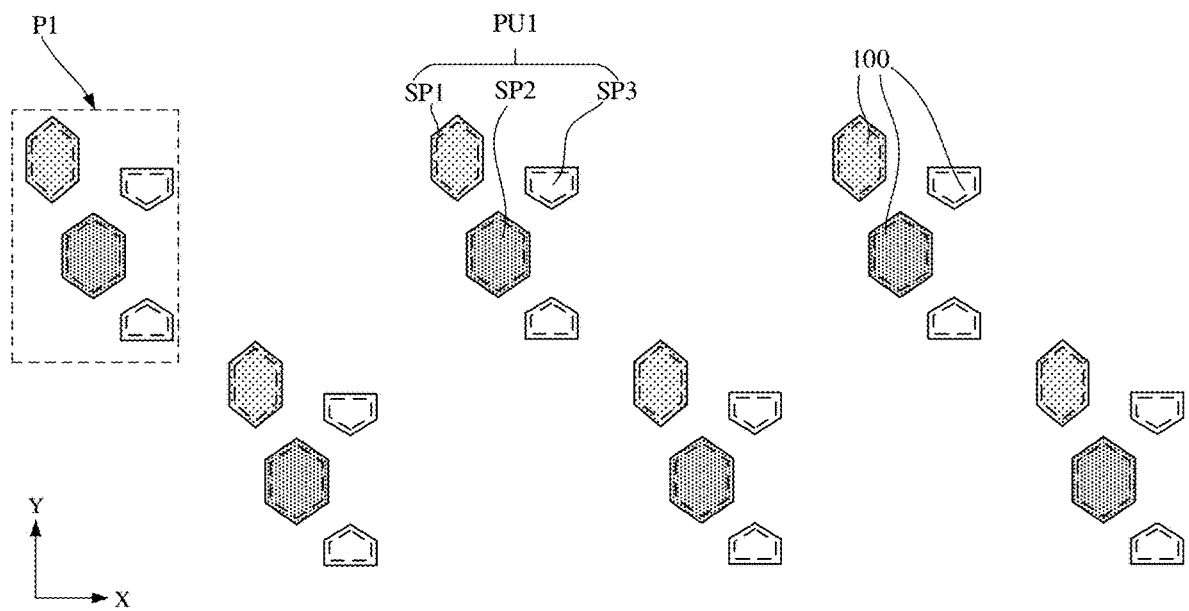
FIG. 7 shows an enlarged view of a display substrate according to other embodiments of the present disclosure at the partial region REG1 in FIG. 3.
Figure 8:
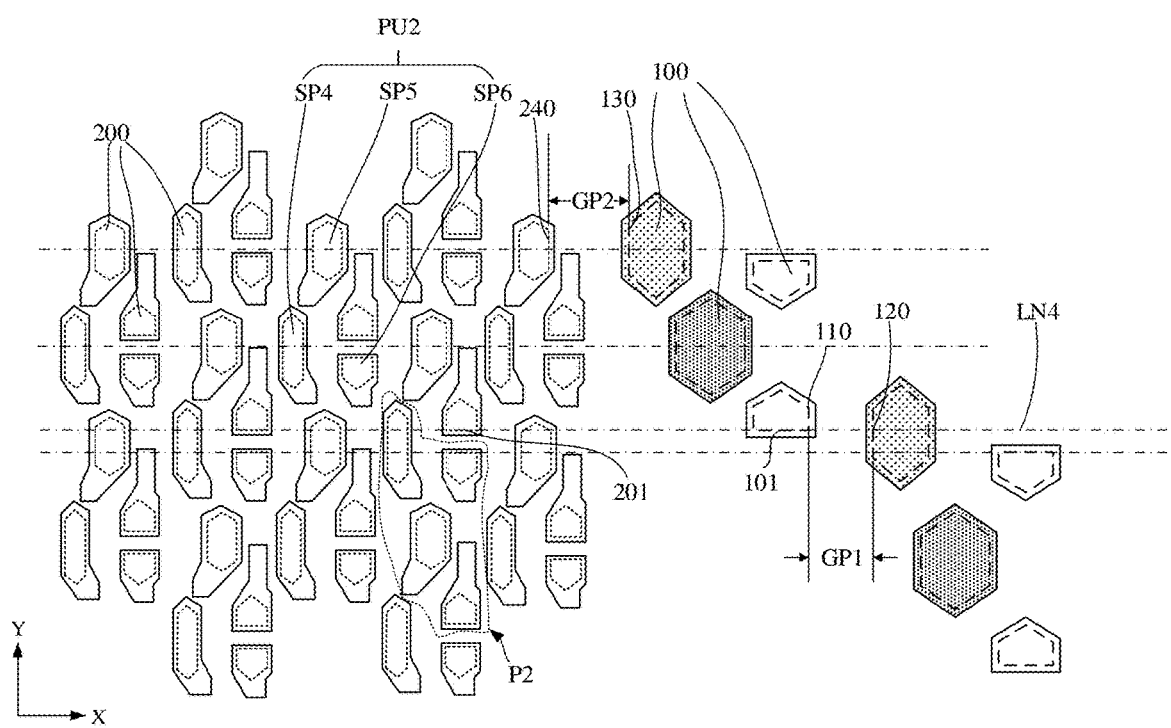
FIG. 8 shows an enlarged view of a display substrate according to other embodiments of the present disclosure at the partial region REG3 in FIG. 3.

FIG. 7 shows an enlarged view of a display substrate according to other embodiments of the present disclosure at the partial region REG1 in FIG. 3. FIG. 8 shows an enlarged view of a display substrate according to other embodiments of the present disclosure at the partial region REG3 in FIG. 3. For ease of illustration, FIG. 7 to FIG. 8 only show approximate positions and shapes of the opening of the pixel defining layer corresponding to the sub-pixel and the anode structure of the light emitting device to represent a distribution of the sub-pixels. Exemplarily, in FIG. 7 to FIG. 8, a dashed frame indicates the shape and position of the opening, and a solid frame indicates the shape and position of the anode structure.

As shown in FIG. 7 and FIG. 8, in the first display area AA1, each of the orthographic projection of the first opening of the first sub-pixel on the base substrate 1, the orthographic projection of the first opening of the second sub-pixel on the base substrate 1 and the orthographic projection of the first opening of the third sub-pixel on the base substrate 1 may have a shape of a polygon. For example, the orthographic projection of the first opening 100 of the first sub-pixel SP1 on the base substrate 1 may be a hexagon, the orthographic projection of the first opening 100 of the second sub-pixel SP2 on the base substrate 1 may be a hexagon, and the orthographic projection of the first opening 100 of the third sub-pixel SP3 on the base substrate 1 may be a pentagon.

In this embodiment, in the first repeating unit P1 and the second repeating unit P2 located in the same row, the center of the first opening 100 of a first sub-pixel and the center of the second opening 200 of the fourth sub-pixel SP4 are substantially located on the same straight line extending parallel to the first direction X, the center of the first opening 100 of the second sub-pixel SP2 and the center of the second opening 200 of the fifth sub-pixel SP5 are substantially located on the same straight line extending parallel to the first direction X, and the center of the first opening 100 of the third sub-pixel SP3 and the center of the second opening 200 of the sixth sub-pixel SP6 are substantially located on the same straight line extending parallel to the first direction X.

The pentagon of the first opening 100 of the third sub-pixel SP3 has a first side 101 extending in the first direction X. The pentagon of the second opening 200 of the sixth sub-pixel SP6 has a second side 201 extending in the first direction X. In the first repeating unit and the second repeating unit located in the same row, the first side 101 of the first opening 100 of the third sub-pixel SP3 and the second side 201 of the second opening 200 of the sixth sub-pixel SP6 are substantially located on the same straight line extending parallel to the first direction X, that is, on the same horizontal line. In other words, a distance between the first side 101 of the first opening 100 of at least one of the third sub-pixels SP3 and a fourth straight line LN4 extending parallel to the first direction X in the second direction Y is not greater than 5 microns, and a distance between the second side 201 of the second opening 200 of at least one of the sixth sub-pixels SP6 and the fourth straight line LN4 in the second direction Y is not greater than 5 microns.

It should be noted that, in the first display area AA1, in order to avoid color mixing between two adjacent pixel units, a portion of the pixel defining layer located between two adjacent pixel units should have a minimum size. Herein, this minimum size is referred to as a first gap threshold. That is, the first gap threshold is the minimum size of the portion of the pixel defining layer located between the first opening 100 of the first sub-pixel and the first opening 100 of the second sub-pixel adjacent to the first sub-pixel, and the first gap threshold is a minimum size for avoiding color mixing between two adjacent first pixel units. In the second display area AA2, in order to avoid color mixing between two adjacent pixel units, a portion of the pixel defining layer located between two adjacent pixel units should also have a minimum size. Herein, this minimum size is referred to as a second gap threshold. That is, the second gap threshold is the minimum size of the portion of the pixel defining layer located between the first opening 200 of the fourth sub-pixel and the first opening 200 of the fifth sub-pixel adjacent to the fourth sub-pixel, and the second gap threshold is a minimum size for avoiding color mixing between two adjacent second pixel units.

For example, in the embodiments of the present disclosure, each of the first gap threshold and the second gap threshold may not be less than 10 microns. For example, the first gap threshold may be in a range of 10 to 80 microns, and the second gap threshold may be in a range of 10 to 40 microns.

Referring to FIG. 3 to FIG. 8, a minimum gap GP1 between two adjacent first repeating units P1 in the first direction X is greater than or equal to the first gap threshold. The minimum gap GP1 is a shortest distance between the first opening 100 of the third sub-pixel of one of two adjacent first repeating units and the first opening 100 of the first sub-pixel or the second sub-pixel of the other of the two adjacent first repeating units. For example, in two adjacent first repeating units P1, the first opening 100 of the third sub-pixel SP3 of one first repeating unit has a first side 110 close to the other first repeating unit, the first opening 100 of the first sub-pixel SP1 of the other first repeating unit has a second side 120 close to the one first repeating unit, and the minimum gap GP1 is a gap between the first side 110 and the second side 120 in the first direction X.

At a junction of the first display area and the second display area located on both sides of the first display area in the first direction X, a shortest distance between the first opening 100 of a first sub-pixel and the second opening 200 of a fifth sub-pixel adjacent to the first sub-pixel is greater than or equal to half of a sum of the first gap threshold and the second gap threshold. For example, at a junction of the first display area AA1 and the second display area AA2, the first opening 100 of a first sub-pixel SP1 has a third side 130 close to the second display area, the second opening 200 of a fifth sub-pixel SP5 has a fourth side 240 close to the first display area, and a gap GP2 between the third side 130 and the fourth side 240 in the first direction X is greater than or equal to half of the sum of the first gap threshold and the second gap threshold.

Figure 9:
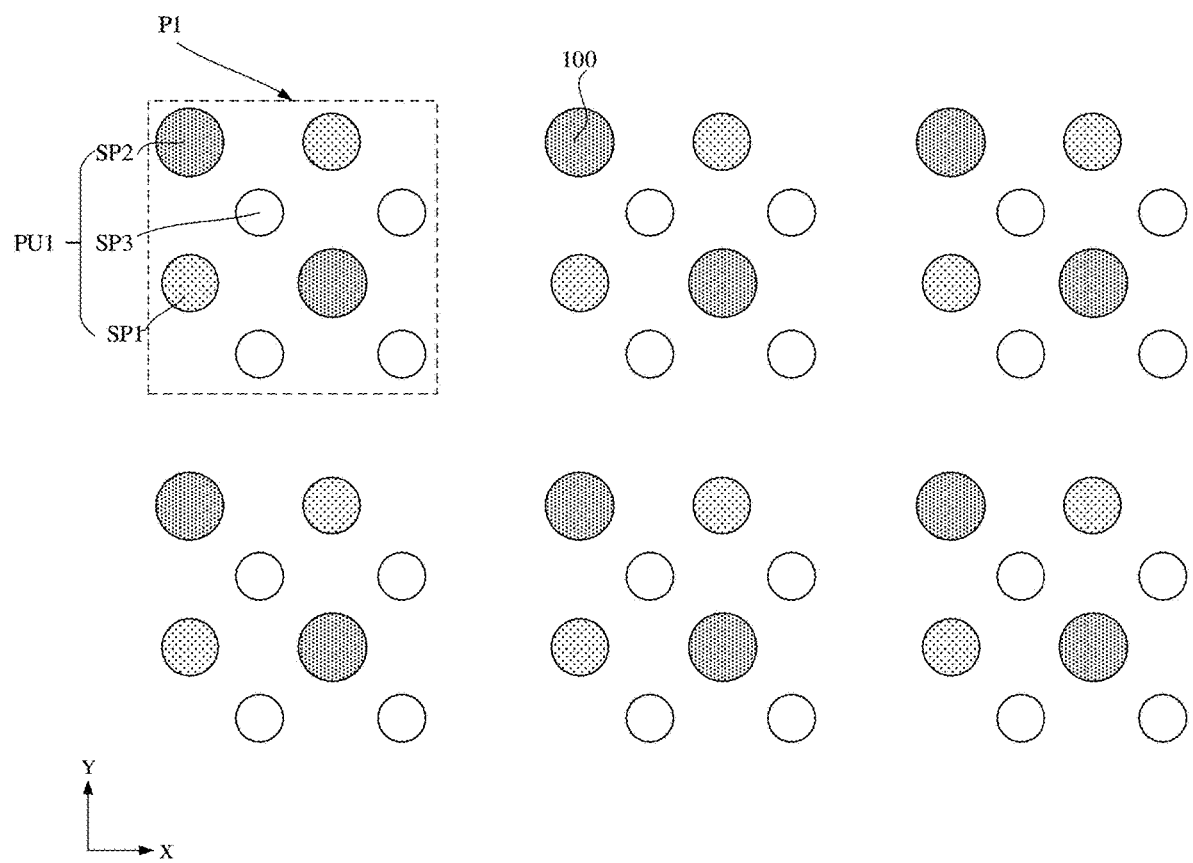
FIG. 9 shows an enlarged view of a display substrate according to other embodiments of the present disclosure at the partial region REG1 in FIG. 3.
Figure 10:
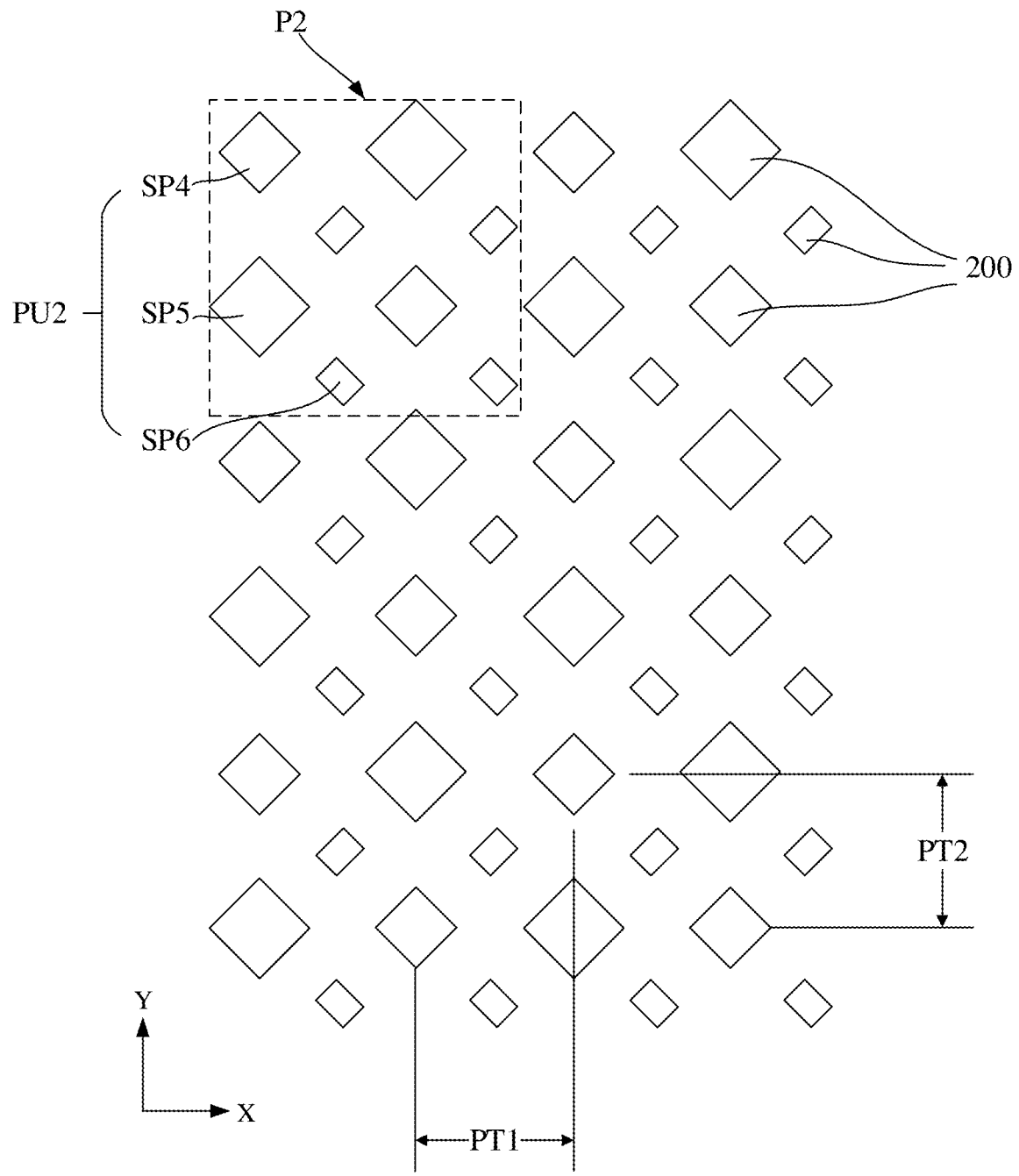
FIG. 10 shows an enlarged view of a display substrate according to other embodiments of the present disclosure at the partial region REG2 in FIG. 3.
Figure 11A:
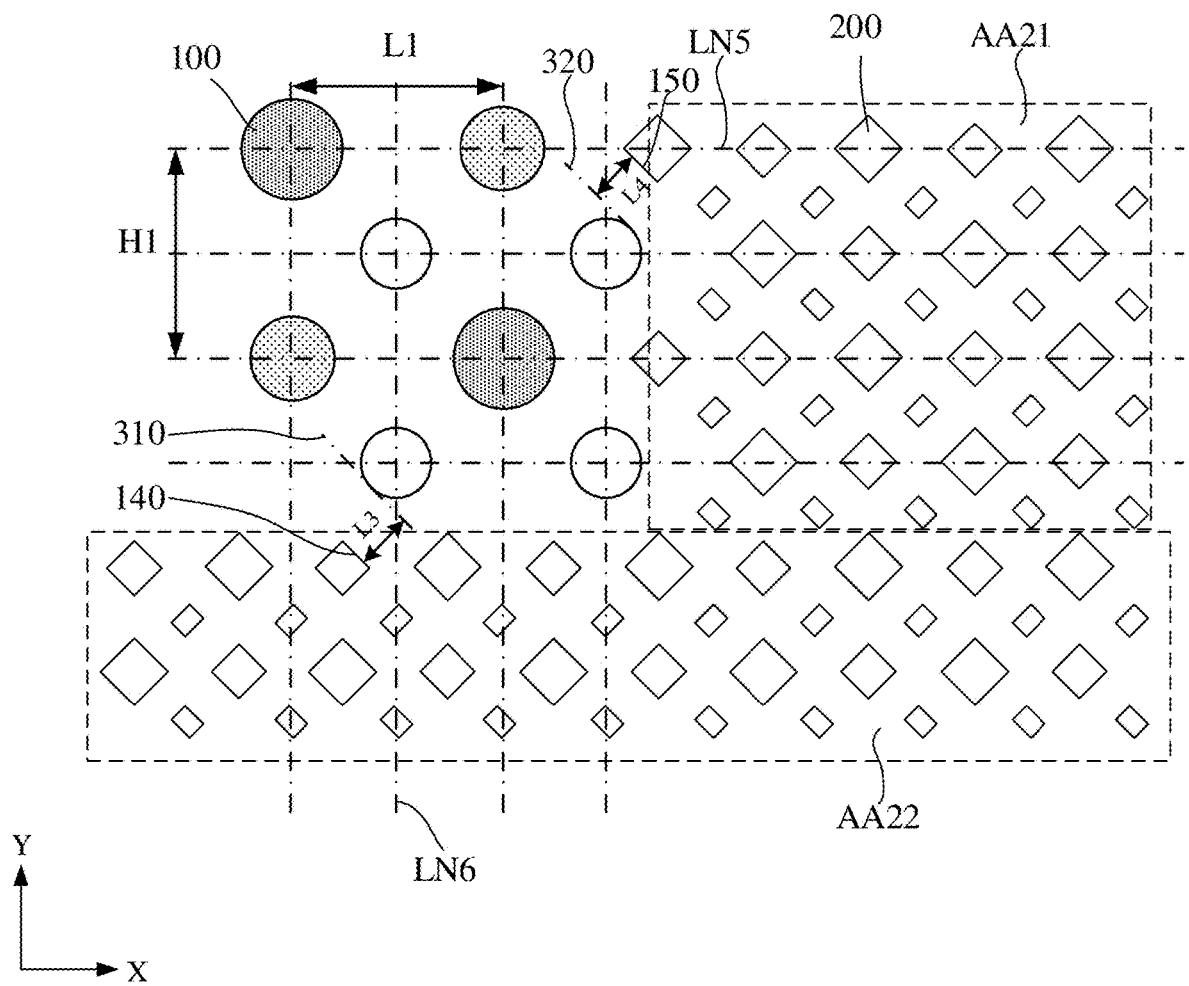
FIG. 11A shows an enlarged view of a display substrate according to other embodiments of the present disclosure at the partial region REG3 in FIG. 3.

FIG. 9 shows an enlarged view of a display substrate according to other embodiments of the present disclosure at the partial region REG1 in FIG. 3. FIG. 10 shows an enlarged view of a display substrate according to other embodiments of the present disclosure at the partial region REG2 in FIG. 3. FIG. 11A shows an enlarged view of a display substrate according to other embodiments of the present disclosure at the partial region REG3 in FIG. 3. Hereinafter, differences between the embodiments shown in FIG. 9 to FIG. 11A and the above embodiments will be mainly described. For other structures and arrangements, reference may be made to the descriptions in the above embodiments. For ease of illustration, FIG. 9 to FIG. 11A only show the opening of the pixel defining layer corresponding to the sub-pixel to represent the distribution of the sub-pixel. Exemplarily, in FIG. 9 to FIG. 11A, a solid frame indicates the shape and position of the opening.

Referring to FIG. 9 to FIG. 11A in combination, in the second display area AA2, each of the orthographic projection of the second opening 200 of the fourth sub-pixel SP4 on the base substrate 1, the orthographic projection of the second opening 200 of the fifth sub-pixel SP5 on the base substrate 1 and the orthographic projection of the second opening 200 of the sixth sub-pixel SP6 on the base substrate 1 may be substantially a rectangle. For example, sides of the rectangle are inclined with respect to the first direction X and the second direction Y.

In the first display area AA1, each of the orthographic projection of the first opening 100 of the first sub-pixel SP1 on the base substrate 1, the orthographic projection of the first opening 100 of the second sub-pixel SP2 on the base substrate 1 and the orthographic projection of the first opening 100 of the third sub-pixel SP3 on the base substrate 1 may be substantially a circle or an ellipse.

Similarly, the first opening 100 of each sub-pixel in the first repeating unit P1 has an area greater than that of the second opening 200 of the sub-pixel of the same color in the second repeating unit P2. Specifically, an orthographic projection of the first opening 100 of the first sub-pixel SP1 on the base substrate 1 has an area greater than that of an orthographic projection of the second opening 200 of the fourth sub-pixel SP4 on the base substrate 1. An orthographic projection of the first opening 100 of the second sub-pixel SP2 on the base substrate 1 has an area greater than that of an orthographic projection of the second opening 200 of the fifth sub-pixel SP5 on the base substrate 1. An orthographic projection of the first opening 100 of the third sub-pixel SP3 on the base substrate 1 has an area greater than that of an orthographic projection of the second opening 200 of the sixth sub-pixel SP6 on the base substrate 1.

Referring to FIG. 9 to FIG. 11A in combination, the first repeating unit P1 may include at least two first pixel units PU1 (two first pixel units PU1 are shown in FIG. 9). Each first pixel unit PU1 includes four sub-pixels, including one first sub-pixel SP1, one second sub-pixel SP2, and two third sub-pixels SP3. In a first repeating unit P1, a plurality of sub-pixels are arranged in four rows and four columns. In a first row, a second sub-pixel SP2 and a first sub-pixel SP1 are arranged in a first column and a third column, respectively. In a second row, two third sub-pixels SP3 are arranged in a second column and a fourth column, respectively. In a third row, a first sub-pixel SP1 and a second sub-pixel SP2 are arranged in the first column and the third column, respectively. In a fourth row, two third sub-pixels SP3 are arranged in the second column and the fourth column, respectively. That is, in the first display area AA1, the first sub-pixels SP1 and the second sub-pixels SP2 of the plurality of first pixel units PU1 are alternately distributed in the first direction X and the second direction Y, and the third sub-pixels SP3 of the plurality of first pixel units PU1 are arranged in an array in the first direction X and the second direction Y.

The second repeating unit P2 may include at least two second pixel units PU2 (two second pixel units PU2 are shown in FIG. 10). Each second pixel unit PU2 includes four sub-pixels, including one fourth sub-pixel SP4, one fifth sub-pixel SP5, and two sixth sub-pixels SP6. In a second repeating unit P2, a plurality of sub-pixels are arranged in four rows and four columns. In a first row, a fifth sub-pixel SP5 and a fourth sub-pixel SP4 are arranged in a first column and a third column, respectively. In a second row, two sixth sub-pixels SP6 are arranged in a second column and a fourth column, respectively. In a third row, a fourth sub-pixel SP5 and a fifth sub-pixel SP5 are arranged in the first column and the third column, respectively. In a fourth row, two sixth sub-pixels SP6 are arranged in the second column and the fourth column, respectively. That is, in the second display area AA1, the fourth sub-pixels SP4 and the fifth sub-pixels SP5 of the plurality of second pixel units PU2 are alternately distributed in the first direction X and the second direction Y, and the sixth sub-pixels SP6 of the plurality of second pixel units PU2 are arranged in an array in the first direction X and the second direction Y.

In the first display area AA1, the sub-pixels of the same color are uniformly arranged in the first direction X and the second direction Y. For example, the distance between the centers of the first openings 100 of two adjacent first sub-pixels SP1 in the first direction X is substantially equal to that between the centers of the first openings 100 of two adjacent second sub-pixels SP2 in the first direction X. The distance between the centers of the first openings 100 of two adjacent first sub-pixels SP1 in the second direction Y is substantially equal to that between the centers of the first openings 100 of two adjacent second sub-pixels SP2 in the second direction Y. The distance between the centers of the first openings 100 of two adjacent third sub-pixels SP3 in the first direction X is substantially equal to that between the centers of the first openings 100 of two adjacent first sub-pixels SP1 in the first direction X. The distance between the centers of the first openings 100 of two adjacent third sub-pixels SP3 in the second direction Y is substantially equal to that between the centers of the first openings 100 of two adjacent first sub-pixels SP1 in the second direction Y.

In the second display area AA2, the sub-pixels of the same color are uniformly arranged in the first direction X and the second direction Y. For example, the distance between the centers of the second openings 200 of two adjacent fourth sub-pixels SP4 in the first direction X is substantially equal to that between the centers of the second openings 200 of two adjacent fifth sub-pixels SP5 in the first direction X. The distance between the centers of the second openings 200 of two adjacent fourth sub-pixels SP4 in the second direction Y is substantially equal to that between the centers of the second openings 200 of two adjacent fifth sub-pixels SP5 in the second direction Y. The distance between the centers of the second openings 200 of two adjacent sixth sub-pixels SP6 in the first direction X is substantially equal to that between the centers of the second openings 200 of two adjacent fourth sub-pixels SP4 in the first direction X. The distance between the centers of the second openings 200 of two adjacent sixth sub-pixels SP6 in the second direction Y is substantially equal to that between the centers of the second openings 200 of two adjacent fourth sub-pixels SP4 in the second direction Y.

In the embodiments of the present disclosure, at least one first sub-pixel SP1 and at least one second sub-pixel SP2 of the first repeating unit P1 as well as at least one fourth sub-pixel SP4 and at least one fifth sub-pixel SP5 of the second repeating unit P2 are located in the same row.

In the first sub-pixel and the second sub-pixel of the first repeating unit as well as the fourth sub-pixel and the fifth sub-pixel of the second repeating unit located in the same row, the center of the first opening 100 of the first sub-pixel SP1, then center of the first opening 100 of the second sub-pixel SP2, the center of the second opening 200 of the fourth sub-pixel SP4 and the center of the second opening 200 of the fifth sub-pixel SP5 are substantially located on the same straight line extending parallel to the first direction X, that is, substantially located on the same horizontal line. In other words, a distance between the center of the first opening 100 of at least one of the first sub-pixels SP1 and a fifth straight line LN5 extending parallel to the first direction X in the second direction Y is not greater than 5 microns, a distance between the center of the first opening 100 of at least one of the second sub-pixels SP2 and the fifth straight line LN5 in the second direction Y is not greater than 5 microns, a distance between the center of the second opening 200 of at least one of the fourth sub-pixels SP4 and the fifth straight line LN5 in the second direction Y is not greater than 5 microns, and a distance between the center of the second opening 200 of at least one of the fifth sub-pixels SP5 and the fifth straight line LN5 in the second direction Y is not greater than 5 microns.

At least two third sub-pixels SP3 of the first repeating unit P1 and at least two sixth sub-pixels SP6 of the second repeating unit P2 are located in the same column.

In the third sub-pixel of the first repeating unit and the sixth sub-pixel of the second repeating unit located in the same row, the center of the first opening 100 of the third sub-pixel SP3 and the center of the second opening 200 of the sixth sub-pixel SP6 are substantially located on the same straight line extending parallel to the second direction Y, that is, substantially on the same vertical line. In other words, a distance between the center of the first opening 100 of at least one of the third sub-pixels SP3 and a sixth straight line LN6 extending parallel to the second direction Y in the first direction X is not greater than 5 microns, and a distance between the center of the second opening 200 of at least one of the sixth sub-pixels SP6 and the sixth straight line LN6 in the first direction X is not greater than 5 microns.

In the embodiments of the present disclosure, the second repeating unit P2 has a first pixel pitch PT1 and a second pixel pitch PT2. Referring to FIG. 10, the first pixel pitch PT1 is equal to a distance in the first direction X between the centers of the second openings 200 of two fourth sub-pixels SP4 respectively located in two adjacent second pixel units PU2, and the second pixel pitch PT2 is equal to a distance in the second direction Y between the centers of the second openings 200 of two fourth sub-pixels SP4 respectively located in two adjacent second pixel units PU2.

In a first repeating unit P1, the distance L1 between the centers of the first openings 100 of two adjacent first sub-pixels SP1 in the first direction X is 0.3 to 4 times the first pixel pitch PT1, such as 0.5 to 2 times, 1 to 4 times, 1.5 to 3 times, 1.5 to 2 times, or about 2 times the first pixel pitch PT1. The distance H1 between the centers of the first openings 100 of two adjacent first sub-pixels SP1 in the second direction Y is 1 to 4 times the second pixel pitch PT2.

In a first repeating unit P1, the distance between the centers of the first openings 100 of two adjacent second sub-pixels SP2 in the first direction X is 0.3 to 4 times the first pixel pitch PT1, such as 0.5 to 2 times, 1 to 4 times, 1.5 to 3 times, 1.5 to 2 times, or about 2 times the first pixel pitch PT1. The distance between the centers of the first openings 100 of two adjacent second sub-pixels SP2 in the second direction Y is 1 to 4 times the second pixel pitch PT2.

In a first repeating unit P1, the distance between the centers of the first openings 100 of two adjacent third sub-pixels SP3 in the first direction X is 0.3 to 4 times the first pixel pitch PT1, such as 0.5 to 2 times, 1 to 4 times, 1.5 to 3 times, 1.5 to 2 times, or about 2 times the first pixel pitch PT1. The distance between the centers of the first openings 100 of two adjacent third sub-pixels SP3 in the second direction Y is 1 to 4 times the second pixel pitch PT2.

For example, in a first repeating unit P1, the distance between the centers of the first openings 100 of two adjacent first sub-pixels SP1 in the first direction X is 1.5 to 2.5 times, for example, about 2 times the first pixel pitch PT1; the distance between the centers of the first openings 100 of two adjacent first sub-pixels SP1 in the second direction Y is 1.5 to 2.5 times, for example, about 2 times the second pixel pitch PT2. In a first repeating unit P1, the distance between the centers of the first openings 100 of two adjacent second sub-pixels SP2 in the first direction X is 1.5 to 2.5 times, for example, about 2 times the first pixel pitch PT1; the distance between the centers of the first openings 100 of two adjacent second sub-pixels SP2 in the second direction Y is 1.5 to 2.5 times, for example, about 2 times the second pixel pitch PT2. In a first repeating unit P1, the distance between the centers of the first openings 100 of two adjacent third sub-pixels SP3 in the first direction X is 1.5 to 2.5 times, for example, about 2 times the first pixel pitch PT1; the distance between the centers of the first openings 100 of two adjacent third sub-pixels SP3 in the second direction Y is 1.5 to 2.5 times, for example, about 2 times the second pixel pitch PT2. In this case, the pixel distribution density in the first display area AA1 is about one-fourth of that in the second display area AA2.

Through the above arrangement, in a case of increasing the light emitting area of the sub-pixels in the first display area AA1, a low-density distribution of the sub-pixels in the first display area AA1 may still be achieved, which is beneficial to improve the light transmittance in the first display area AA1.

At the junction of the first display area and the second display area located on both sides of the first display area in the first direction X, a shortest distance between the second opening 200 of a fourth sub-pixel and the first opening 100 of a third sub-pixel adjacent to the fourth sub-pixel is greater than or equal to half of the sum of the first gap threshold and the second gap threshold. As shown in FIG. 11A, at the junction of the first display area AA1 and the second display area AA2, a fourth sub-pixel SP4 has a first sidewall 140 close to the first display area AA1, and the first sidewall 140 extends obliquely with respect to the first direction X and the second direction Y. At the junction of the first display area and the second display area, the first opening 100 of the third sub-pixel SP3 close to the fourth sub-pixel SP4 has a first tangent face 310 parallel to the first sidewall 140. A vertical distance L3 between the first sidewall 140 and the first tangent face 310 is greater than or equal to half of the sum of the first gap threshold and the second gap threshold.

At the junction of the first display area and the second display area located on both sides of the first display area in the first direction X, a shortest distance between the second opening 200 of a fifth sub-pixel and the first opening 100 of a third sub-pixel adjacent to the fifth sub-pixel is greater than or equal to half of the sum of the first gap threshold and the second gap threshold. For example, at the junction of the first display area AA1 and the second display area AA2, a fifth sub-pixel SP5 has a second sidewall 150 close to the first display area AA1, and the second sidewall 150 extends obliquely with respect to the first direction X and the second direction Y. At the junction of the first display area AA1 and the second display area AA2, the first opening 100 of the third sub-pixel SP3 close to the fifth sub-pixel SP5 has a second tangent face 320 parallel to the second sidewall 150. A vertical distance L4 between the second sidewall 150 and the second tangent face 320 is greater than or equal to half of the sum of the first gap threshold and the second gap threshold.

For example, referring to FIG. 3 and FIG. 11A in combination, the second display area AA2 may include a first display sub-area AA21 and a second display sub-area AA22. The first display sub-area AA21 is located on both sides of the display area AA1 in the first direction X, the second display sub-area AA22 is located on at least one side of the first display area AA1 and the first display sub-area AA21 in the second direction Y, and both the first display area AA1 and the first display sub-area AA21 are connected to the second display sub-area AA22. For example, the second display sub-area AA22 is located on upper and lower sides of the first display area AA1 and the first display sub-area AA21 in the second direction Y, and the first display area AA1 and the first display sub-area AA21 are connected to the second display sub-area AA22 on upper and lower sides, respectively.

Referring to FIG. 11A, the second display sub-area AA22 includes at least a row of edge sub-pixels directly adjacent to a row of edge sub-pixels in the first display area AA1 and to a row of edge sub-pixels in the first display sub-area AA21. A shortest separation distance between the second opening 200 in the row of edge sub-pixels in the second display sub-area AA22 and the adjacent first opening 100 in the first display area AA1 in the second direction Y is greater than that between the second opening 200 of the row of edge sub-pixels in the second display sub-area AA22 and the adjacent second opening 200 in the first display sub-area AA21 in the second direction Y.

It should be noted that the expression "directly adjacent" here means that there are no other sub-pixel rows between the two rows of sub-pixels.

Figure 11B:
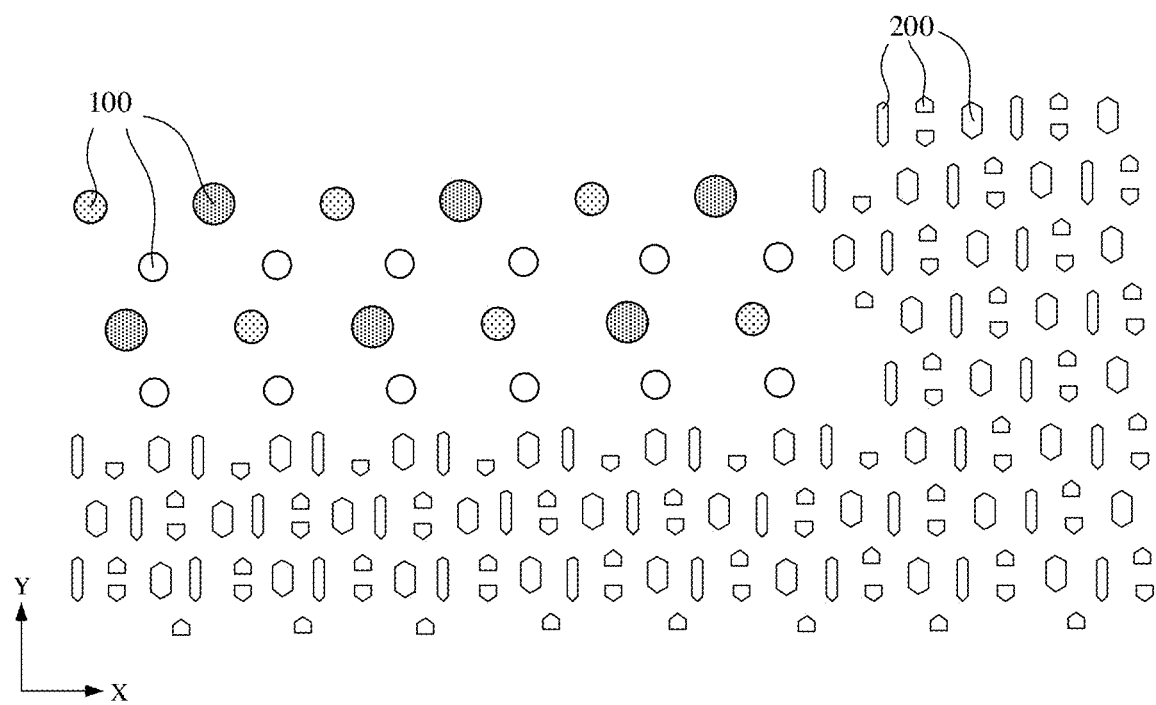
FIG. 11B shows an enlarged view of a display substrate according to other embodiments of the present disclosure at the partial region REG3 in FIG. 3.

FIG. 11B shows an enlarged view of the display substrate according to other embodiments of the present disclosure at the partial region REG3 in FIG. 3. For ease of illustration, FIG. 11B only shows the opening of the pixel defining layer corresponding to the sub-pixel to represent the distribution of the sub-pixel. Exemplarily, in FIG. 11B, a solid frame indicates the shape and position of the opening.

Referring to FIG. 6 and FIG. 11B in combination, in the second display area AA2, each of the orthographic projection of the second opening 200 of the fourth sub-pixel SP4 on the base substrate 1, the orthographic projection of the second opening 200 of the fifth sub-pixel SP5 on the base substrate 1 and the orthographic projection of the second opening 200 of the sixth sub-pixel SP6 on the base substrate 1 may be a polygon, for example, a hexagon, a pentagon, and the like.

In the first display area AA1, each of the orthographic projection of the first opening 100 of the first sub-pixel SP1 on the base substrate 1, the orthographic projection of the first opening 100 of the second sub-pixel SP2 on the base substrate 1 and the orthographic projection of the first opening 100 of the third sub-pixel SP3 on the base substrate 1 may be substantially a circle or an ellipse.

Similarly, the first opening 100 of each sub-pixel in the first repeating unit P1 has an area greater than that of the second opening 200 of the sub-pixel of the same color in the second repeating unit P2. Specifically, an orthographic projection of the first opening 100 of the first sub-pixel SP1 on the base substrate 1 has an area greater than that of an orthographic projection of the second opening 200 of the fourth sub-pixel SP4 on the base substrate 1. An orthographic projection of the first opening 100 of the second sub-pixel SP2 on the base substrate 1 has an area greater than that of an orthographic projection of the second opening 200 of the fifth sub-pixel SP5 on the base substrate 1. An orthographic projection of the first opening 100 of the third sub-pixel SP3 on the base substrate 1 has an area greater than that of an orthographic projection of the second opening 200 of the sixth sub-pixel SP6 on the base substrate 1.

For example, the first repeating unit P2 may include at least two first pixel units PU1 (two first pixel units PU1 are shown in FIG. 11B). Each first pixel unit PU1 includes four sub-pixels, including one first sub-pixel SP1, one second sub-pixel SP2, and two third sub-pixels SP3. In a first repeating unit P1, a plurality of sub-pixels are arranged in four rows and four columns. In a first row, a second sub-pixel SP2 and a first sub-pixel SP1 are arranged in a first column and a third column, respectively. In a second row, two third sub-pixels SP3 are arranged in a second column and a fourth column, respectively. In a third row, a first sub-pixel SP1 and a second sub-pixel SP2 are arranged in the first column and the third column, respectively. In a fourth row, two third sub-pixels SP3 are arranged in the second column and the fourth column, respectively. That is, in the first display area AA1, the first sub-pixels SP1 and the second sub-pixels SP2 of the plurality of first pixel units PU1 are alternately distributed in the first direction X and the second direction Y, and the third sub-pixels SP3 of the plurality of first pixel units PU1 are arranged in an array in the first direction X and the second direction Y.

Similarly, in a first repeating unit P1, the distance between the centers of the first openings 100 of two adjacent first sub-pixels SP1 in the first direction X is 0.3 to 4 times the first pixel pitch PT1, such as 0.5 to 2 times, 1 to 4 times, 1.5 to 3 times, 1.5 to 2 times, or about 2 times the first pixel pitch PT1. The distance H1 between the centers of the first openings 100 of two adjacent first sub-pixels SP1 in the second direction Y is 1 to 4 times the second pixel pitch PT2.

In a first repeating unit P1, the distance between the centers of the first openings 100 of two adjacent second sub-pixels SP2 in the first direction X is 0.3 to 4 times the first pixel pitch PT1, such as 0.5 to 2 times, 1 to 4 times, 1.5 to 3 times, 1.5 to 2 times, or about 2 times the first pixel pitch PT1. The distance between the centers of the first openings 100 of two adjacent second sub-pixels SP2 in the second direction Y is 1 to 4 times the second pixel pitch PT2.

Figure 12:
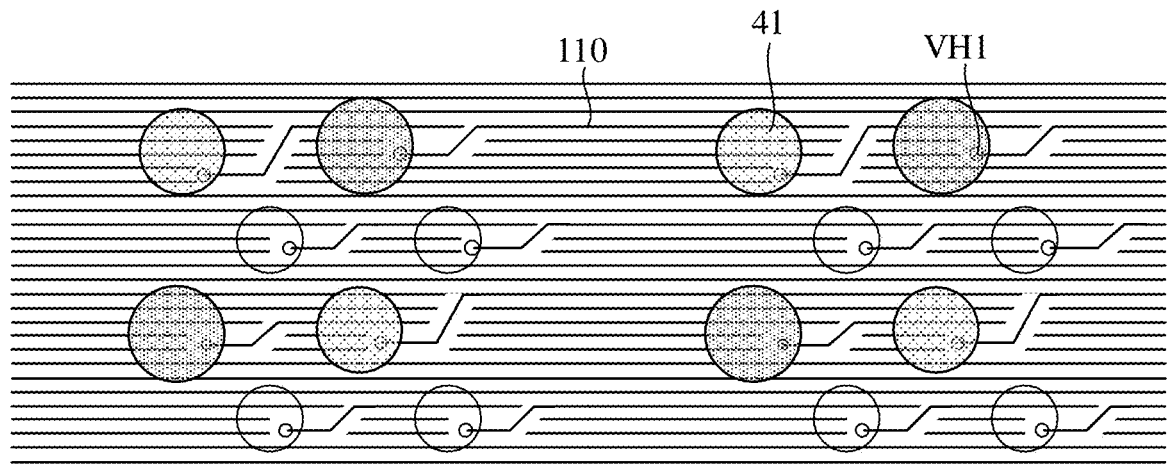
FIG. 12 shows an enlarged view of a partial region REG1' in FIG. 3, in which wires for electrically connecting the sub-pixels in the first display area to the respective pixel driving circuits are schematically shown.
Figure 13:
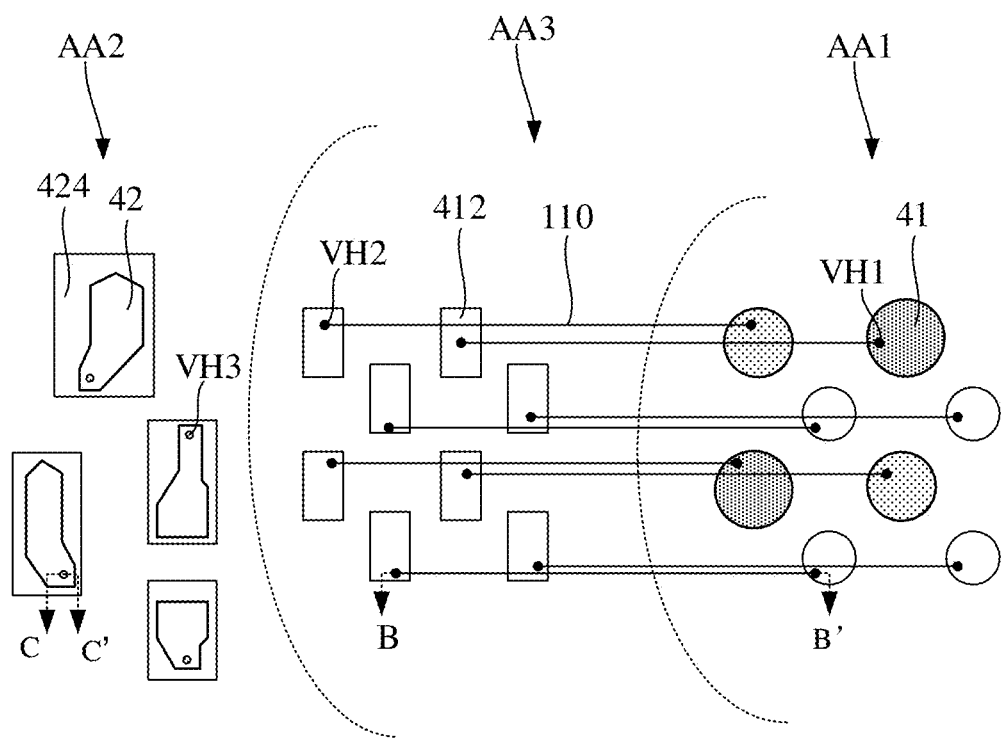
FIG. 13 shows an enlarged view of the partial region REG3 in FIG. 3, in which only an enlarged view of a region including a first pixel driving circuit, a first light emitting device, a second pixel driving circuit and a second light emitting device is shown.

FIG. 12 shows an enlarged view of a partial region REG1' in FIG. 3, in which wires for electrically connecting each sub-pixel in the first display area to a respective pixel driving circuit are schematically shown. FIG. 13 shows an enlarged view of the partial region REG3 in FIG. 3, in which only an enlarged view of a region including a first pixel driving circuit, a first light emitting device, a second pixel driving circuit and a second light emitting device is shown. It should be noted that, in order to clearly reflect the connection between the first pixel driving circuit and the first light emitting device, FIG. 13 shows that adjacent first pixel driving circuit and first light emitting device are connected to each other. However, according to FIG. 3, FIG. 12 and FIG. 13, it may be understood that other first light emitting devices not shown may be further provided on a left side of the first light emitting device in FIG. 13, and other first pixel driving circuit not shown may be further provided on a right side of the first pixel driving circuit.

It should be noted that herein, for the convenience of description, a light emitting device located in the first display area AA1 is referred to as a first light emitting device, and accordingly, a circuit for driving the first light emitting device to emit light is referred to as a first pixel driving circuit; a light emitting device located in the second display area AA2 is referred to as a second light emitting device, and accordingly, a circuit for driving the second light emitting device to emit light is referred to as a second pixel driving circuit.

For example, as shown in FIG. 13, the third display area AA3 includes at least one (for example, a plurality of) first pixel driving circuits 412. For example, first light emitting devices 41 are electrically connected to first pixel driving circuits 412 in a one-to-one correspondence, and the plurality of first pixel driving circuits 412 are used to drive the plurality of first light emitting devices 41 in a one-to-one correspondence. For example, a rectangular frame shown in FIG. 13 (a black frame and white filled area indicated by reference numeral 412) represents the first pixel driving circuit 412. For example, the first pixel driving circuits 412 are configured to drive the plurality of first light emitting devices 41 to emit light in a one-to-one correspondence. That is, one first pixel driving circuit 412 may drive one corresponding first light emitting device 41, and different first pixel driving circuits 412 may drive different first light emitting devices 41.

In the embodiments of the present disclosure, the pixel driving circuits for driving the sub-pixels in the first display area AA1 are not located in the first display area AA1, but are provided in the third display area AA3. For example, the anode structure of the first light emitting device 41 is electrically connected to a first end of a first connection line 110 through a via hole. An orthographic projection of the first light emitting device 41 on the base substrate 1 is spaced apart from an orthographic projection of the first pixel driving circuit 412 on the base substrate 1. In this way, the coverage area of the metal or opaque patterns in the first display area AA1 may be reduced, and the light transmittance of the first display area AA1 may be increased, so that the light transmittance of the first display area AA1 is greater than that of the second display area AA2.

For example, as shown in FIG. 13, the display substrate further includes a plurality of first connection lines 110 arranged on the base substrate 1. The first connection line 110 includes a first end located in the first display area 11 and a second end located in the third display area AA3, that is, the first connection line 110 extends from the first display area 11 to the third display area AA3.

The first end of the first connection line 110 is electrically connected to the anode structure of the first light emitting device 41 of one sub-pixel, and the second end of the first connection line 110 is electrically connected to the first pixel driving circuit 412. The first connection line 110 is configured to transmit an electrical signal provided by the first pixel driving circuit 412 to the anode structure of the first light emitting device 41, so as to drive the first light emitting device 41 to emit light.

As shown in FIG. 13, the second display area AA2 further includes at least one (for example, a plurality of) second light emitting devices 42 and at least one (for example, a plurality of) second pixel driving circuits 424. The second light emitting devices 42 are electrically connected to the second pixel driving circuits 424 in a one-to-one correspondence, and the second pixel driving circuits 424 are used to drive the second light emitting devices 42 to emit light.

It should be noted that, in FIG. 13, rectangular boxes indicated by reference numerals 412 and 424 are only used to show approximate positions of the first pixel driving circuit 412 and the second pixel driving circuit 424, and do not indicate their specific shapes and specific boundaries.

In the embodiments of the present disclosure, the pixel driving circuits for driving the sub-pixels in the second display area AA2 are located in the second display area AA2. For example, an orthographic projection of the second light emitting device 42 on the base substrate 1 at least partially overlaps an orthographic projection of the second pixel driving circuit 424 on the base substrate 1. In this way, it is advantageous to electrically connect the light emitting devices 42 located in the second display area AA2 and the corresponding second pixel driving circuits 424.

Figure 14:
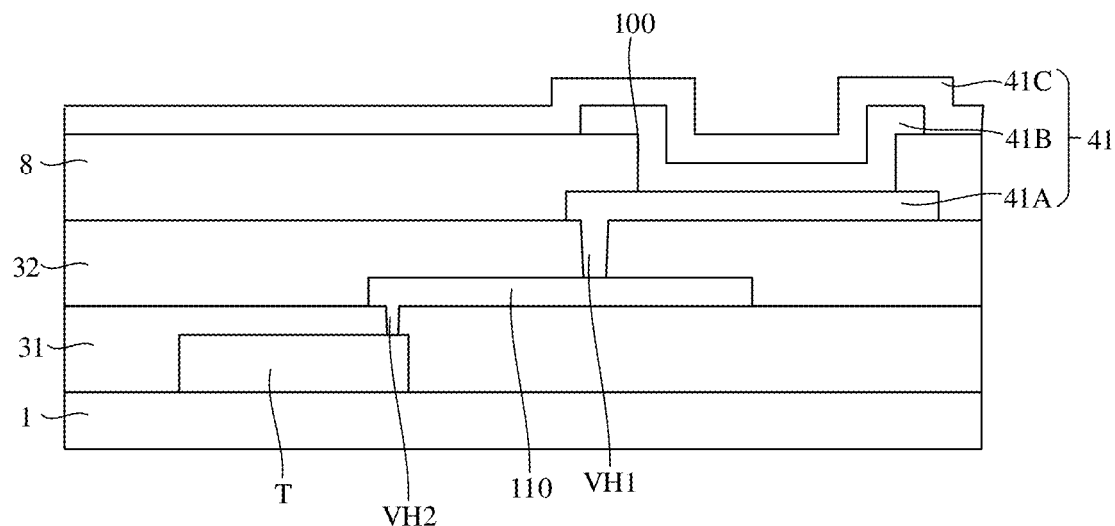
FIG. 14 shows a schematic cross-sectional view taken along line BB' in FIG. 13.

FIG. 14 shows a schematic cross-sectional view taken along line BB' in FIG. 13. Referring to FIG. 14, the display substrate 10 includes pixel driving circuit structure layers sequentially stacked on the base substrate 1. The pixel driving circuit structure layer may include a thin film transistor T, an insulating layer 31, the first connection line 110, a planarization layer 32 and the first light emitting device 41. The first light emitting device 41 includes an anode structure 41A, a cathode structure 41C, and a light emitting structure 41B located between the anode structure 41A and the cathode structure 41C. The anode structure 41A of the first light emitting device 41 is electrically connected to the first connection line 110 through a first via hole VH1 penetrating the planarization layer 32. The pixel driving circuit structure layer may include a semiconductor layer, a first insulating layer, a first gate layer, a second insulating layer, a second gate layer, an interlayer insulating layer, a source/drain metal layer, and the like. In some embodiments, the pixel driving circuit may include seven thin film transistors (for example, a driving transistor, a data writing transistor, a compensation transistor, a reset transistor, a light emission control transistor, etc.), and a storage capacitor. At least one thin film transistor, such as the light emission control transistor, is directly connected to the light emitting device. FIG. 14 only schematically shows a thin film transistor T (for example, a light emission control transistor). The thin film transistor T includes at least an active layer located in the semiconductor layer, a source contact part, a drain contact part, a gate electrode located in the first gate layer, and a source electrode and a drain electrode located in the source/drain metal layer. The first connection line 110 in FIG. 14 may be, for example, electrically connected to the drain electrode of the light emission control transistor located in the source/drain metal layer.

It should be noted that herein, unless otherwise specified, "via hole" is used to electrically connect components located in different conductive layers. In the embodiments of the present disclosure, "via hole" may also take other alternative forms. For example, the via hole may be replaced by a "groove" for electrically connecting components located in different conductive layers.

For example, the anode structure 41A may contain a transparent conductive material such as ITO, and the specific material of the anode structure 41A is not limited in the embodiments of the present disclosure. For example, the cathode structure 41C may be a structure formed on the entire surface of the display substrate 10 (for example, at least completely covering the entire display area), and the cathode structure 41C may contain lithium (Li), aluminum (Al), magnesium (Mg), silver (Ag) and other metal materials. For example, since the cathode structure 41C may be formed as a very thin layer, it has good light transmittance.

Referring to FIG. 12, a plurality of first connection lines 110 are provided in the first display area AA1. For example, each first connection line 110 extends in the first direction X. At least some of the plurality of first connection lines 110 are dummy lines, which are shown as disconnected connection lines in FIG. 12, and which are not electrically connected to any light emitting device.

For example, the first connection line 110 may contain a transparent conductive material such as ITO. In this way, the first connection line 110 may also have good light transmittance.

Figure 15:
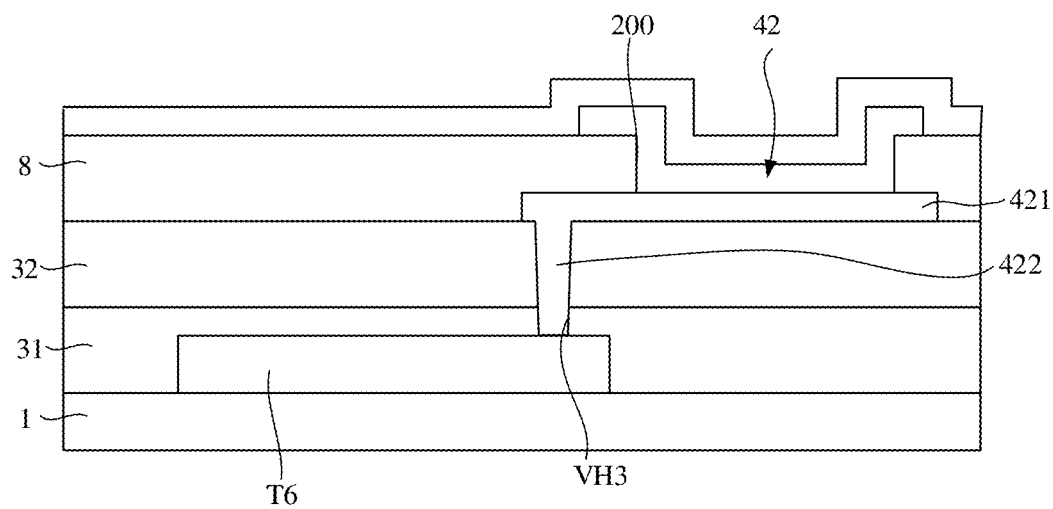
FIG. 15 shows a schematic cross-sectional view taken along line CC' in FIG. 13.

FIG. 15 shows a schematic cross-sectional view taken along line CC' in FIG. 13. Referring to FIG. 13 to FIG. 15 in combination, the display substrate 10 may further include a pixel defining layer 8. For example, the pixel defining layer 8 may include a plurality of first openings 100 and a plurality of second openings 200. The plurality of first openings 100 are located in the first display area AA1, and each first opening 100 exposes a part of the anode structure of the first light emitting device 41. The plurality of second openings 200 are located in the second display area AA2, and each second opening 200 exposes a part of the anode structure of the second light emitting device 42A, for example, at least a part of an anode body 421 of the second light emitting device 42.

The anode structure of the second light emitting device 42 includes the anode body 421 and an anode connection part 422, and at least a part of the anode connection part 422 has a thickness different from that of the anode body 421.

At a via hole VH3, the anode connection part 422 of the second light emitting device 42 is connected to the source electrode or the drain electrode of the thin film transistor below (described in more detail below), so at least a part of the anode connection part 422 has a thickness greater than that of the anode body 421.

Figure 16:
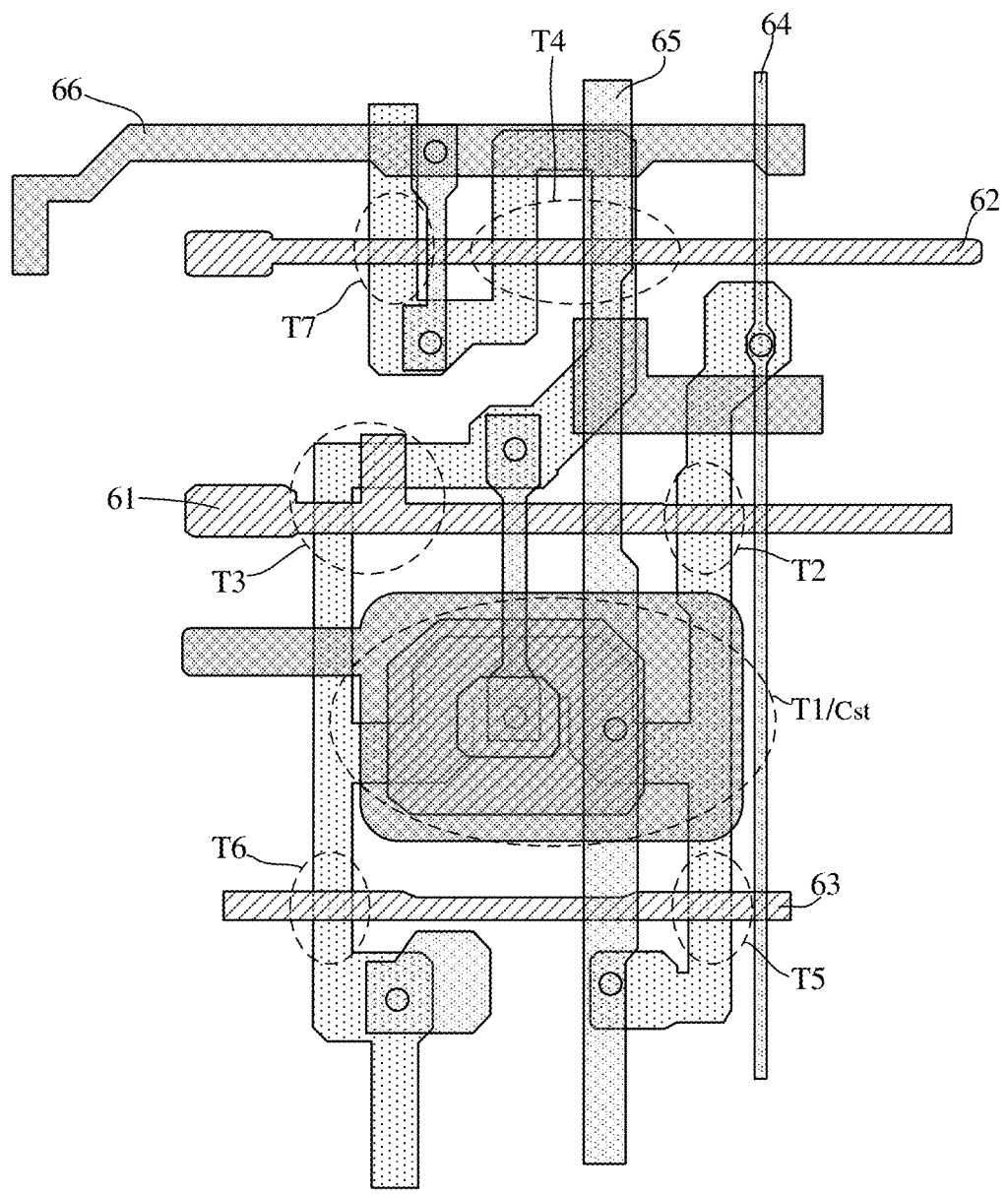
FIG. 16 shows a schematic plan view of a pixel driving circuit of a display substrate according to some exemplary embodiments of the present disclosure.
Figure 17:
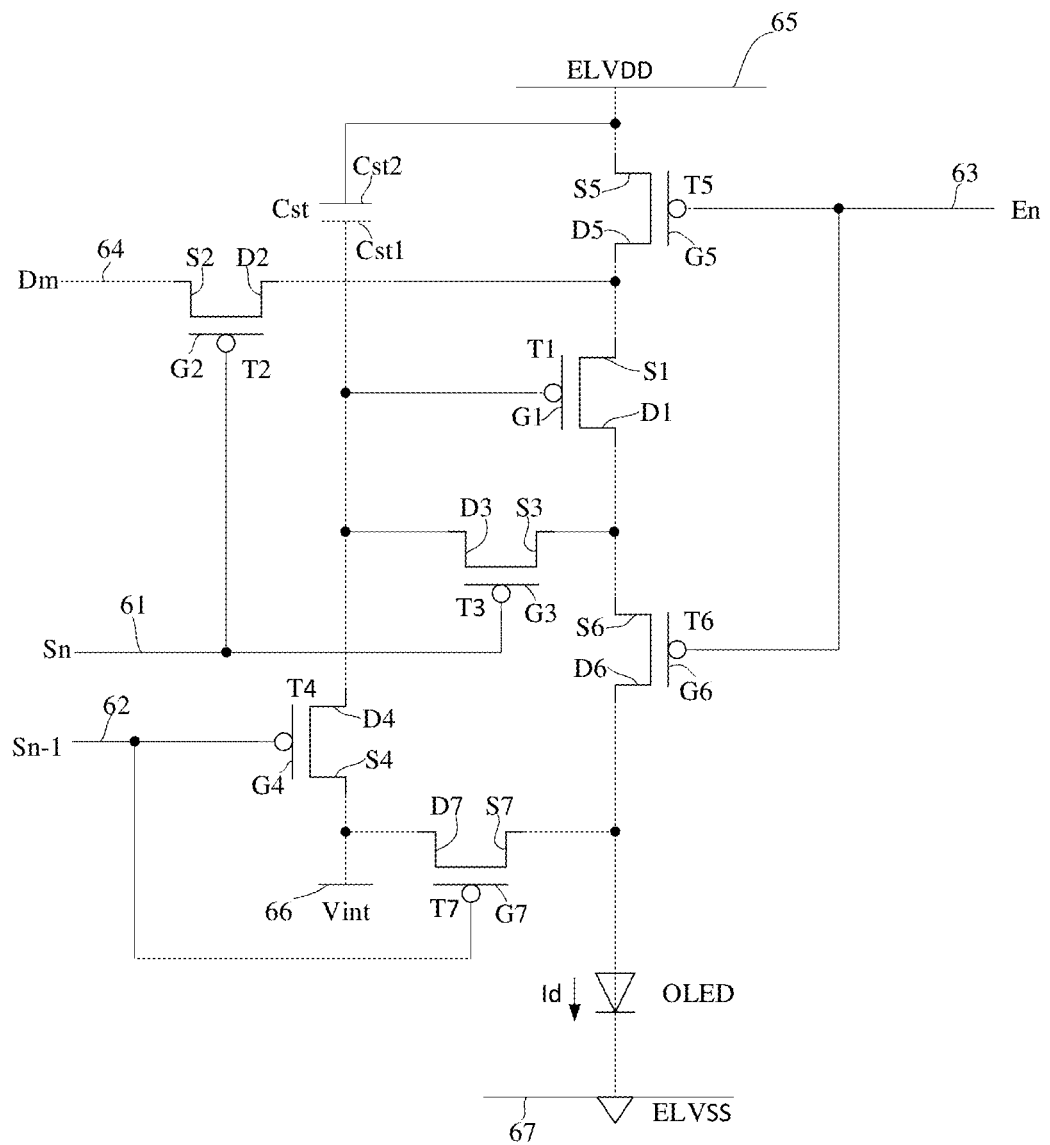
FIG. 17 shows an equivalent circuit diagram of a pixel driving circuit of a display substrate according to some exemplary embodiments of the present disclosure.

FIG. 16 shows a schematic plan view of a pixel driving circuit of a display substrate according to some exemplary embodiments of the present disclosure. FIG. 17 shows an equivalent circuit diagram of a pixel driving circuit of a display substrate according to some exemplary embodiments of the present disclosure.

Hereinafter, a 7T1C pixel driving circuit is illustrated by way of example in describing a structure of the pixel driving circuit in detail. However, the embodiments of the present disclosure are not limited to the 7T1C pixel driving circuit. In the case of no conflict, any other known pixel driving circuit structures may be applied to the embodiments of the present disclosure.

As shown in FIG. 16 and FIG. 17, the pixel driving circuit may include a plurality of thin film transistors and a storage capacitor Cst. The pixel driving circuit is used to drive the organic light emitting diode (that is, OLED). The plurality of thin film transistors include a first transistor T1, a second transistor T2, a third transistor T3, a fourth transistor T4, a fifth transistor T5, a sixth transistor T6, and a seventh transistor T7. Each transistor includes a gate electrode, a source electrode, and a drain electrode.

The display substrate may further include a plurality of signal lines. For example, the plurality of signal lines include: a scan signal line 61 for transmitting a scan signal Sn, a reset signal line 62 for transmitting a reset control signal RESET (that is, a scan signal of a previous line), a light emission control line 63 for transmitting a light emission control signal En, a data line 64 for transmitting a data signal Dm, a driving voltage line 65 for transmitting a driving voltage VDD, an initialization voltage signal 66 for transmitting an initialization voltage Vint, and a power line 67 for transmitting a VSS voltage.

The first transistor T1 has a gate electrode G1 electrically connected to one end Cst1 of the storage capacitor Cst, a source electrode S1 electrically connected to the driving voltage line 65 through the fifth transistor T5, and a drain electrode D1 electrically connected to the anode electrode of the OLED through the sixth transistor T6. The first transistor T1 may receive the data signal Dm according to a switching operation of the second transistor T2 so as to supply a driving current Id to the OLED.

The second transistor T2 has a gate electrode G2 electrically connected to the scan signal line 61, a source electrode S2 electrically connected to the data line 64, and a drain electrode D2 electrically connected to the driving voltage line 65 through the fifth transistor T5 and also electrically connected to the source electrode S1 of the first transistor T1. The second transistor T4 may be turned on according to the scan signal Sn transmitted through the scan signal line 61, so that a switching operation is performed to transmit the data signal Dm transmitted to the data line 64 to the source electrode S1 of the first transistor T1.

The third transistor T3 has a gate electrode G3 electrically connected to the scan signal line 61, a source electrode S3 electrically connected to the anode electrode of the OLED via the sixth transistor T6 and also electrically connected to the drain electrode D1 of the first transistor T1, and a drain electrode D3 electrically connected to the end Cst1 of the storage capacitor Cst (that is, a first capacitor electrode), the drain electrode D4 of the fourth transistor T4 and the gate electrode G1 of the first transistor T1. The third transistor T3 may be turned on according to the scan signal Sn transmitted through the scan signal line 61 so as to electrically connect the gate electrode G1 and the drain electrode D1 of the first transistor T1, so that a diode connection of the first transistor T1 is achieved.

The fourth transistor T4 has a gate electrode G4 electrically connected to the reset control signal line 62, a source electrode S4 electrically connected to the initialization voltage line 66, and a drain electrode D4 electrically connected to the end Cst1 of the storage capacitor Cst, the drain electrode D3 of the third transistor T3 and the gate electrode G1 of the first transistor T1. The fourth transistor T4 may be turned on according to the reset control signal Sn-1 transmitted through the reset control signal line 62 so as to transmit the initialization voltage Vint to the gate electrode G1 of the first transistor T1, so that an initialization operation is performed to initialize the voltage of the gate electrode G1 of the first transistor T1.

The fifth transistor T5 has a gate electrode G5 electrically connected to the light emission control line 63, a source electrode S5 electrically connected to the driving voltage line 65, and a drain electrode D5 electrically connected to the source electrode S1 of the first transistor T1 and the drain electrode D2 of the second transistor T2.

The sixth transistor T6 has a gate electrode G6 electrically connected to the light emission control line 63, a source electrode S6 electrically connected to the drain electrode D1 of the first transistor D1 and also electrically connected to the source electrode S3 of the third transistor T3, and a drain electrode D6 electrically connected to the anode electrode of the OLED. The fifth transistor T5 and the sixth transistor T6 may be turned on concurrently (for example, simultaneously) according to the light emission control signal En transmitted through the light emission control line 63 so as to transmit the driving voltage ELVDD to the OLED, thereby allowing the driving current Id to flow into the OLED.

The seventh transistor T7 includes a gate electrode G7 connected to the reset control signal line 62, a source electrode S7 connected to the drain electrode D6 of the sixth transistor T6 and the anode electrode of the OLED, and a drain electrode D7 connected to the initialization voltage line 66. The seventh transistor T7 may transmit the reset control signal Sn-1 from the reset control signal line 62 to the gate electrode G7.

The other end Cst2 of the storage capacitor Cst is electrically connected to the driving voltage line 65, and the cathode electrode of the OLED is electrically connected to the power line 67 to receive the common voltage ELVSS. Accordingly, the OLED may receive the driving current Id from the first transistor T1 to emit light, so as to display an image.

It should be noted that in FIG. 17, each of the thin film transistors T1, T2, T3, T4, T5, T6 and T7 is a p-channel field effect transistor. However, the embodiments of the present disclosure are not limited thereto. At least some of the thin film transistors T1, T2, T3, T4, T5, T6 and T7 may be n-channel field effect transistors.

In operation, in an initialization stage, the reset control signal Sn-1 having a low level is supplied through the reset control signal line 62. Subsequently, the initialization thin film transistor T4 may be turned on based on the low level of the reset control signal Sn-18, and the initialization voltage Vint from the initialization voltage line 66 is transmitted to the gate electrode G1 of the driving thin film transistor T1 through the initialization thin film transistor T4. In this way, the driving thin film transistor T1 may be initialized due to the initialization voltage Vint.

In a data programming stage, the scan signal Sn having a low level is supplied through the scan signal line 61. Subsequently, the switch thin film transistor T2 and the compensation thin film transistor T3 may be turned on based on the low level of the scan signal Sn. In this way, the driving thin film transistor T1 may be placed in a diode-connected state by the compensation thin film transistor T3 turned-on and is biased in a forward direction.

Subsequently, a compensation voltage Dm+Vth (for example, Vth is a negative value) obtained by subtracting the threshold voltage Vth of the driving thin film transistor T1 from the data signal Dm supplied via the data line 64 is applied to the gate electrode G1 of the driving thin film transistor T1. Next, the driving voltage VDD and the compensation voltage Dm+Vth are applied to both ends of the storage capacitor Cst, so that an electric charge corresponding to a voltage difference between the ends is stored in the storage capacitor Cst.

In a light emission stage, the light emission control signal En from the light emission control line 63 changes from a high level to a low level. Subsequently, in the light emission stage, the first light emission control thin film transistor T5 and the second light emission control thin film transistor T6 may be turned on based on the low level of the light emission control signal En.

Next, a driving current is generated based on a difference between the voltage of the gate electrode G1 of the driving thin film transistor T1 and the driving voltage ELVDD. The driving current Id corresponding to the difference between the driving current and a bypass current is supplied to the OLED through the second light emission control thin film transistor T6.

In the light emission stage, based on a current-voltage relationship of the driving thin film transistor T1, a gate-source voltage of the driving thin film transistor T1 is maintained at (Dm+Vth)-ELVDD due to the storage capacitor Cst. The driving current Id is proportional to $(Dm-ELVDD)^2$. Therefore, the driving current Id may not be affected by a variation of the threshold voltage Vth of the driving thin film transistor T1.

For example, referring to FIG. 10 to FIG. 17 in combination, the first pixel driving circuit 412 described above may be implemented as a circuit shown in FIG. 16 and FIG. 17. In this case, the second end of the first connection line 110 may be electrically connected to the first pixel driving circuit 412 through a via hole VH2.

For example, the second pixel driving circuit 424 described above may be implemented as the circuit shown in FIG. 16 and FIG. 17. In this case, the orthographic projection of the anode structure of the sub-pixel located in the second display area AA2 on the base substrate 1 may cover the orthographic projection of the via hole VH3 (as shown in FIG. 15) on the base substrate 1. In this way, the anode structure of the sub-pixel located in the second display area AA2 is electrically connected to the second pixel driving circuit 424 through the via hole VH3.

For example, in the various embodiments of the present disclosure, the base substrate 1 may be a glass substrate, a quartz substrate, a metal substrate, or a resin substrate, etc., and may be a rigid substrate or a flexible substrate, which is not limited in the embodiments of the present disclosure.

Figure 18A:
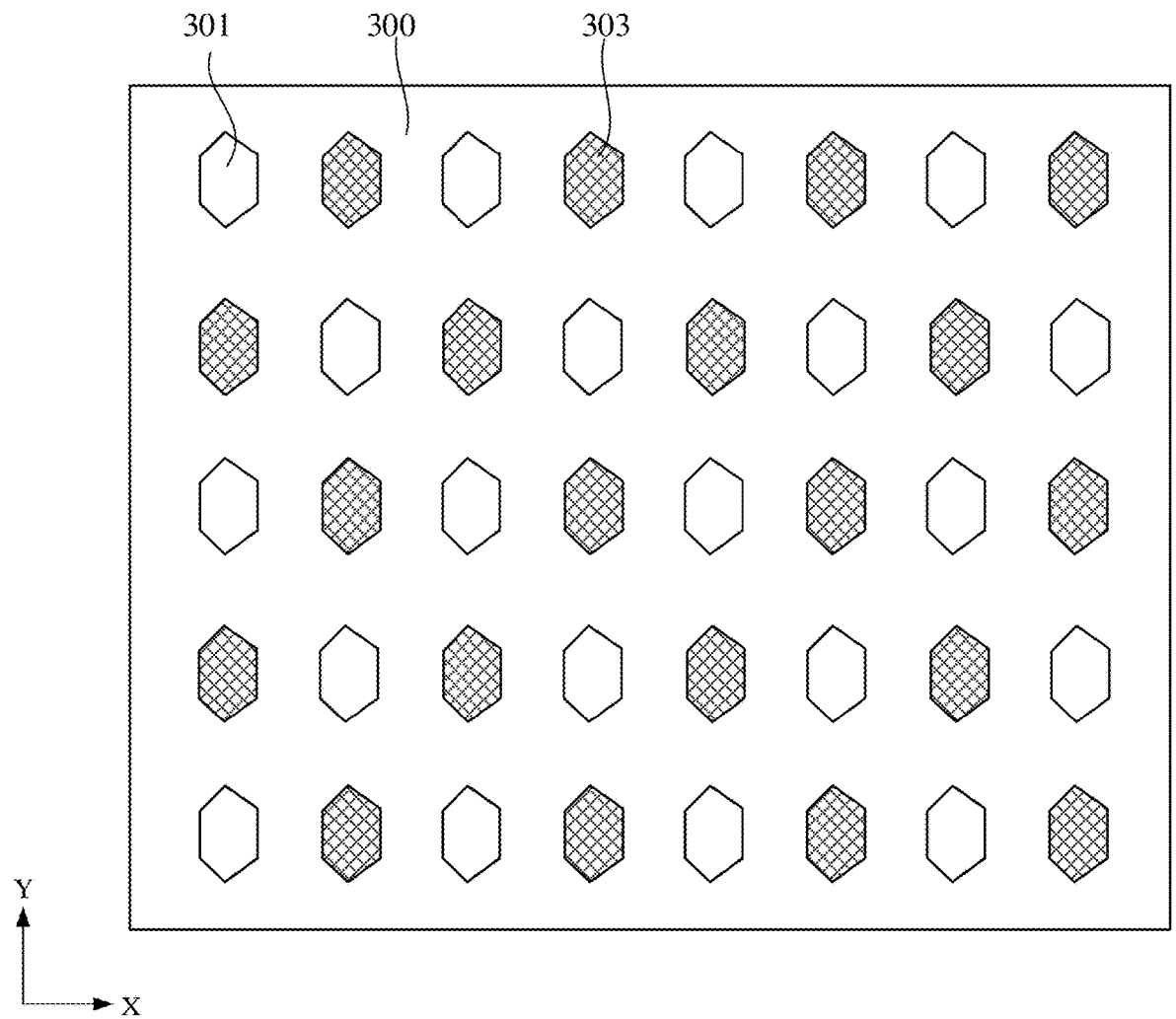
FIG. 18A, FIG. 18B, FIG. 19A, FIG. 19B, FIG. 20A and FIG. 20B are schematic plan views of masks according to some exemplary embodiments of the present disclosure, in which a first mask area for forming each sub-pixel in the first display area is schematically shown in FIG. 18A, FIG. 19A and FIG. 20A, and a transition area between the first mask area and a second mask area for forming each sub-pixel in the second display area is schematically shown in FIG. 18B, FIG. 19B and FIG. 20B.
Figure 18B:
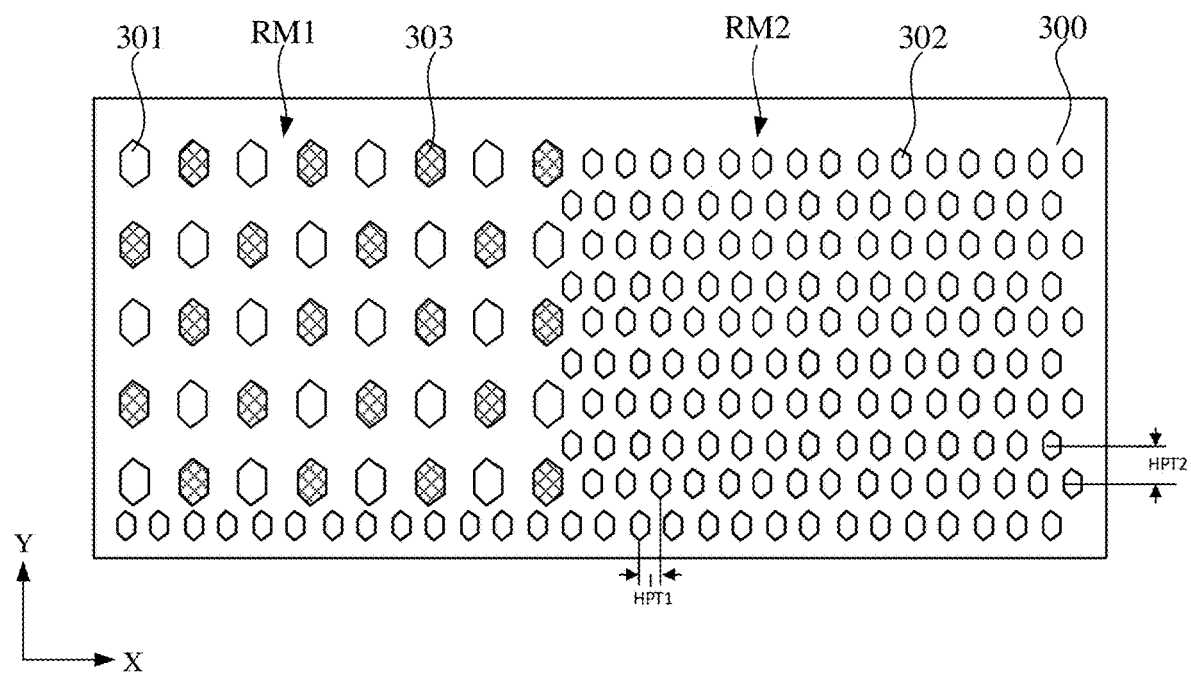

FIG. 18A and FIG. 18B show schematic plan views of masks according to some exemplary embodiments of the present disclosure, in which a first mask area for forming the sub-pixels in the first display area is schematically shown in FIG. 18A, and a transition area between the first mask area and a second mask area for forming the sub-pixels in the second display area is schematically shown in FIG. 18B. For example, the mask shown in FIG. 18A and FIG. 18B may be used to form the first sub-pixel and the fourth sub-pixel, that is, the red sub-pixels.

In the embodiments of the present disclosure, the mask includes at least two mask areas. For example, the mask may include a first mask area RM1 and a second mask area RM2. The first mask area RM1 may correspond to the first display area AA1, and the second mask area RM2 may correspond to the second display area AA2.

The mask may include a mask body 300 as well as a plurality of first apertures 301 and a plurality of second apertures 302 provided in the mask body 300. The plurality of first apertures 301 are arranged in the mask body 300 in an array in the first direction X and the second direction Y, and are located in the first mask area RM1. The plurality of second apertures 302 are arranged in the mask body 300 in an array in the first direction X and the second direction Y, and are located in the second mask area RM2.

The plurality of first apertures 301 correspond to the first sub-pixels to be formed. For example, the plurality of first apertures 301 correspond to the first openings 100 of the first sub-pixels to be formed. That is, when the first sub-pixel and the fourth sub-pixel are formed by using the mask, the first aperture 301 of the mask forms the first opening 100 of the first sub-pixel in the corresponding area on the array substrate.

The plurality of second apertures 302 correspond to the fourth sub-pixels to be formed. For example, the plurality of second apertures 302 correspond to the second openings 200 of the fourth sub-pixels to be formed. That is, when the first sub-pixel and the fourth sub-pixel are formed by using the mask, the second aperture 302 of the mask forms the second opening 200 of the fifth sub-pixel in the corresponding area on the array substrate.

For example, an orthographic projection of the first aperture 301 on the mask body 300 has an area greater than that of an orthographic projection of the second aperture 302 on the mask body 300. For example, the area of the orthographic projection of the first aperture 301 on the mask body 300 is 1.2 to 5 times that of the orthographic projection of the second aperture 302 on the mask body 300.

In the embodiments of the present disclosure, the mask may further include a plurality of through holes 303 provided in the mask body 300. The plurality of through holes 303 are arranged in the mask body 300 in an array in the first direction X and the second direction Y, and are located in the first mask area RM1. In the first mask area RM1, the plurality of first apertures 301 and the plurality of through holes 303 are alternately distributed in the first direction X and the second direction Y.

At least one first aperture 301 and at least one second aperture 302 are located in the same row. In the first aperture 301 and the second aperture 302 located in the same row, a center of the first aperture 301 and a center of the second aperture 302 are substantially located on the same straight line extending parallel to the first direction X.

At least one first aperture 301 and at least one through hole 303 are located in the same row. In the first aperture 301 and the through hole 303 located in the same row, the center of the first aperture 301 and a center of the through hole 303 are substantially located on the same straight line extending parallel to the first direction X.

At least one first aperture 301 and at least one through hole 303 are located in the same column. In the first aperture 301 and the through hole 303 located in the same column, the center of the first aperture 301 and the center of the through hole 303 are substantially located on the same straight line extending parallel to the second direction Y.

The second aperture 302 has a first aperture pitch HPT1 and a second aperture pitch HPT2. The first aperture pitch HPT1 is equal to a distance between the centers of two adjacent second apertures 302 in the first direction X, and the second aperture pitch HPT2 is equal to a distance between the centers of two adjacent second apertures 302 in the second direction Y.

The distance between the centers of two adjacent first apertures 301 in the first direction X is 0.6 to 8 times, or 2 to 6 times, for example, about 4 times the first aperture pitch HPT1. The distance between the centers of two adjacent first apertures 301 in the second direction Y is 0.6 to 8 times, or 2 to 6 times, for example, about 4 times the second aperture pitch HPT2.

The distance between the centers of the adjacent first aperture 301 and through hole 303 in the first direction X is 0.3 to 4 times the first aperture pitch HPT1, such as 0.5 to 2 times, 1 to 4 times, 1.5 to 3 times, 1.5 to 2 times, 1.5 to 2.5 times, for example about 2 times the first aperture pitch HPT1. The distance between the centers of the adjacent first aperture 301 and through hole 303 in the second direction Y is 0.3 to 4 times the second aperture pitch HPT2, such as 0.5 to 2 times, 1 to 4 times, 1.5 to 3 times, 1.5 to 2 times, 1.5 to 2.5 times, for example about 2 times the second aperture pitch HPT2.

In the mask provided by the embodiments of the present disclosure, with the design of through holes, a stress distribution on the mask may be more uniform, so that the problem of color mixing between sub-pixels manufactured by using the mask may be avoided.

Figure 19A:
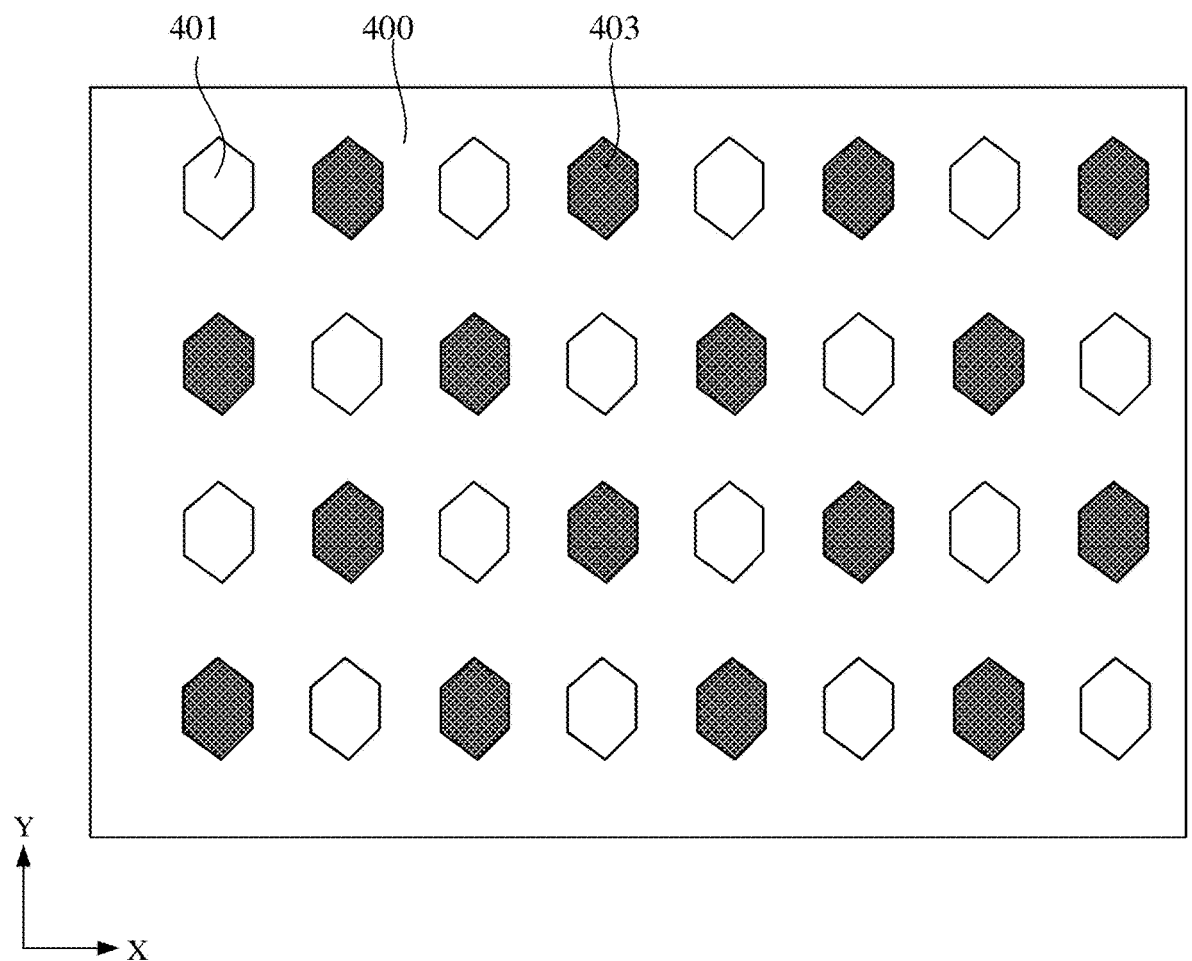
Figure 19B:
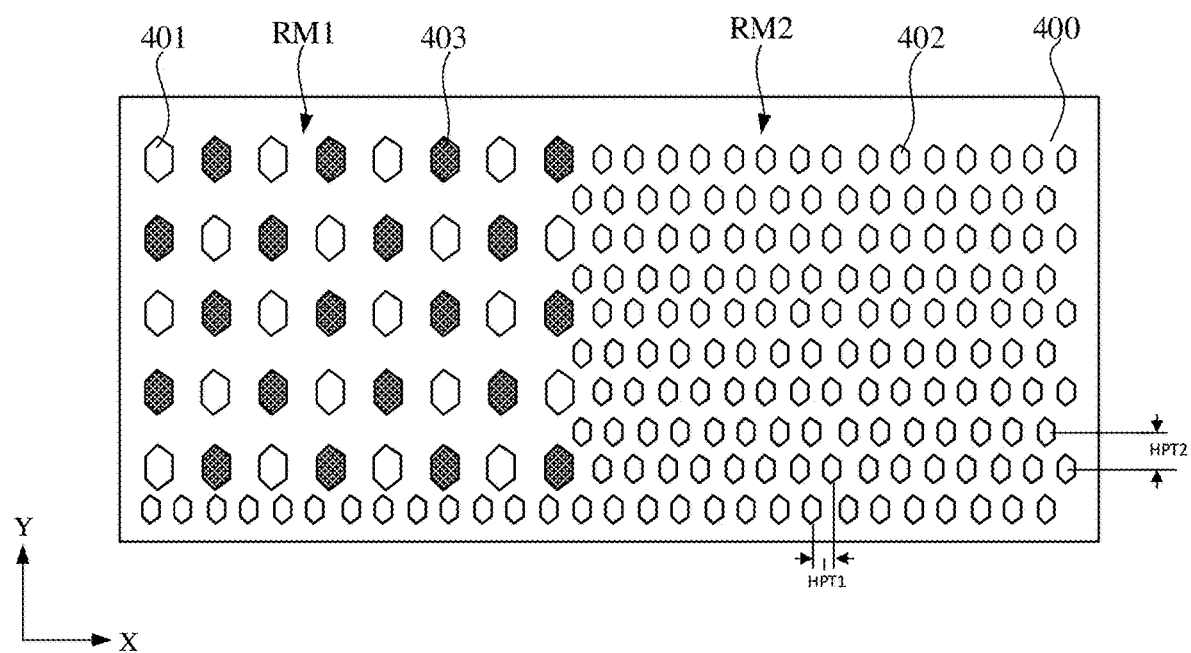

FIG. 19A and FIG. 19B show schematic plan views of masks according to some exemplary embodiments of the present disclosure, in which a first mask area for forming the sub-pixels in the first display area is schematically shown in FIG. 19A, and a transition area between the first mask area and a second mask area for forming the sub-pixels in the second display area is schematically shown in FIG. 19B. For example, the mask shown in FIG. 19A and FIG. 19B may be used to form the second sub-pixel and the fifth sub-pixel, that is, the blue sub-pixels.

In the embodiments of the present disclosure, the mask includes at least two mask areas. For example, the mask may include a first mask area RM1 and a second mask area RM2. The first mask area RM1 may correspond to the first display area AA1, and the second mask area RM2 may correspond to the second display area AA2.

The mask may include a mask body 400 as well as a plurality of first apertures 401 and a plurality of second apertures 402 provided in the mask body 400. The plurality of first apertures 401 are arranged in the mask body 400 in an array in the first direction X and the second direction Y, and are located in the first mask area RM1. The plurality of second apertures 402 are arranged in the mask body 400 in an array in the first direction X and the second direction Y, and are located in the second mask area RM2.

The plurality of first apertures 401 correspond to the second sub-pixels to be formed. For example, the plurality of first apertures 401 correspond to the first openings 100 of the second sub-pixels to be formed. That is, when the second sub-pixel and the fifth sub-pixel are formed by using the mask, the first aperture 401 of the mask forms the first opening 100 of the second sub-pixel in the corresponding area on the array substrate.

The plurality of second apertures 402 correspond to the fifth sub-pixels to be formed. For example, the plurality of second apertures 402 correspond to the second openings 200 of the fifth sub-pixels to be formed. That is, when the second sub-pixel and the fifth sub-pixel are formed by using the mask, the second aperture 402 of the mask forms the second opening 200 of the fifth sub-pixel in the corresponding area on the array substrate.

For example, an orthographic projection of the first aperture 401 on the mask body 400 has an area greater than that of an orthographic projection of the second aperture 402 on the mask body 400. For example, the area of the orthographic projection of the first aperture 401 on the mask body 400 is 1.2 to 5 times that of the orthographic projection of the second aperture 402 on the mask body 400.

In the embodiments of the present disclosure, the mask may further include a plurality of through holes 403 provided in the mask body 400. The plurality of through holes 403 are arranged in the mask body 400 in an array in the first direction X and the second direction Y, and are located in the first mask area RM1. In the first mask area RM1, the plurality of first apertures 401 and the plurality of through holes 403 are alternately distributed in the first direction X and the second direction Y.

At least one first aperture 401 and at least one second aperture 402 are located in the same row. In the first aperture 401 and the second aperture 402 located in the same row, a center of the first aperture 401 and a center of the second aperture 402 are substantially located on the same straight line extending parallel to the first direction X.

At least one first aperture 401 and at least one through hole 403 are located in the same row. In the first aperture 401 and the through hole 403 located in the same row, the center of the first aperture 401 and a center of the through hole 403 are substantially located on the same straight line extending parallel to the first direction X.

At least one first aperture 401 and at least one through hole 403 are located in the same column. In the first aperture 401 and the through hole 403 located in the same column, the center of the first aperture 401 and the center of the through hole 403 are substantially located on the same straight line extending parallel to the second direction Y.

The second aperture 402 has a first aperture pitch HPT1 and a second aperture pitch HPT2. The first aperture pitch HPT1 is equal to a distance between the centers of two adjacent second apertures 402 in the first direction X, and the second aperture pitch HPT2 is equal to a distance between the centers of two adjacent second apertures 402 in the second direction Y.

The distance between the centers of two adjacent first apertures 401 in the first direction X is 0.6 to 8 times, or 2 to 6 times, for example, about 4 times the first aperture pitch HPT1. The distance between the centers of two adjacent first apertures 401 in the second direction Y is 0.6 to 8 times, or 2 to 6 times, for example, about 4 times the second aperture pitch HPT2.

The distance between the centers of the adjacent first aperture 401 and through hole 403 in the first direction X is 0.3 to 4 times the first aperture pitch HPT1, such as 0.5 to 2 times, 1 to 4 times, 1.5 to 3 times, 1.5 to 2 times, 1.5 to 2.5 times, for example about 2 times the first aperture pitch HPT1. The distance between the centers of the adjacent first aperture 401 and through hole 403 in the second direction Y is 0.3 to 4 times the second aperture pitch HPT2, such as 0.5 to 2 times, 1 to 4 times, 1.5 to 3 times, 1.5 to 2 times, 1.5 to 2.5 times, for example about 2 times the second aperture pitch HPT2.

Accordingly, in the embodiments of the present disclosure, the first apertures 301 and 401 located in the first mask area RM1 may form a vapor deposition material pattern in the first display area of the display substrate, and the second apertures 302 and 402 located in the second mask area RM2 may form a vapor deposition material pattern in the second display area of the display substrate. For example, the vapor deposition material pattern may include a light emitting functional layer of the sub-pixels. For example, the light emitting functional layer may include a hole injection layer, a hole transport layer, a luminescent material layer, an electron transport layer, an electron injection layer, and the like. The through holes 303 and 403 located in the first mask area RM1 may also form a vapor deposition material pattern in the first display area of the display substrate. It should be noted that the vapor deposition material pattern corresponding to the through holes 303 and 403 may also include a light emitting functional layer, but the light emitting functional layer does not emit light during the operation of the display substrate.

Figure 26:
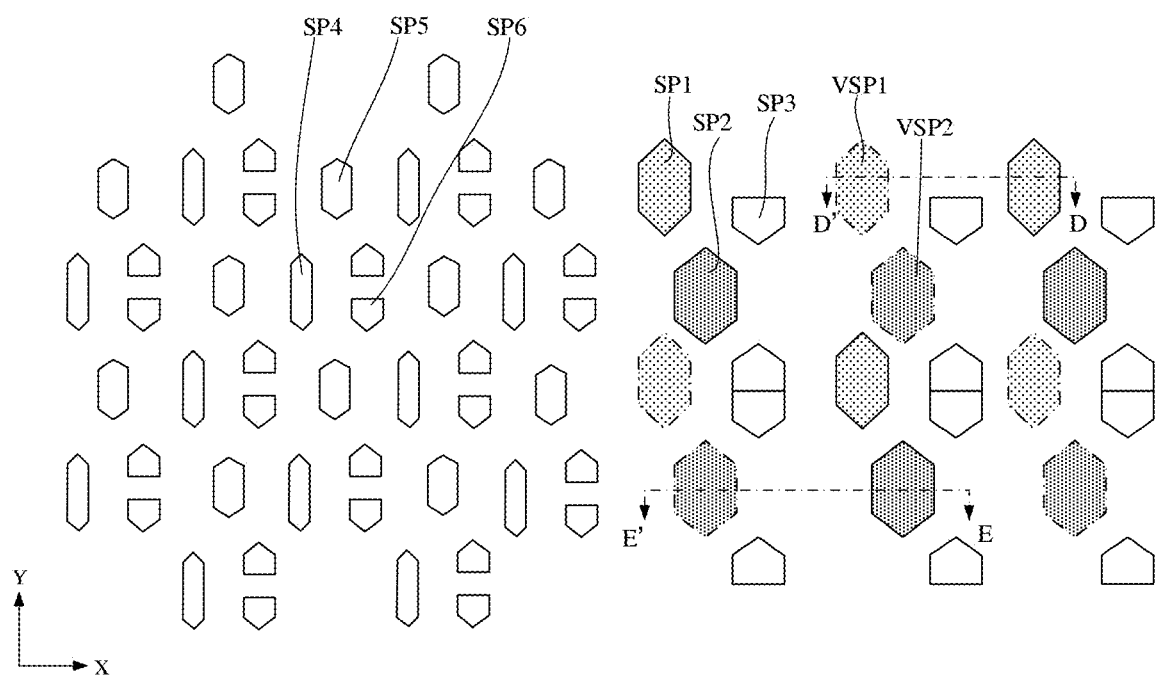
FIG. 26 shows a plan view of a display substrate according to some exemplary embodiments of the present disclosure.
Figure 27:
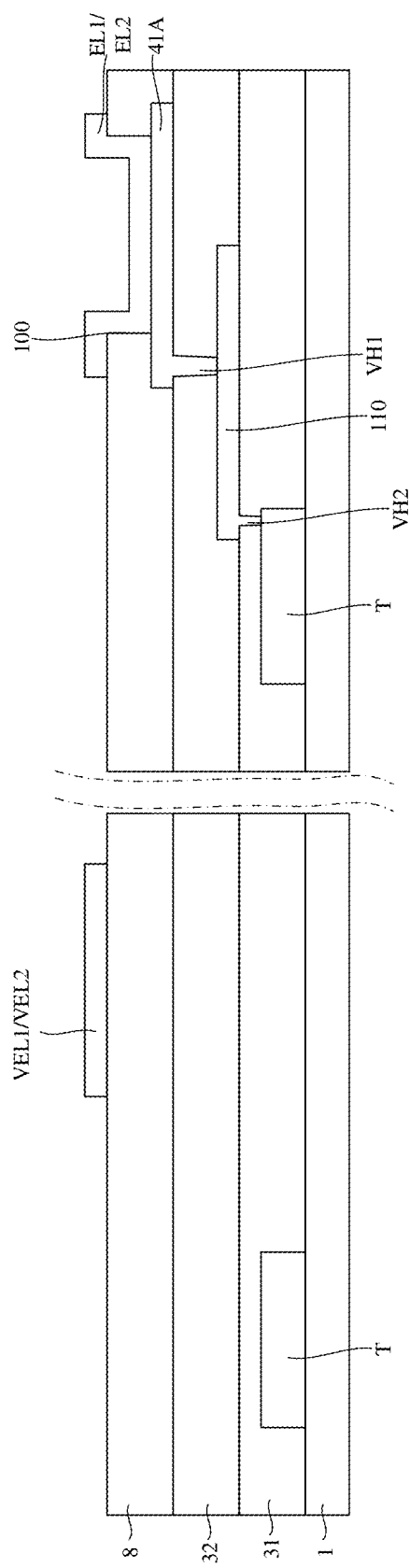
FIG. 27 shows a cross-sectional view taken along line DD' or line EE' in FIG. 26.

FIG. 26 shows a plan view of a display substrate according to some exemplary embodiments of the present disclosure. FIG. 27 shows a cross-sectional view taken along line DD' or line EE' in FIG. 26. Referring to FIG. 26 and FIG. 27 in combination, in addition to the first, second and third sub-pixels located in the first display area AA1 and the fourth, fifth and sixth sub-pixels located in the second display area AA2, the display substrate may further include a plurality of first dummy sub-pixels VSP1 and a plurality of second dummy sub-pixels VSP2. In order to correspond to the mask described above, in FIG. 26, the distribution of the sub-pixels is represented by the approximate positions and shapes of the vapor deposition material patterns of the sub-pixels. For example, in FIG. 26, each pattern represents the shape and position of an orthographic projection of the vapor-deposited light emitting functional layer.

For example, the plurality of first apertures located in the first mask area RM1 may form the first sub-pixel, the second sub-pixel and the third sub-pixel in the first display area of the display substrate; the plurality of second apertures located in the second mask area RM2 may form the fourth sub-pixel, the fifth sub-pixel and the sixth sub-pixel in the second display area of the display substrate; the plurality of through holes 303 and 403 located in the first mask area RM1 may also form the first dummy sub-pixel and the plurality of second dummy sub-pixels in the first display area of the display substrate.

Referring to FIG. 26, the plurality of first dummy sub-pixels VSP1 are located in the first display area AA1, and the plurality of first sub-pixels SP1 and the plurality of first dummy sub-pixels VSP1 are alternately distributed in the first direction X and the second direction Y. The plurality of second dummy sub-pixels VSP2 are located in the first display area AA1, and the plurality of second sub-pixels SP2 and the plurality of second dummy sub-pixels VSP2 are alternately distributed in the first direction X and the second direction Y.

Referring to FIG. 27, the first sub-pixel SP1 may include a first light emitting functional layer EL1, the first dummy sub-pixel VSP1 may include a first dummy light emitting functional layer VEL1, and the first light emitting functional layer EL1 and the first dummy light emitting functional layer VEL1 contain the same material and are located in the same layer. The second sub-pixel SP2 may include a second light emitting functional layer EL2, the second dummy sub-pixel VSP2 may include a second dummy light emitting functional layer VEL2, and the second light emitting functional layer EL2 and the second dummy light emitting functional layer VEL2 contain the same material and are located in the same layer. For example, the first light emitting functional layer EL1, the first dummy light emitting functional layer VEL1, the second light emitting functional layer EL2 and the second dummy light emitting functional layer VEL2 may contain luminescent materials of respective sub-pixels.

For example, referring to FIG. 27, the first sub-pixel SP1 may include an anode structure 41A arranged on a side of the pixel defining layer 8 close to the base substrate 1. The first opening 100 of the first sub-pixel SP1 exposes at least a part of the anode structure 41A of the first sub-pixel, and at least a part of the first light emitting functional layer EL1 is located in the first opening 100 of the first sub-pixel so as to be in contact with the anode structure 41A of the first sub-pixel. An orthographic projection of the first dummy light emitting functional layer VEL1 on the base substrate 10 falls within an orthographic projection of the pixel defining layer 8 on the base substrate 10. The pixel defining layer 8 may separate the first dummy light emitting functional layer VEL1 from a film layer located on a side of the pixel defining layer 8 close to the base substrate.

Similarly, the second sub-pixel SP2 may include an anode structure arranged on the side of the pixel defining layer 8 close to the base substrate 10. The first opening 100 of the second sub-pixel exposes at least a part of the anode structure of the second sub-pixel, and at least a part of the second light emitting functional layer EL2 is located in the first opening 100 of the second sub-pixel so as to be in contact with the anode structure of the second sub-pixel. An orthographic projection of the second dummy light emitting functional layer VEL2 on the base substrate falls within the orthographic projection of the pixel defining layer 8 on the base substrate. The pixel defining layer 8 may separate the second dummy light emitting functional layer VEL2 from the film layer located on the side of the pixel defining layer close to the base substrate.

Here, the "first light emitting functional layer" of the first sub-pixel and the "second light emitting functional layer" of the second sub-pixel include at least the "luminescent material layer" in the sub-pixel unit for image display in the display area, and they may participate in the light emission during the operation of the display substrate; the "first dummy light emitting functional layer" of the first dummy sub-pixel and the "second dummy light emitting functional layer" of the second dummy sub-pixel include at least the "luminescent material layer" representing the dummy sub-pixel, and they do not participate in the light emission during the operation of the display substrate.

For example, a distance between a center of the first light emitting functional layer EL1 of a first sub-pixel SP1 and a center of the first dummy light emitting functional layer VEL1 of the first dummy sub-pixel VSP1 adjacent to the first sub-pixel SP1 in the first direction X is 0.3 to 4 times the first pixel pitch PT1, for example, 0.5 to 2 times, 1 to 4 times, 1.5 to 3 times, 1.5 to 2 times, or about 2 times the first pixel pitch PT1. A distance between a center of the second light emitting functional layer EL2 of a second sub-pixel SP2 and a center of the second dummy light emitting functional layer VEL2 of the second dummy sub-pixel VSP2 adjacent to the second sub-pixel SP2 in the first direction X is 0.3 to 4 times the first pixel pitch PT1, for example, 0.5 to 2 times, 1 to 4 times, 1.5 to 3 times, 1.5 to 2 times, or about 2 times the first pixel pitch PT1.

It should be noted that the structure of the cross-sectional view shown in FIG. 27 may be referred to the above description for FIG. 14 and FIG. 15, which will not be repeated here.

It should be noted that in some embodiments of the present disclosure, the through holes 303 and 403 may be replaced with half-tone regions (also called half-tone holes). In this way, a mask may include a mask body (for example, made of a metal material), a plurality of apertures and a plurality of half-tone regions. Since a thickness of the half-tone region is reduced by half compared to the thickness of the mask body, the flexibility is better, and the stress on the mask may be buffered and stored in the half-tone region, so that a generation of wrinkles on the mask may be avoided or reduced, and an evaporation quality may be ensured.

In the mask provided by the embodiments of the present disclosure, with the design of the through holes and the half-tone regions, the stress distribution on the mask may be more uniform, so that the problem of color mixing between sub-pixels manufactured by using the mask may be avoided.

Figure 20A:
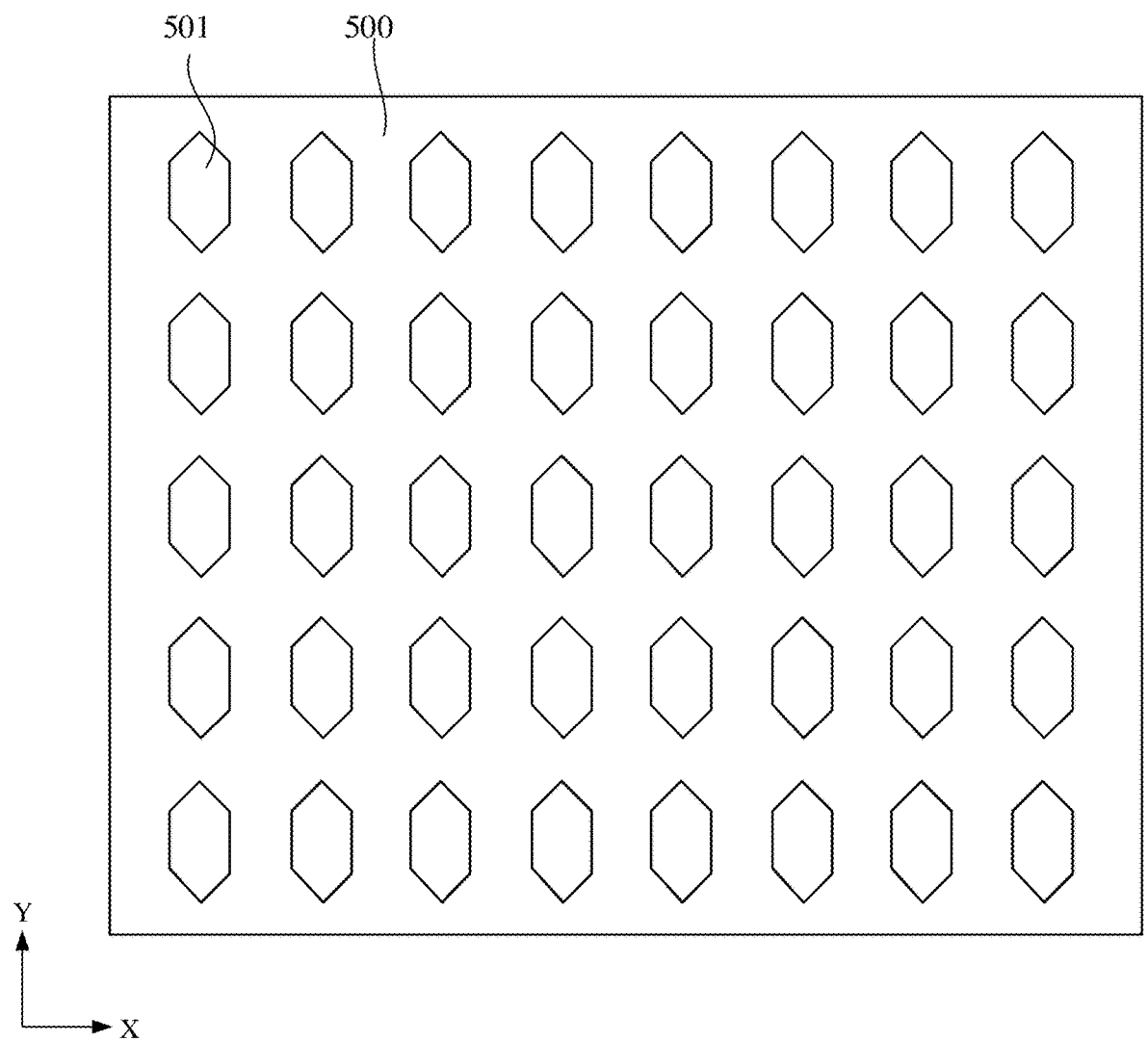
Figure 20B:
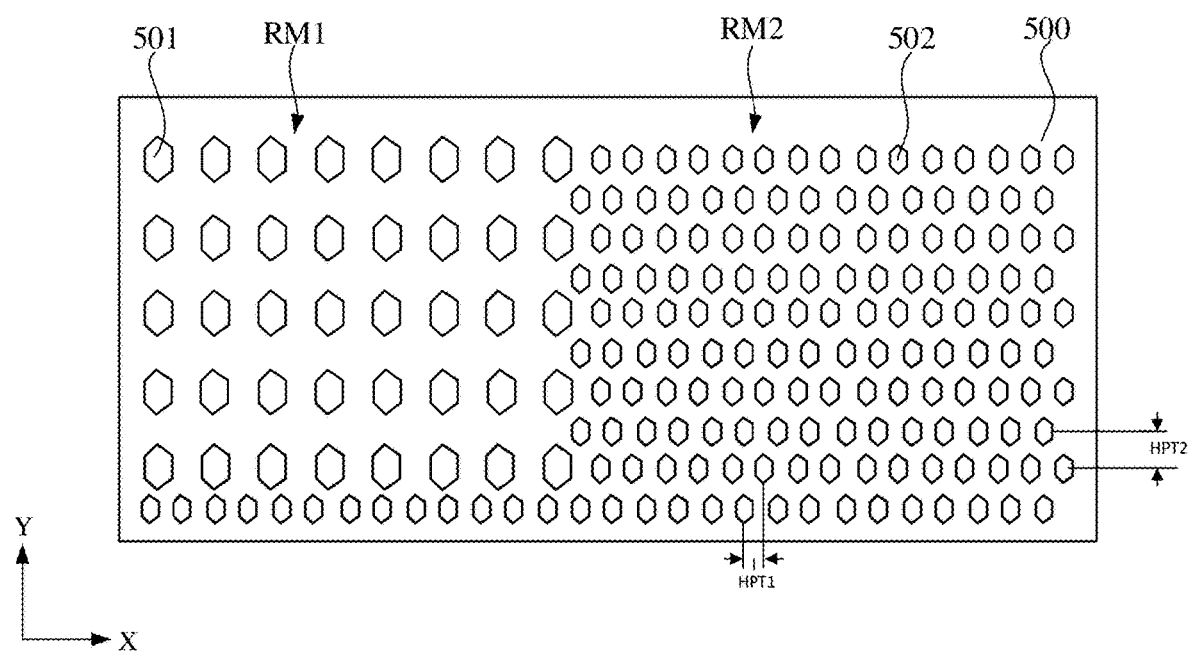

FIG. 20A and FIG. 20B show schematic plan views of masks according to some exemplary embodiments of the present disclosure, in which a first mask area for forming the sub-pixels in the first display area is schematically shown in FIG. 20A, and a transition area between the first mask area and a second mask area for forming the sub-pixels in the second display area is schematically shown in FIG. 20B. For example, the mask shown in FIG. 20A and FIG. 20B may be used to form the third sub-pixel and the sixth sub-pixel, that is, the green sub-pixels.

In the embodiments of the present disclosure, the mask includes at least two mask areas. For example, the mask may include a first mask area RM1 and a second mask area RM2. The first mask area RM1 may correspond to the first display area AA1, and the second mask area RM2 may correspond to the second display area AA2.

The mask may include a mask body 500 as well as a plurality of first apertures 501 and a plurality of second apertures 502 provided in the mask body 500. The plurality of first apertures 501 are arranged in the mask body 500 in an array in the first direction X and the second direction Y, and are located in the first mask area RM1. The plurality of second apertures 502 are arranged in the mask body 500 in an array in the first direction X and the second direction Y, and are located in the second mask area RM2.

The plurality of first apertures 501 correspond to the third sub-pixels to be formed. For example, the plurality of first apertures 501 correspond to the first openings 100 of the third sub-pixels to be formed. That is, when the third sub-pixel and the sixth sub-pixel are formed by using the mask, the first aperture 501 of the mask forms the first opening 100 of the third sub-pixel in the corresponding area on the array substrate.

The plurality of second apertures 502 correspond to the sixth sub-pixels to be formed. For example, the plurality of second apertures 502 correspond to the second openings 200 of the sixth sub-pixels to be formed. That is, when the third sub-pixel and the sixth sub-pixel are formed by using the mask, the second aperture 502 of the mask forms the second opening 200 of the sixth sub-pixel in the corresponding area on the array substrate.

For example, an orthographic projection of the first aperture 501 on the mask body 500 has an area greater than that of an orthographic projection of the second aperture 502 on the mask body 500. For example, the area of the orthographic projection of the first aperture 501 on the mask body 500 is 1.2 to 5 times that of the orthographic projection of the second aperture 502 on the mask body 500.

At least one first aperture 501 and at least one second aperture 502 are located in the same row. In the first aperture 501 and the second aperture 502 located in the same row, a center of the first aperture 501 and a center of the second aperture 502 are substantially located on the same straight line extending parallel to the first direction X.

The second aperture 502 has a first aperture pitch HPT1 and a second aperture pitch HPT2. The first aperture pitch HPT1 is equal to a distance between the centers of two adjacent second apertures 502 in the first direction X, and the second aperture pitch HPT2 is equal to a distance between the centers of two adjacent second apertures 502 in the second direction Y.

The distance between the centers of two adjacent first apertures 501 in the first direction X is 1.5 to 2.5 times, for example, about 2 times the first aperture pitch HPT1. The distance between the centers of two adjacent first apertures 501 in the second direction Y is 1.5 to 2.5 times, for example, about 2 times the second aperture pitch HPT2.

Figure 21:
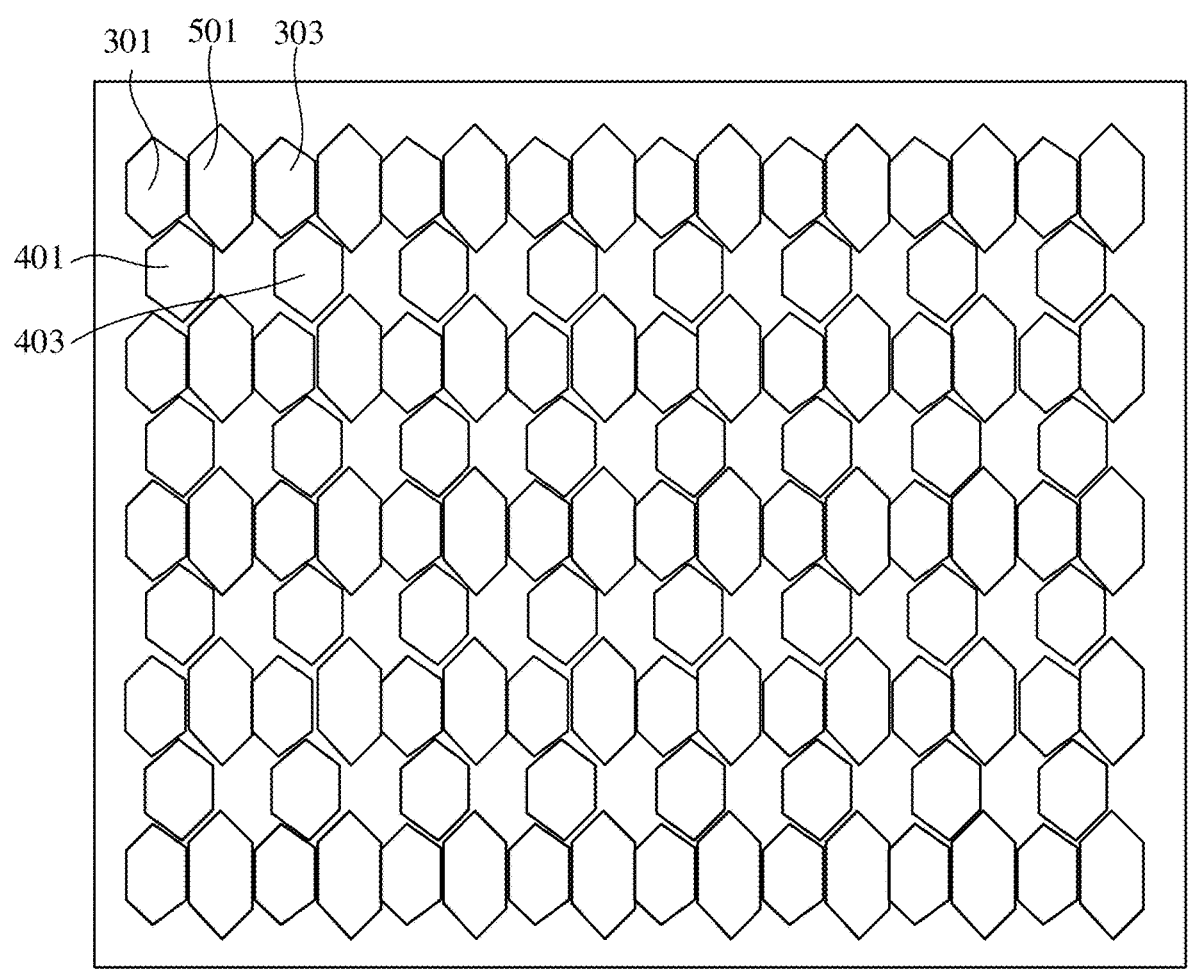
FIG. 21 shows a schematic diagram of a superposition of the three masks shown in FIG. 18A, FIG. 19A and FIG. 20A.

FIG. 21 shows a schematic diagram of a superposition of the three masks shown in FIG. 18A, FIG. 19A and FIG. 20A. Referring to FIG. 18A to FIG. 21 in combination, when the mask used to form the red sub-pixels (referring to FIG. 18A and FIG. 18B), the mask used to form the blue sub-pixels (referring to FIG. 19A and FIG. 19B) and the mask used to form the green sub-pixels (referring to FIG. 20A and FIG. 20B) are stacked together, the orthographic projections of the first apertures of the masks on the mask body do not overlap each other, the orthographic projections of the second apertures of the masks on the mask body do not overlap each other, and the orthographic projections of the through holes of the masks on the mask body do not overlap each other.

That is to say, in the embodiments of the present disclosure, with the design of the through holes or the half-tone regions, the stress distribution on the mask may be more uniform. In addition, even if the through holes or the half-tone regions are added, it may be ensured that the sub-pixels of different colors may not produce poor color mixing.

Referring back to FIG. 1 and FIG. 2, at least some embodiments of the present disclosure further provide a display device that may include the display substrate as described above and a sensor 2 (for example, a camera).

As described above, the display substrate includes a first display area and a second display area, and the first display area has a pixel density greater than that of the second display area. The sensor 2 is located on a side of the base substrate 1 away from the pixel array, and a photosensitive surface of the sensor 2 faces the display substrate. An orthographic projection of the sensor 2 on the base substrate 1 overlaps, for example, is located in the orthographic projection of the second display area AA2 on the base substrate 1. In this way, the light passing through the second display area may be used for imaging, thereby achieving the function of an under-screen camera.

The sensor 2 may have a structure known in the art, for example, including a complementary metal oxide semiconductor (CMOS) image sensor or a charge coupled device (CCD) image sensor. The sensor 2 may be electrically connected to an image processor. In addition to the image sensor, the imaging module including the image sensor may, for example, further include a lens assembly, in order to achieve a better imaging effect. The lens assembly and the image sensor may be arranged sequentially along an optical axis of the lens assembly in a direction perpendicular to the base substrate 1.

The display device may include any apparatus or product with a display function. For example, the display device may be a smart phone, a mobile phone, an e-book reader, a personal computer (PC), a laptop PC, a netbook PC, a personal digital assistant (PDA), a portable multimedia player (PMP), a digital audio player, a mobile medical apparatus, a camera, a wearable device (such as a head-mounted device, electronic clothing, electronic bracelet, electronic necklace, electronic accessory, electronic tattoo or smart watch), a television, etc.

Although some embodiments of the general technical concept of the present disclosure have been illustrated and described, it should be understood by those ordinary skilled in the art that these embodiments may be changed without departing from the principle and spirit of the general technical concept of the present disclosure. The scope of the present disclosure is defined by the claims and their equivalents.

What is claimed is:

1. A display substrate comprising a first display area and a second display area, wherein the display substrate comprises:
   a base substrate;
   a plurality of first repeating units that are arranged on the base substrate in an array in a first direction and a second direction and that are located in the first display area, wherein each of the first repeating units comprises at least one first pixel unit, and each first pixel unit comprises at least a first sub-pixel and a second sub-pixel;
   a plurality of second repeating units that are arranged on the base substrate in an array in the first direction and the second direction and that are located in the second display area, wherein each of the second repeating units comprises at least one second pixel unit, and each second pixel unit comprises at least a fourth sub-pixel and a fifth sub-pixel; and
   a pixel defining layer on the base substrate, wherein the pixel defining layer comprises a plurality of first openings and a plurality of second openings,
   wherein the first sub-pixel and the fourth sub-pixel emit light of the same color, and the second sub-pixel and the fifth sub-pixel emit light of the same color;
   wherein each of the first sub-pixel and the second sub-pixel comprises a respective first opening;
   wherein each of the fourth sub-pixel and the fifth sub-pixel comprises a respective second opening;
   wherein an orthographic projection of the first opening of the first sub-pixel on the base substrate has an area greater than that of an orthographic projection of the second opening of the fourth sub-pixel on the base substrate, and an orthographic projection of the first opening of the second sub-pixel on the base substrate has an area greater than that of an orthographic projection of the second opening of the fifth sub-pixel on the base substrate;
   wherein a ratio of the area of the orthographic projection of the first opening of the first sub-pixel on the base substrate to the area of the orthographic projection of the second opening of the fourth sub-pixel on the base substrate is a first value, a ratio of the area of the orthographic projection of the first opening of the second sub-pixel on the base substrate to the area of the orthographic projection of the second opening of the fifth sub-pixel on the base substrate is a second value, and a ratio of the first value to the second value is between 0.8 and 1.2;
   wherein a center of the first opening of the at least one of the first sub-pixels and a center of the second opening of at least one of the fourth sub-pixels are substantially located on a same straight line extending parallel to the first direction, wherein a distance between the center of the first opening of the at least one of the first sub-pixels and a first straight line extending parallel to the first direction in the second direction is not greater than 5 microns, and a distance between the center of the second opening of at least one of the fourth sub-pixels and the first straight line in the second direction is not greater than 5 microns; and
   wherein a center of the first opening of the at least one of the second sub-pixels and a center of the second opening of at least one of the fifth sub-pixels are substantially located on a same straight line extending parallel to the first direction, wherein a distance between the center of the first opening of at least one of the second sub-pixels and a second straight line extending parallel to the first direction in the second direction is not greater than 5 microns, and a distance between the center of the second opening of at least one of the fifth sub-pixels and the second straight line in the second direction is not greater than 5 microns.

2. The display substrate of claim 1, wherein each first pixel unit further comprises a plurality of third sub-pixels, each second pixel unit further comprises a plurality of sixth sub-pixels, and the third sub-pixel and the sixth sub-pixel emit light of the same color;
   wherein the third sub-pixel comprises a first opening, and the sixth sub-pixel comprises a second opening; and
   wherein an orthographic projection of the first opening of the third sub-pixel on the base substrate has an area greater than that of an orthographic projection of the second opening of the sixth sub-pixel on the base substrate.

3. The display substrate of claim 2, wherein a distance between a center of the first opening of at least one of the third sub-pixels and a third straight line extending parallel to the first direction in the second direction is not greater than 5 microns, and a distance between a center of the second opening of at least one of the sixth sub-pixels and the third straight line in the second direction is not greater than 5 microns.

4. The display substrate of claim 1, wherein an area occupied by the first openings of the first repeating units per unit area is not greater than an area occupied by the second openings of the second repeating units per unit area.

5. The display substrate of claim 3, wherein the second display area comprises a first display sub-area and a second display sub-area, the first display sub-area is located on both sides of the first display area in the first direction, the second display sub-area is located on at least one side of the first display area and the first display sub-area in the second direction, and the first display area and the first display sub-area are connected to the second display sub-area; and
wherein the second display sub-area comprises at least a row of edge sub-pixels directly adjacent to a row of edge sub-pixels in the first display area and to a row of edge sub-pixels in the first display sub-area, a shortest separation distance between the second opening of the row of edge sub-pixels in the second display sub-area and an adjacent first opening in the first display area in the second direction is greater than that between the second opening of the row of edge sub-pixels in the second display sub-area and an adjacent second opening in the first display sub-area in the second direction.

6. The display substrate of claim 2, wherein an orthographic projection of the first opening of the third sub-pixel on the base substrate is a pentagon having a first side extending in the first direction;
wherein an orthographic projection of the second opening of the sixth sub-pixel on the base substrate is a pentagon having a second side extending in the first direction; and
wherein a distance between the first side of the first opening of the third sub-pixel and a fourth straight line extending parallel to the first direction in the second direction is not greater than 5 microns, and a distance between the second side of the second opening of the sixth sub-pixel and the fourth straight line in the second direction is not greater than 5 microns.

7. The display substrate of claim 1, wherein the first sub-pixels and the second sub-pixels of the plurality of first pixel units are alternately distributed in the first direction and the second direction; and
wherein a distance between a center of the first opening of at least one of the first sub-pixels and a fifth straight line extending parallel to the first direction in the second direction is not greater than 5 microns, a distance between a center of the first opening of at least one of the second sub-pixels and the fifth straight line in the second direction is not greater than 5 microns, a distance between a center of the second opening of at least one of the fourth sub-pixels and the fifth straight line in the second direction is not greater than 5 microns, and a distance between a center of the second opening of at least one of the fifth sub-pixels and the fifth straight line in the second direction is not greater than 5 microns; and/or
wherein the first pixel unit further comprises a plurality of third sub-pixels, the second pixel unit further comprises a plurality of sixth sub-pixels, and the third sub-pixel and the sixth sub-pixel emit light of the same color; wherein the third sub-pixel comprises a first opening, and the sixth sub-pixel comprises a second opening; and wherein a distance between a center of the first opening of at least one of the third sub-pixels and a sixth straight line extending parallel to the second direction in the first direction is not greater than 5 microns, and a distance between a center of the second opening of at least one of the sixth sub-pixels and the sixth straight line in the first direction is not greater than 5 microns.

8. The display substrate of claim 2, wherein an orthographic projection of the first opening of the first sub-pixel on the base substrate has an area 1.2 to 5 times that of an orthographic projection of the second opening of the fourth sub-pixel on the base substrate; and/or
wherein an orthographic projection of the first opening of the second sub-pixel on the base substrate has an area 1.2 to 5 times that of an orthographic projection of the second opening of the fifth sub-pixel on the base substrate; and/or
wherein an orthographic projection of the first opening of the third sub-pixel on the base substrate has an area 1.2 to 5 times that of an orthographic projection of the second opening of the sixth sub-pixel on the base substrate.

9. The display substrate of claim 2, wherein the second repeating unit has a first pixel pitch equal to a distance between centers of the second openings of two fourth sub-pixels respectively located in two adjacent second pixel units in the first direction; and
wherein, in two adjacent first pixel units, a distance between the centers of the first openings of two first sub-pixels in the first direction is 0.3 to 4 times the first pixel pitch; and/or, in two adjacent first pixel units, a distance between the centers of the first openings of two second sub-pixels in the first direction is 0.3 to 4 times the first pixel pitch; and/or, in two adjacent first pixel units, a distance between the center of the first opening of the third sub-pixel in one of the first pixel units and the center of the first opening of the third sub-pixel in the other of the first pixel units in the first direction is 0.3 to 4 times the first pixel pitch; and/or
wherein the second repeating unit has a second pixel pitch equal to a distance between the centers of the second openings of two fourth sub-pixels respectively located in two adjacent second pixel units in the second direction; and wherein, in two adjacent first pixel units, a distance between the centers of the first openings of two first sub-pixels in the second direction is 1 to 4 times the second pixel pitch; and/or, in two adjacent first pixel units, a distance between the centers of the first openings of two second sub-pixels in the second direction is 1 to 4 times the second pixel pitch.

10. The display substrate of claim 2, wherein each of an orthographic projection of the first opening of the first sub-pixel on the base substrate, an orthographic projection of the first opening of the second sub-pixel on the base substrate and an orthographic projection of the first opening of the third sub-pixel on the base substrate is a circle or an ellipse.

11. The display substrate of claim 7, wherein the first repeating unit comprises at least two first sub-pixels and at least two second sub-pixels; and
wherein, in one of the first repeating units, a distance between the centers of the first openings of two adjacent first sub-pixels in the first direction is substantially equal to that between the centers of the first openings of two adjacent second sub-pixels in the first direction; and/or in one of the first repeating units, a distance between the centers of the first openings of two adjacent first sub-pixels in the second direction is substantially equal to that between the centers of the first openings of two adjacent second sub-pixels in the second direction.

12. The display substrate of claim 11, wherein the first repeating unit comprises at least four third sub-pixels; and
wherein, in one of the first repeating units, a distance between the centers of the first openings of two adjacent third sub-pixels in the first direction is substantially equal to that between the centers of the first openings of two adjacent first sub-pixels in the first direction; and/or in one of the first repeating units, a distance between the centers of the first openings of two adjacent third sub-pixels in the second direction is substantially equal to that between the centers of the first openings of two adjacent first sub-pixels in the second direction.

13. The display substrate of claim 7, wherein the second repeating unit has a first pixel pitch equal to a distance between the centers of the second openings of two fourth sub-pixels respectively located in two adjacent second pixel units in the first direction; and
wherein, in one of the first repeating units, a distance between the centers of the first openings of two adjacent first sub-pixels in the first direction is 0.3 to 4 times the first pixel pitch; and/or in one of the first repeating units, a distance between the centers of the first openings of two adjacent second sub-pixels in the first direction is 0.3 to 4 times the first pixel pitch; and/or in one of the first repeating units, a distance between the centers of the first openings of two adjacent third sub-pixels in the first direction is 0.3 to 4 times the first pixel pitch; or
wherein the second repeating unit has a second pixel pitch equal to a distance between the centers of the second openings of two fourth sub-pixels respectively located in two adjacent second pixel units in the second direction; and/or in one of the first repeating units, a distance between the centers of the first openings of two adjacent first sub-pixels in the second direction is 1 to 4 times the second pixel pitch; and/or in one of the first repeating units, a distance between the centers of the first openings of two adjacent second sub-pixels in the second direction is 1 to 4 times the second pixel pitch; and/or in one of the first repeating units, a distance between the centers of the first openings of two adjacent third sub-pixels in the second direction is 1 to 4 times the second pixel pitch.

14. The display substrate of claim 7, wherein at a junction of the first display area and the second display area located on both sides of the first display area in the first direction, a shortest distance between the second opening of a fourth sub-pixel and the first opening of a third sub-pixel adjacent to the fourth sub-pixel is greater than or equal to half of a sum of the first gap threshold and the second gap threshold; and/or, at a junction of the first display area and the second display area located on both sides of the first display area in the first direction, a shortest distance between the second opening of a fifth sub-pixel and the first opening of a third sub-pixel adjacent to the fifth sub-pixel is greater than or equal to half of the sum of the first gap threshold and the second gap threshold;

wherein the first gap threshold is a minimum size of a portion of the pixel defining layer located between the first opening of a first sub-pixel and the first opening of a second sub-pixel adjacent to the first sub-pixel, the second gap threshold is a minimum size of a portion of the pixel defining layer located between the second opening of a fourth sub-pixel and the second opening of a fifth sub-pixel adjacent to the fourth sub-pixel, and each of the first gap threshold and the second gap threshold is not less than 10 microns.

15. The display substrate of claim 1, further comprising:
a plurality of first dummy sub-pixels located in the first display area, wherein the plurality of first sub-pixels and the plurality of first dummy sub-pixels are alternately distributed in the first direction and the second direction; and wherein the first sub-pixel comprises a first light emitting functional layer, the first dummy sub-pixel comprises a first dummy light emitting functional layer, and the first light emitting functional layer and the first dummy light emitting functional layer contain the same material; the first sub-pixel comprises an anode structure arranged on a side of the pixel defining layer proximate to the base substrate, the first opening of the first sub-pixel exposes at least a part of the anode structure of the first sub-pixel, and at least a part of the first light emitting functional layer is located in the first opening of the first sub-pixel so as to be in contact with the anode structure of the first sub-pixel; and an orthographic projection of the first dummy light emitting functional layer on the base substrate falls within an orthographic projection of the pixel defining layer on the base substrate, and the pixel defining layer is configured to separate the first dummy light emitting functional layer from a film layer located on the side of the pixel defining layer proximate to the base substrate; and/or
a plurality of second dummy sub-pixels located in the first display area, wherein the plurality of second sub-pixels and the plurality of second dummy sub-pixels are alternately distributed in the first direction and the second direction; and wherein the second sub-pixel comprises a second light emitting functional layer, the second dummy sub-pixel comprises a second dummy light emitting functional layer, and the second light emitting functional layer and the second dummy light emitting functional layer contain the same material; the second sub-pixel comprises an anode structure arranged on the side of the pixel defining layer proximate to the base substrate, the first opening of the second sub-pixel exposes at least a part of the anode structure of the second sub-pixel, and at least a part of the second light emitting functional layer is located in the first opening of the second sub-pixel so as to be in contact with the anode structure of the second sub-pixel; and an orthographic projection of the second dummy light emitting functional layer on the base substrate falls within the orthographic projection of the pixel defining layer on the base substrate, and the pixel defining layer is configured to separate the second dummy light emitting functional layer from the film layer located on the side of the pixel defining layer proximate to the base substrate.

16. The display substrate of claim 15, wherein a distance between a center of the first light emitting functional layer of one of the first sub-pixels and a center of the first dummy light emitting functional layer of the first dummy sub-pixel adjacent to the first sub-pixel in the first direction is 0.3 to 4 times the first pixel pitch; and/or a distance between a center of the second light emitting functional layer of one of the second sub-pixels and a center of the second dummy light emitting functional layer of the second dummy sub-pixel adjacent to the second sub-pixel in the first direction is 0.3 to 4 times the first pixel pitch.

17. A mask comprising a first mask area and a second mask area, wherein the mask comprises:
   a mask body;
   a plurality of first apertures that are arranged in the mask body in an array in the first direction and the second direction and that are located in the first mask area;
   a plurality of second apertures that are arranged in the mask body in an array in the first direction and the second direction and that are located in the second mask area; and
   a plurality of through holes or half-tone regions that are arranged in the mask body in an array in the first direction and the second direction and that are located in the first mask area,
   wherein an orthographic projection of the first aperture on the base substrate has an area greater than that of an orthographic projection of the second aperture on the base substrate;
   wherein the plurality of first apertures and the plurality of through holes or half-tone regions are alternately distributed in the first direction and the second direction; and
   wherein a distance between a center of at least one of the first apertures and a first straight line extending parallel to the first direction in the second direction is not greater than 5 microns, a distance between a center of at least one of the second apertures and the first straight line in the second direction is not greater than 5 microns, and the center of the at least one of the first apertures and the center of the at least one of the second apertures are substantially located on a same straight line extending parallel to the first direction.

18. A display device comprising the display substrate of claim 1.

* * * * *